US008841409B2

(12) United States Patent
Facchetti et al.

(10) Patent No.: US 8,841,409 B2
(45) Date of Patent: *Sep. 23, 2014

(54) CONJUGATED POLYMERS AND THEIR USE IN OPTOELECTRONIC DEVICES

(71) Applicant: Polyera Corporation, Skokie, IL (US)

(72) Inventors: Antonio Facchetti, Chicago, IL (US); Kap-Soo Cheon, Shrewsbury, MA (US); Hualong Pan, Skokie, IL (US); Martin Drees, Glenview, IL (US)

(73) Assignee: Polyera Corporation, Skokie, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/843,423

(22) Filed: Mar. 15, 2013

(65) Prior Publication Data
US 2013/0247991 A1    Sep. 26, 2013

Related U.S. Application Data

(60) Provisional application No. 61/614,302, filed on Mar. 22, 2012, provisional application No. 61/724,140, filed on Nov. 8, 2012, provisional application No. 61/733,404, filed on Dec. 4, 2012, provisional application No. 61/733,406, filed on Dec. 4, 2012.

(51) Int. Cl.
*C08G 75/00* (2006.01)
*H01L 31/0256* (2006.01)
*H01L 51/00* (2006.01)
*C08G 73/10* (2006.01)
*H01L 51/42* (2006.01)

(52) U.S. Cl.
CPC ........ *C08G 73/1064* (2013.01); *H01L 31/0256* (2013.01); *H01L 51/4253* (2013.01); *H01L 51/0035* (2013.01); *Y02E 10/549* (2013.01); *H01L 51/0036* (2013.01); *H01L 51/0043* (2013.01)
USPC .......................................... 528/377; 528/378

(58) Field of Classification Search
USPC ......................................... 528/377, 380, 370
See application file for complete search history.

(56) References Cited

U.S. PATENT DOCUMENTS

2010/0326527 A1* 12/2010 Facchetti et al. .............. 136/263
2012/0097935 A1*  4/2012 Kirner et al. .................... 257/40
2012/0153274 A1*  6/2012 Sonar et al. ..................... 257/40

FOREIGN PATENT DOCUMENTS

WO     2009/115413     9/2009

OTHER PUBLICATIONS

Letizia et al: "n-Channel Polymers by Design: Optimizing the Interplay of Solubilizing Substituents, Crystal Packing, and Field-Effect Transistor Characteristics in Polymeric Bithiophene-Imide Semiconductors", *J. Am. Chem. Soc.*, 130: 9679-9694 (2008).

(Continued)

*Primary Examiner* — Shane Fang
(74) *Attorney, Agent, or Firm* — Karen K. Chan

(57) ABSTRACT

The present invention relates to certain polymeric compounds and their use as organic semiconductors in organic and hybrid optical, optoelectronic, and/or electronic devices such as photovoltaic cells, light emitting diodes, light emitting transistors, and field effect transistors. The present compounds can provide improved device performance, for example, as measured by power conversion efficiency, fill factor, open circuit voltage, field-effect mobility, on/off current ratios, and/or air stability when used in photovoltaic cells or transistors. The present compounds can have good solubility in common solvents enabling device fabrication via solution processes.

20 Claims, 1 Drawing Sheet

(56) References Cited

OTHER PUBLICATIONS

Zhou et al.: "Bithiophene imide and benzodithiophene copolymers for efficient inverted polymer solar cells", *Adv. Mater.*, 24(17): 2242-2248 (Mar. 26, 2012).

Guo et al.: "Bithiopheneimide-Dithienosilole/Dithienogermole Copolymers for Efficient Soar Cells: Information from Structure-Property-Device Performance Correlations and Comparsion to Theino [3,4-c] pyrrole-4, 6-dione Analogues", *J. Am. Chem. Soc.*, 44: 18427-18439 (Oct. 3, 2012).

* cited by examiner

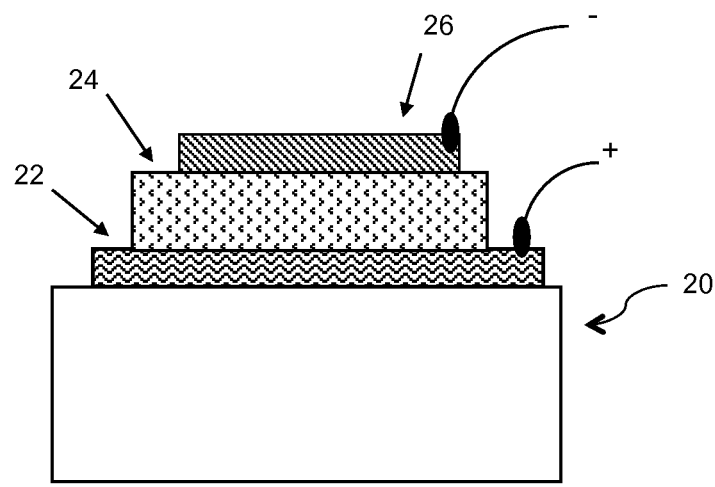

CONJUGATED POLYMERS AND THEIR USE IN OPTOELECTRONIC DEVICES

CROSS-REFERENCE TO RELATED APPLICATIONS

This application claims priority to and the benefit of U.S. Provisional Patent Application Ser. No. 61/614,302, filed on Mar. 22, 2012, U.S. Provisional Patent Application Ser. No. 61/724,140, filed on Nov. 8, 2012, U.S. Provisional Patent Application Ser. No. 61/733,404, filed on Dec. 4, 2012, and U.S. Provisional Patent Application Ser. No. 61/733,406, filed on Dec. 4, 2012, the disclosure of each of which is incorporated by reference herein in its entirety.

BACKGROUND

A new generation of optoelectronic devices such as organic photovoltaics (OPVs) and organic light-emitting transistors (OLETs) are fabricated using organic semiconductors as their active components. To be commercially relevant, these organic semiconductor-based devices should be processable in a cost-effective manner.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a donor material and an acceptor material. State-of-the-art BHJ solar cells use fullerene-based compounds as the acceptor material. Typical fullerenes include C60 or C70 "bucky ball" compounds functionalized with solubilizing side chains such as [6,6]-phenyl-$C_{61}$-butyric acid methyl ester (PCBM) or [6,6]-phenyl-$C_{71}$-butyric acid methyl ester ($PC_{71}BM$). The most common donor material used in BHJ solar cells is poly(3-hexylthiophene) (P3HT). However, it is well known that P3HT-based cell have limited efficiency due to poor light absorption above 500 nm. Furthermore, P3HT also has poor air stability.

Accordingly, the art desires new materials for OPV devices.

SUMMARY

In light of the foregoing, the present teachings provide novel polymeric compounds that can be used as organic semiconductor materials. Also provided are associated devices and related methods for the preparation and use of these compounds. The present compounds can exhibit properties such as optimized optical absorption, good charge transport characteristics and chemical stability in ambient conditions, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

FIG. 1 illustrates a representative organic photovoltaic device (also known as a solar cell) structure, which can incorporate one or more polymeric compounds of the present teachings in its photoactive layer (as donor and/or acceptor materials).

DETAILED DESCRIPTION

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ $cm^2/Vs$. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, ($P_m$ or $V_{mp}*J_{mp}$), to the theoretical (not actually obtainable) power, ($J_{sc}*V_{oc}$). Accordingly, FF can be determined using the equation:

$$FF = (V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from incident light to electrical power. The PCE of a solar cell can be calculated by dividing the maximum power point ($P_m$) by the input light irradiance (E, in W/m$^2$) under standard test conditions (STC) and the surface area of the solar cell ($A_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

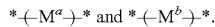

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

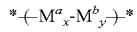

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight ($M_n$) and/or weight average molecular weight ($M_w$) depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group."

Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^0_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/ aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

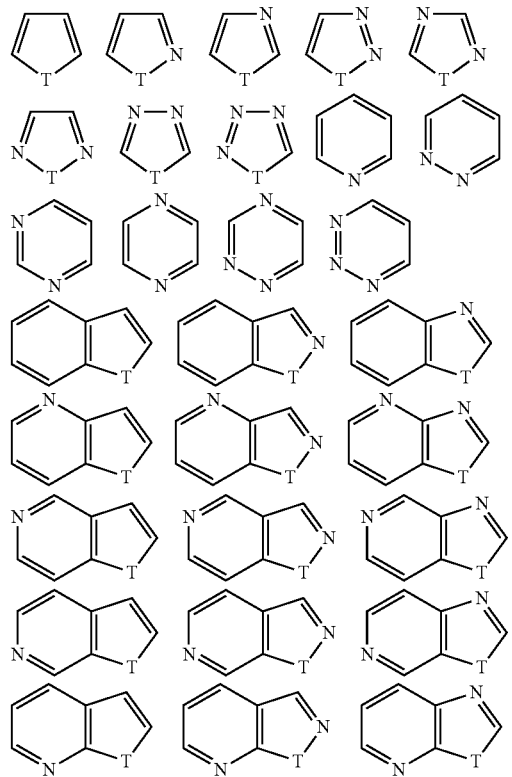

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/ or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, —$CON(R^o)_2$, $C_{1-40}$ haloalkyl groups, $C_{6-14}$ aryl groups, and 5-14 membered electron-poor heteroaryl groups; where $R^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, and —$CON(R^o)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^o$, —$NH_2$, —$NHR^o$, —$N(R^o)_2$, and 5-14 membered electron-rich heteroaryl groups, where $R^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymeric compounds that can be used as organic semiconductor materials. The present compounds can have good solubility in various common organic solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit high power conversion efficiency (e.g., about 1.0% or greater, preferably about 2.0% or greater, more preferably about 3.0% or greater).

More specifically, the present teachings provide polymers (or polymeric compounds) including an electron-acceptor unit (A) and an electron-donor unit (D), where the electron-acceptor unit (A) and the electron-donor unit (D) together can provide an alternating repeat unit of the formula:

where more specifically, the electron-acceptor unit (A) can comprise a bithiopheneimide moiety represented by the formula:

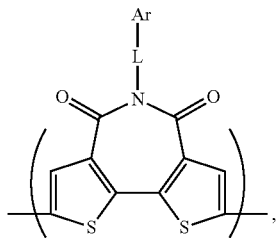

wherein:
L is selected from the group consisting of —O—, —S—, —Se—, —OC(O)—, —C(O)O—, a divalent $C_{1-20}$ alkyl group, a divalent $C_{1-20}$ haloalkyl group, and a covalent bond; and
Ar is an optionally substituted $C_{6-20}$ aryl group or an optionally substituted 5-20 membered heteroaryl group. In various embodiments, the present polymers can have a molecular weight in the range of about 3,000 g/mol to about 300,000 g/mol.

To illustrate, Ar can be an optionally substituted 5-membered or 6-membered aryl or heteroaryl group. For example, Ar can be selected from the group consisting of a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group, each of which optionally can be substituted with 1-5 groups independently selected from a halogen, —CN, and L'R', wherein L', at each occurrence, is selected from —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group.

For example, in certain embodiments, the present polymers can include an electron-acceptor unit (A) comprising a bithiopheneimide moiety represented by the formula:

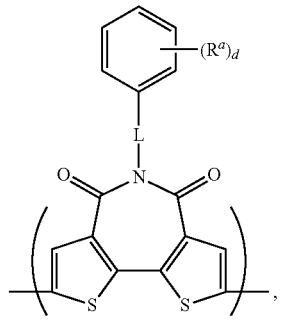

wherein $R^a$, at each occurrence, independently can be selected from the group consisting of a halogen, —CN, and L'R', wherein L', at each occurrence, is selected from —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group; d is 0, 1, 2, 3, 4 or 5; and L can be selected from the group consisting of —O—, —S—, —Se—, —OC(O)—, —C(O)O—, a divalent $C_{1-20}$ alkyl group, a divalent $C_{1-20}$ haloalkyl group, and a covalent bond. In particular embodiments, the bithiopheneimide moiety can be represented by the formula:

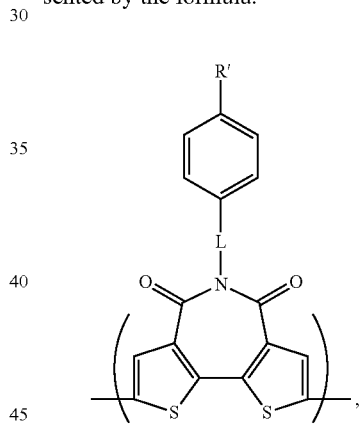

wherein R' can be a $C_{1-40}$ alkyl group or a $C_{1-40}$ haloalkyl group.

In certain embodiments, the present polymers can include an electron-acceptor unit (A) comprising a bithiopheneimide moiety represented by the formula:

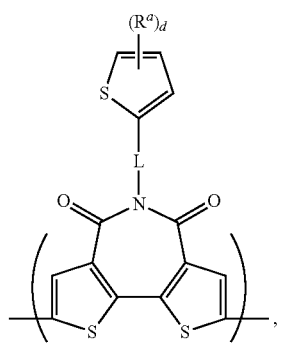

wherein $R^a$, at each occurrence, independently can be selected from the group consisting of a halogen, —CN, and L'R', wherein L', at each occurrence, is selected from —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group; d is 0, 1, 2, or 3; and L can be selected from the group consisting of —O—, —S—, —Se—, —OC(O)—, —C(O)O—, a divalent $C_{1-20}$ alkyl group, a divalent $C_{1-20}$ haloalkyl group, and a covalent bond. In particular embodiments, the bithiopheneimide moiety can be represented by the formula:

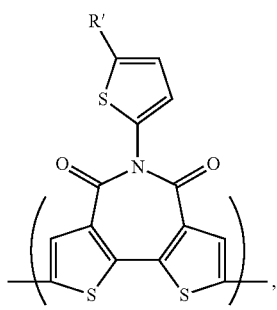

wherein R' can be a $C_{1-40}$ alkyl group or a $C_{1-40}$ haloalkyl group.

In other embodiments, Ar can be an optionally substituted polycyclic 8-14 membered aryl or heteroaryl group. For example, in certain embodiments, the present polymers can include an electron-acceptor unit (A) comprising a bithiopheneimide moiety represented by the formula:

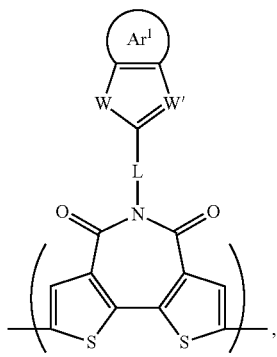

wherein:
$Ar^1$ can be an optionally substituted $C_{6-14}$ aryl group or an optionally substituted 5-14 membered heteroaryl group;
W can be selected from the group consisting of —O—, —S—, and —Se—;
W' can be —CR= or —N=, wherein R can be selected from the group consisting of H, a halogen, —CN, and L'R', wherein L' can be selected from the group consisting of —O—, —S—, —Se—, —C(O)—, —OC(O)—, —C(O)O—, and a covalent bond; and R' can be selected from the group consisting of a $C_{1-40}$ alkyl group, a $C_{2-40}$ alkenyl group, a $C_{2-40}$ alkynyl group, and a $C_{1-40}$ haloalkyl group; and
L can be selected from the group consisting of —O—, —S—, —Se—, —OC(O)—, —C(O)O—, a divalent $C_{1-20}$ alkyl group, a divalent $C_{1-20}$ haloalkyl group, and a covalent bond.

In embodiments where W is —S— and W' is —CH=, the bithiopheneimide moiety can be represented by the formula:

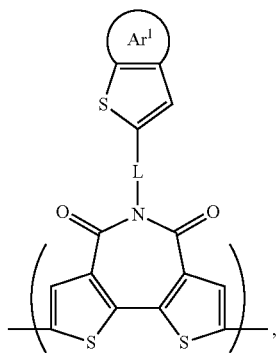

wherein L and $Ar^1$ are as defined herein. To illustrate, the moiety

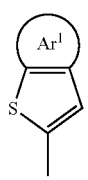

can be selected from the group consisting of:

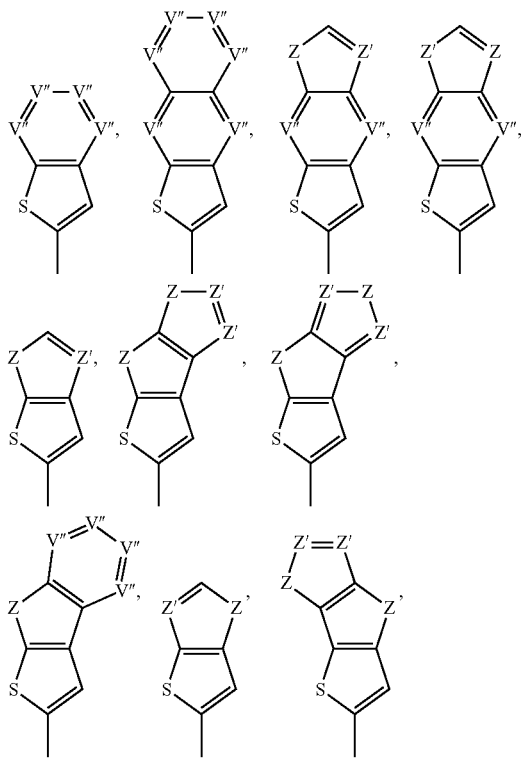

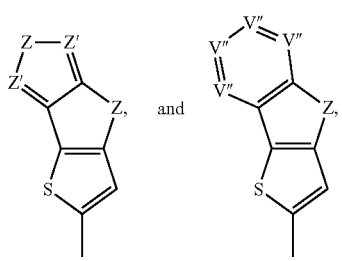

wherein:

V", at each occurrence, independently can be —CR"═ or —N═;

Z, at each occurrence, independently can be selected from the group consisting of —O—, —S—, and —Se—;

Z', at each occurrence, independently can be —CR"═ or —N═; and

R", at each occurrence, independently can be selected from the group consisting of H, a halogen, —CN, and L'R', wherein L', at each occurrence, can be selected from the group consisting of —O—, —S—, —Se—, C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group. For example, the moiety

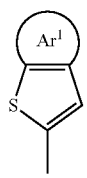

can be selected from the group consisting of:

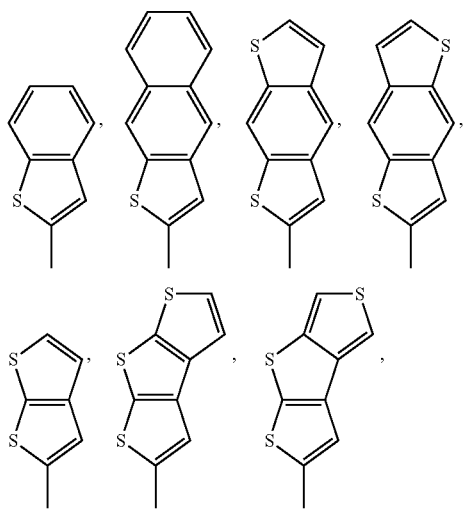

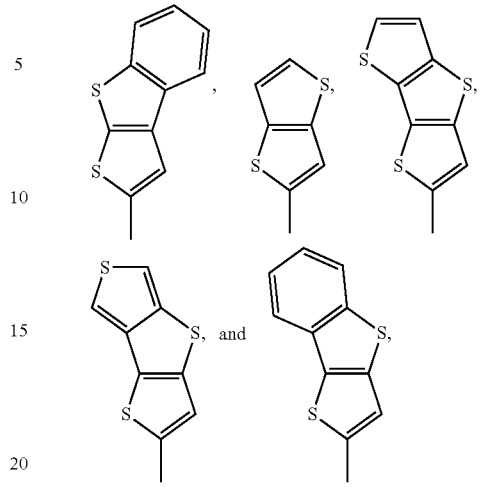

wherein any of the carbon atoms optionally can be substituted with a halogen, —CN, or L'R', wherein L', at each occurrence, can be selected from the group consisting of —O—, —S—, —Se—, —C(O)—, —OC(O)—, —C(O)O—, and a covalent bond; and R', at each occurrence, independently can be selected from the group consisting of a $C_{1-40}$ alkyl group, a $C_{2-40}$ alkenyl group, a $C_{2-40}$ alkynyl group, and a $C_{1-40}$ haloalkyl group.

In certain embodiments of the bithiopheneimide moiety described herein, L can be selected from the group consisting of —O—, —S—, a divalent $C_{1-20}$ alkyl group, and a covalent bond. In particular embodiments, L can be a covalent bond.

The electron-donor unit (D) of the present polymers can include one or more optionally substituted electron-rich 5-20 membered heteroaryl groups. In some embodiments, the electron-donor unit (D) can include one or more optionally substituted electron-rich monocyclic (5-membered) heteroaryl groups. In some embodiments, the electron-donor unit (D) can include one or more optionally substituted electron-rich polycyclic (8-20 membered) heteroaryl groups. In some embodiments, the electron-donor unit (D) can include at least one optionally substituted electron-rich monocyclic heteroaryl group and at least one optionally substituted electron-rich polycyclic heteroaryl group. In some embodiments, the electron-rich monocyclic heteroaryl group and/or the electron-rich polycyclic heteroaryl group can be chlorinated.

For example, the electron-donor unit (D) can be represented by the formula:

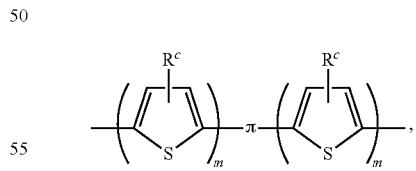

wherein π can be selected from the group consisting of (a) an optionally substituted electron-rich 8-20 membered polycyclic heteroaryl group, (b) a linear conjugated linker, and (c)

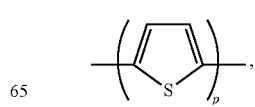

wherein $R^c$ can be selected from the group consisting of H, Fl, Cl, and a $C_{1-20}$ alkyl group; m can be 0 or 1; and p can be 0, 1, 2, 3 or 4, provided that p is not 0 when m is 0. In certain embodiments, m can be 1, $R^c$ can be H, Cl or a linear $C_{6-20}$ alkyl group, and π can be as defined herein. In certain embodiments, m can be 0, and π can be an optionally substituted electron-rich 8-20 membered polycyclic heteroaryl group, a linear conjugated linker, or

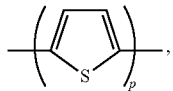

where p can 1, 2, 3 or 4.

To illustrate, in embodiments where π is an optionally substituted electron-rich 8-20 membered polycyclic heteroaryl group, π can be selected from the group consisting of:

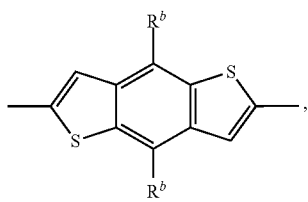

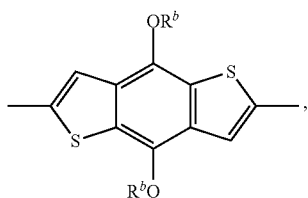

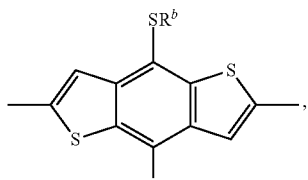

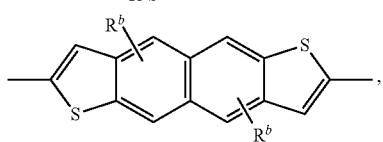

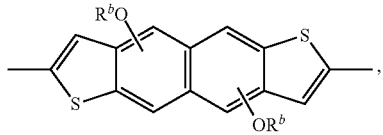

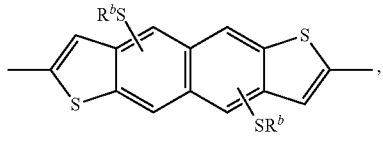

-continued

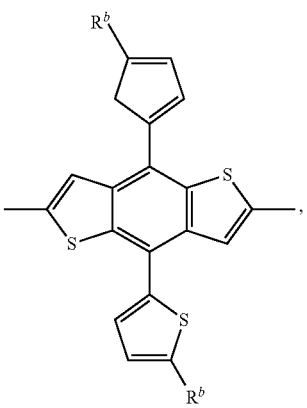

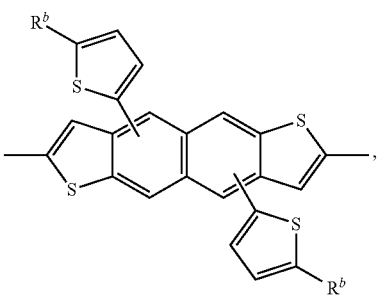

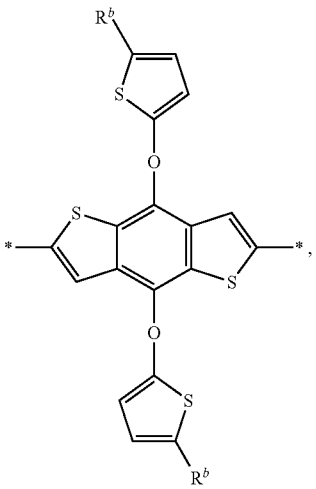

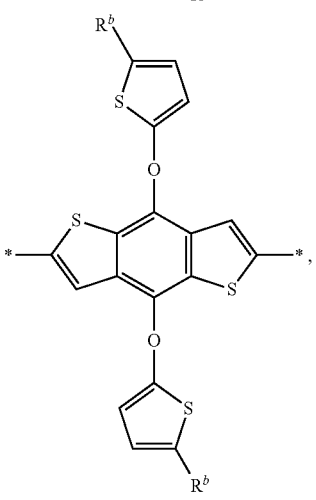

-continued
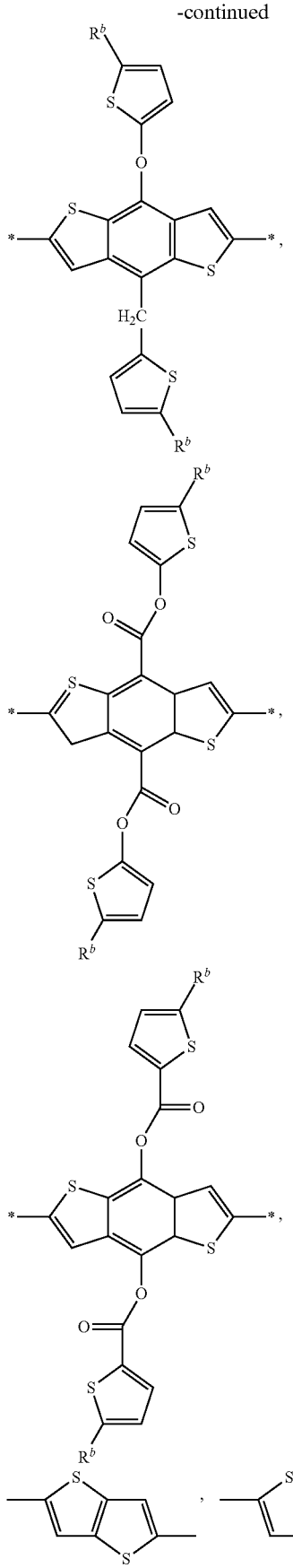
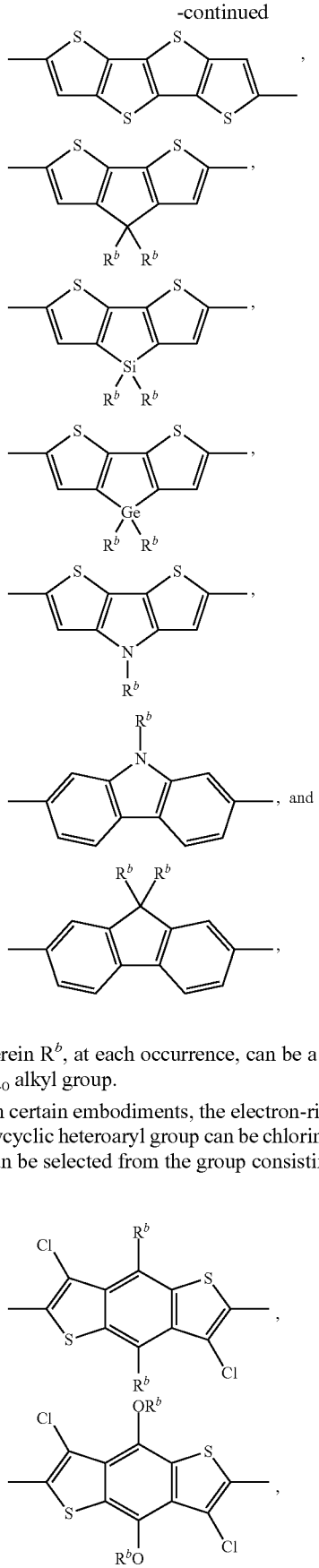
wherein $R^b$, at each occurrence, can be a linear or branched $C_{6-40}$ alkyl group.
In certain embodiments, the electron-rich 8-20 membered polycyclic heteroaryl group can be chlorinated. For example, π can be selected from the group consisting of:

-continued
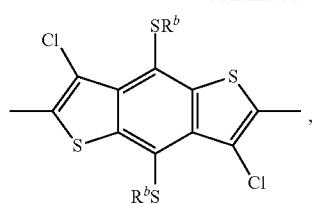
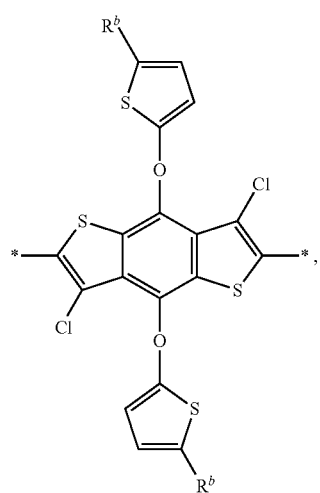
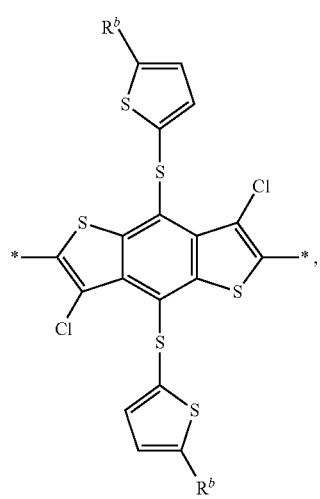
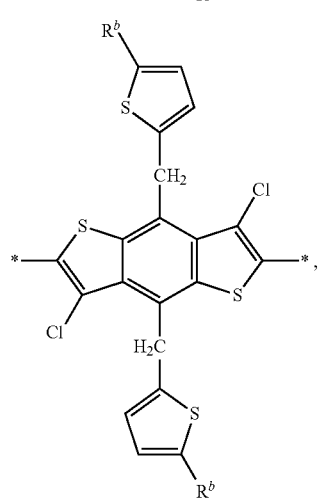
-continued
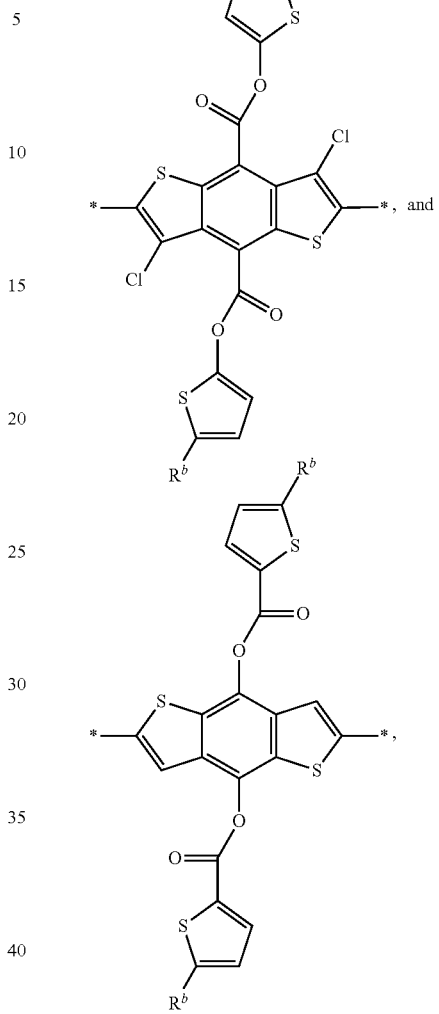
wherein $R^b$ is as defined herein.
In further embodiments, π can have a formula selected from
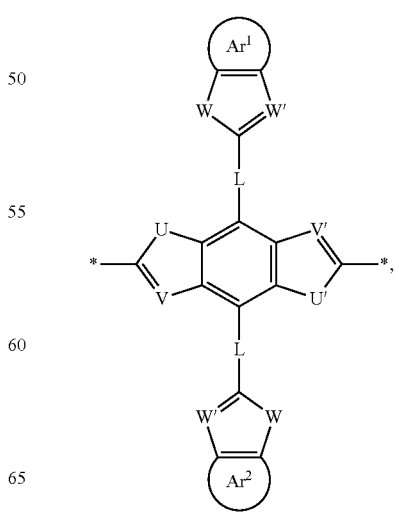

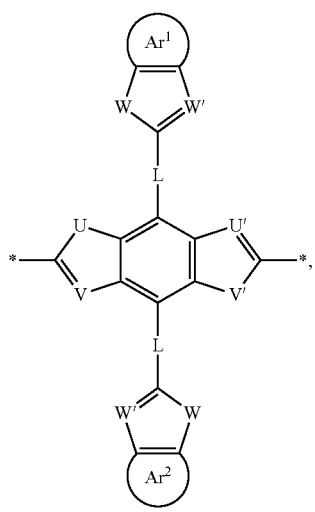

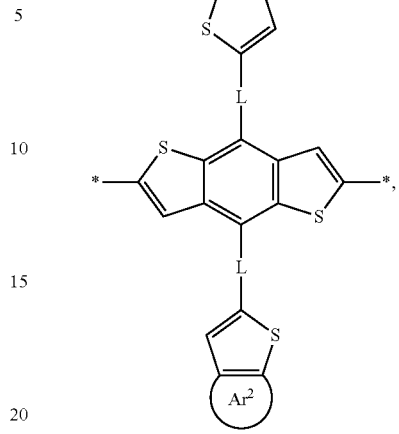

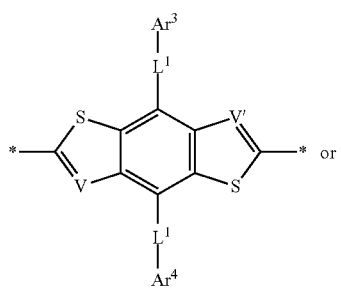

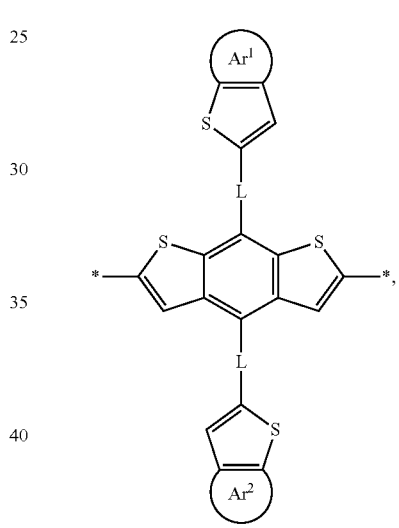

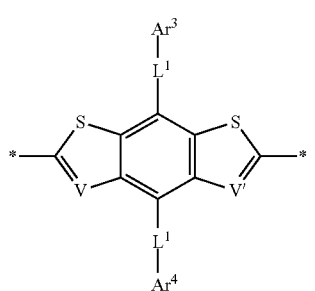

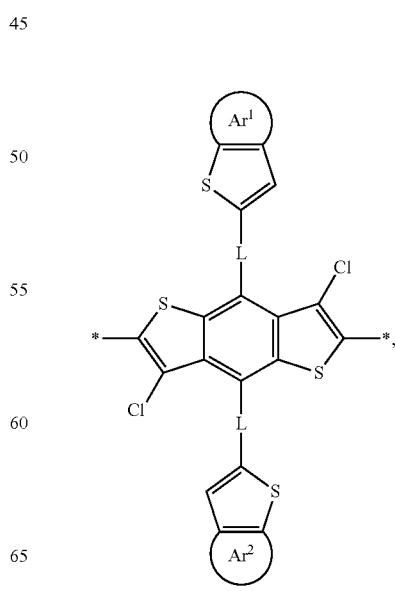

wherein:

$Ar^2$ has the same definition as $Ar^1$;

$Ar^3$ and $Ar^4$ independently are an optionally substituted phenyl group or an optionally substituted 5- or 6-membered heteroaryl group;

$L^1$ has the same definition as L;

U and U' independently are selected from —O—, —S—, and —Se—;

V and V' independently are —CR= or —N=; and $Ar^1$, L, R, W, and W' are as defined herein.

In certain embodiments, each of U, U' and W can be —S—, and each of V, V' and W' can be —CH= or —CCl=, thus providing a π group having a formula selected from:

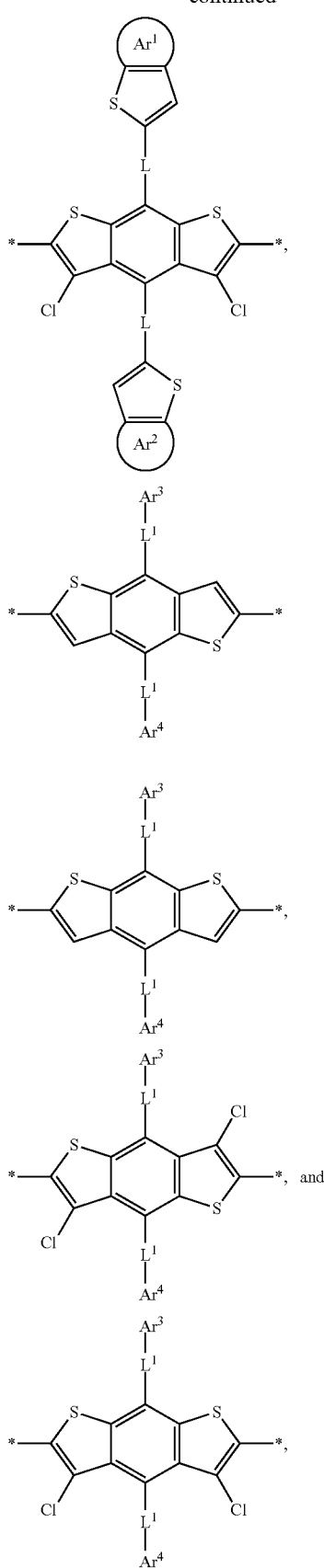

wherein $Ar^1$, $Ar^2$, $Ar^3$, $Ar^4$, L and $L^1$ are as defined herein. To illustrate, L and $L^1$ can be selected from —O—, —S—, —OC(O)—, —C(O)O—, a divalent $C_{1-20}$ alkyl group, and a covalent bond.

In embodiments where π is a linear conjugated linker, π can be selected from the group consisting of:

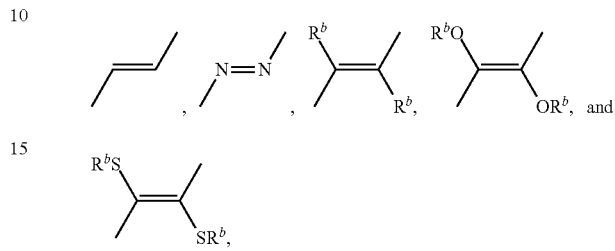

wherein $R^b$, at each occurrence, can be a $C_{1-40}$ alkyl group.

In embodiments where π is

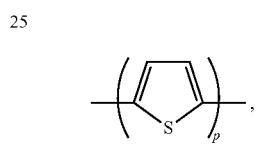

p can be 1 or 2.

In various embodiments, the present polymers can be an alternating polymer consisting of one type of electron-acceptor unit and one type of electron-donor unit. For example, present polymers according to these embodiments can be represented by the formula:

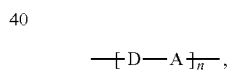

where D and A are as defined herein, and the degree of polymerization (n) can be an integer in the range of 2 to 10,000, for example, in the range of 3 and 5,000, preferably between 5 and 5,000, and more preferably, between 10 and 5,000.

In certain embodiments, alternating polymers according to the present teachings can be represented by the formula:

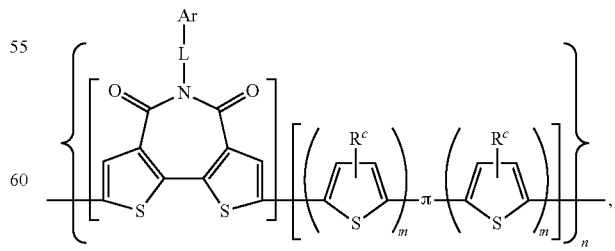

where Ar, L, $R^c$, π, m and n are as defined herein. Exemplary alternating polymers according to the present teachings include, but are not limited to:

27 28
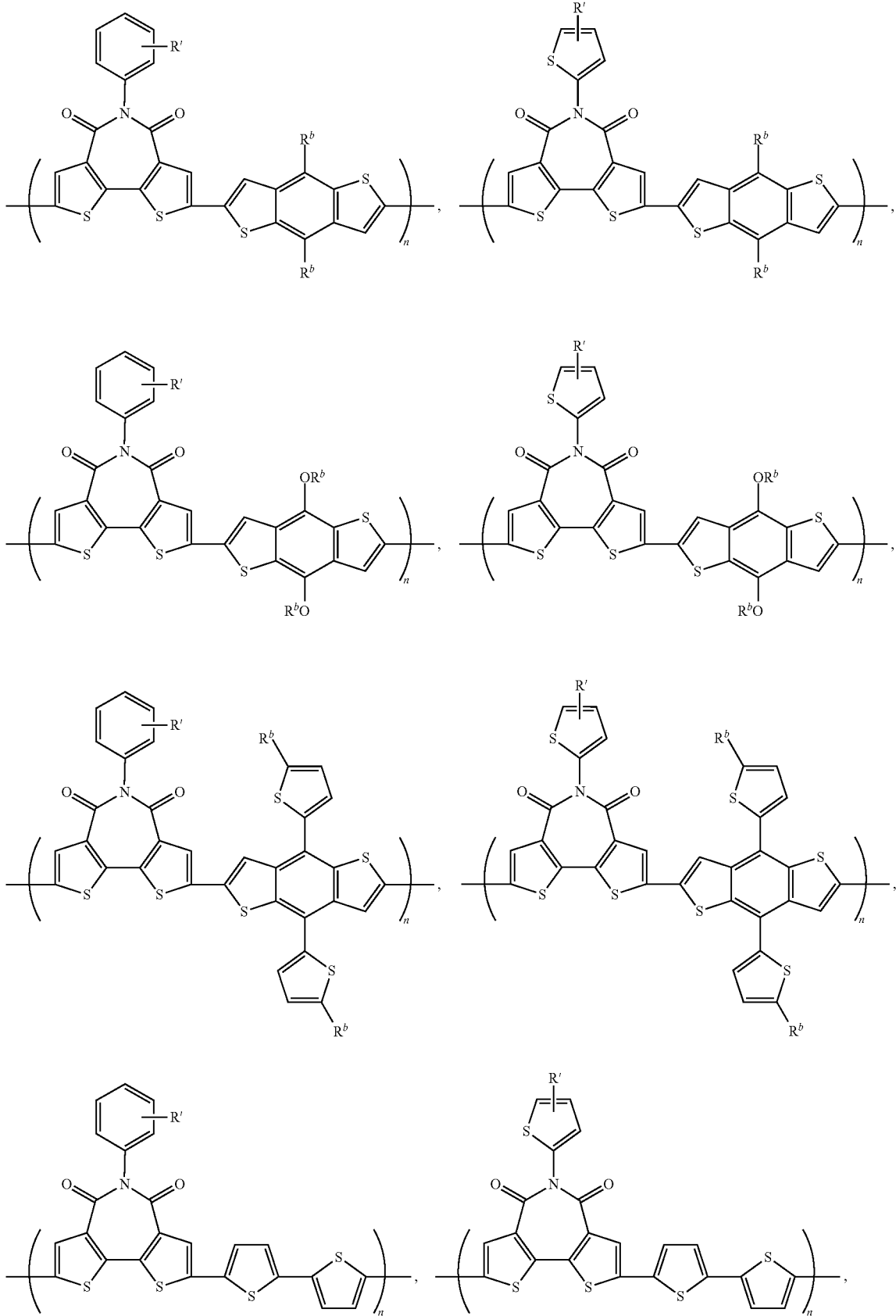

-continued
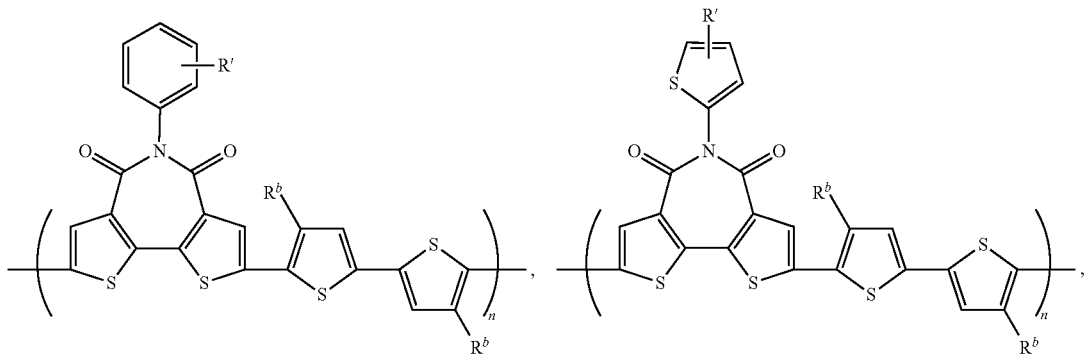
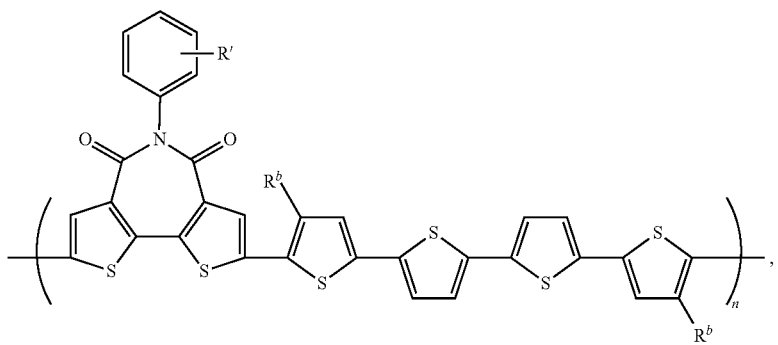
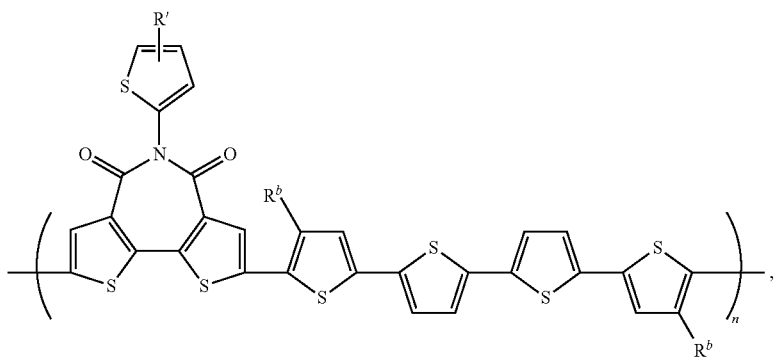
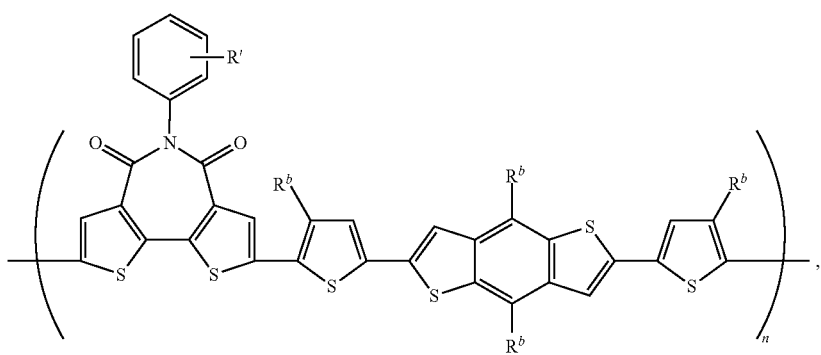

-continued
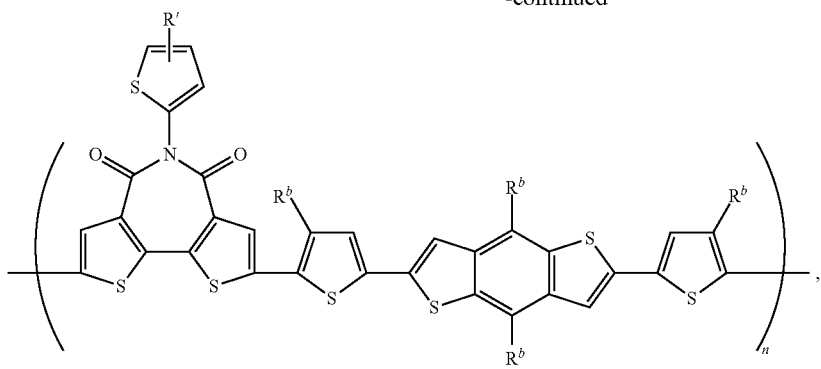
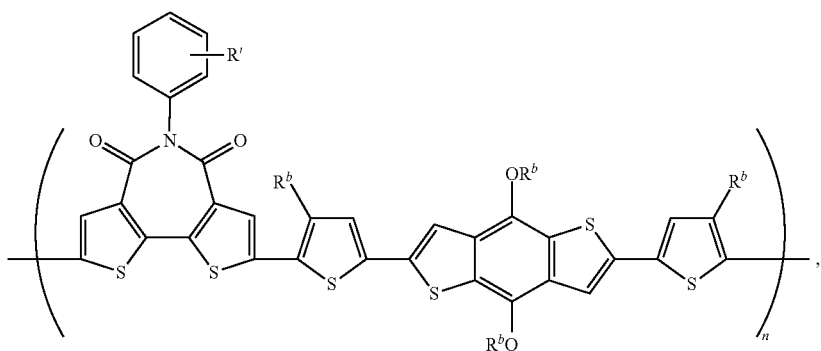
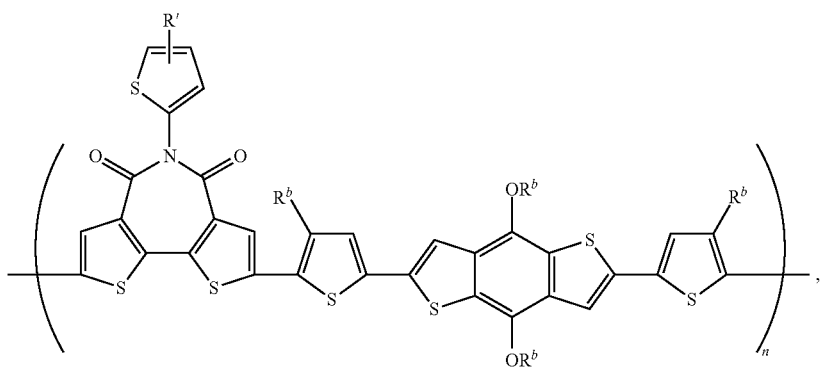
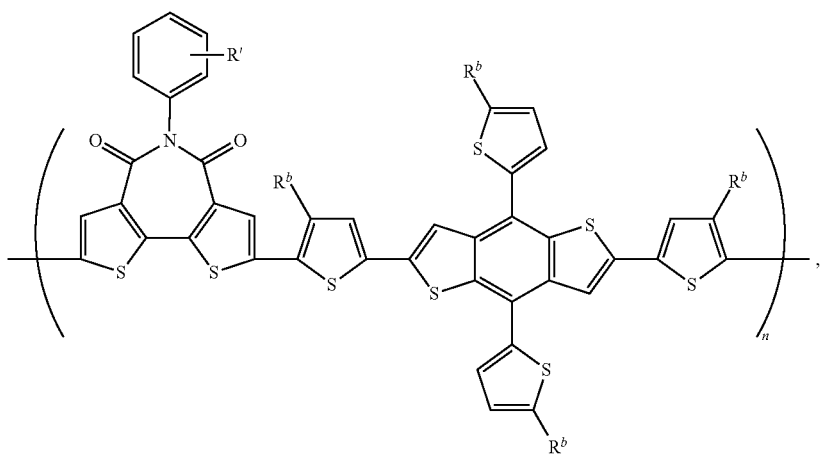

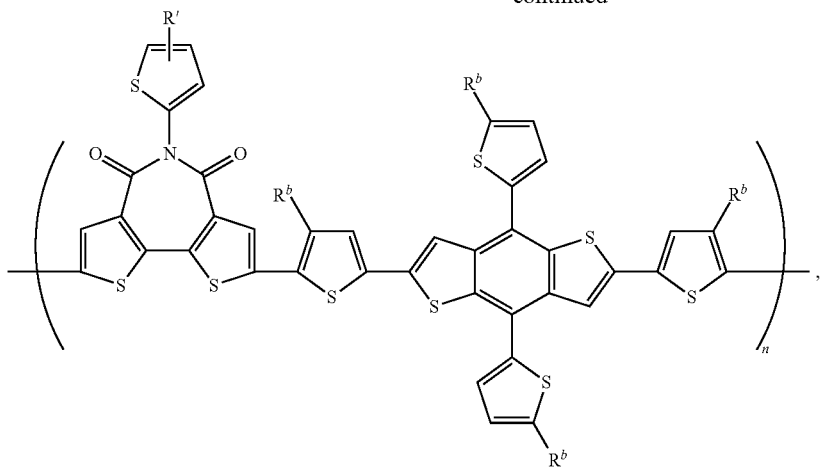
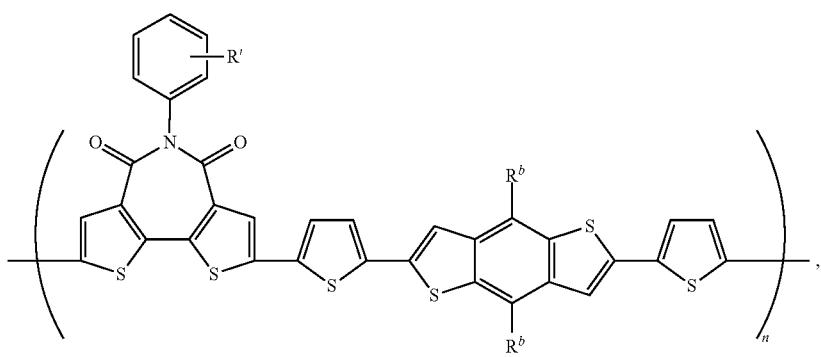
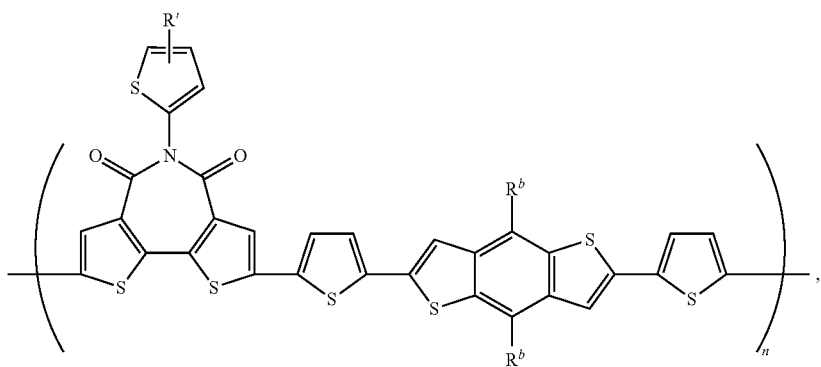
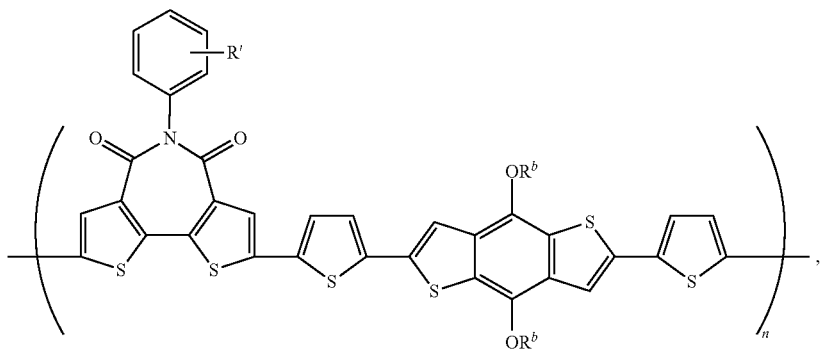

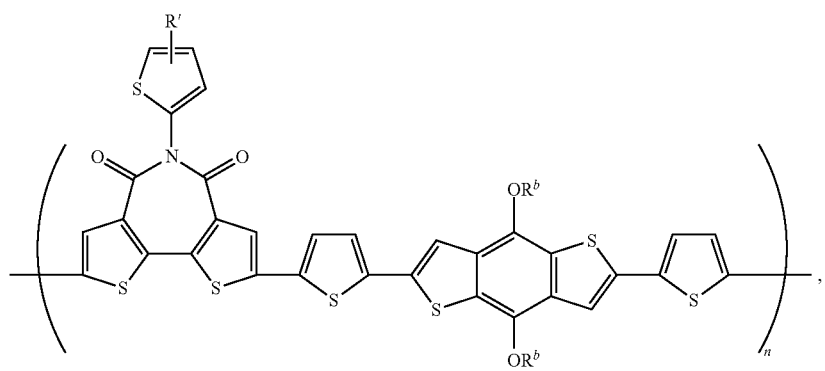
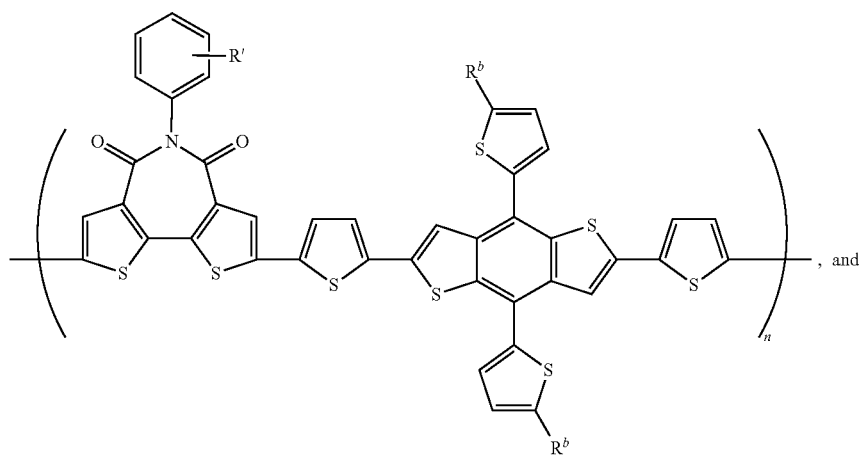, and
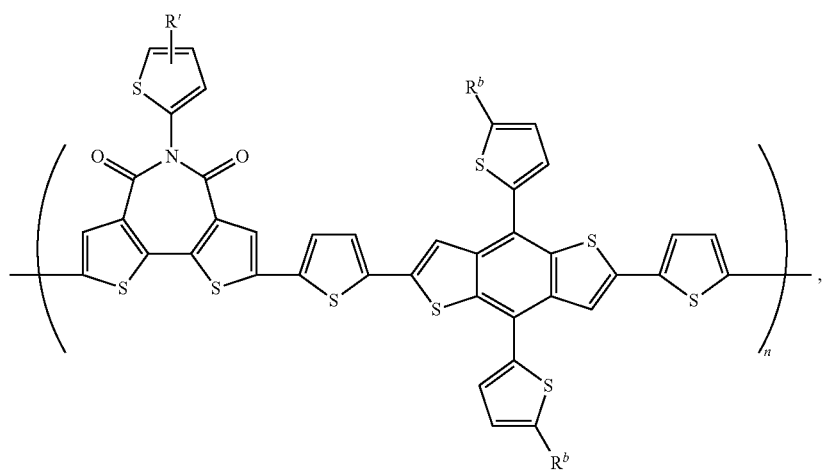,
where R', $R^b$, and n are as defined herein. For example, R' can be a linear or branched $C_{6-40}$ alkyl group; $R^b$, at each occurrence, independently can be a linear or branched $C_{6-40}$ alkyl group; and n can be an integer in the range of 3 and 5,000.

Additional alternating polymers according to the present teachings include:
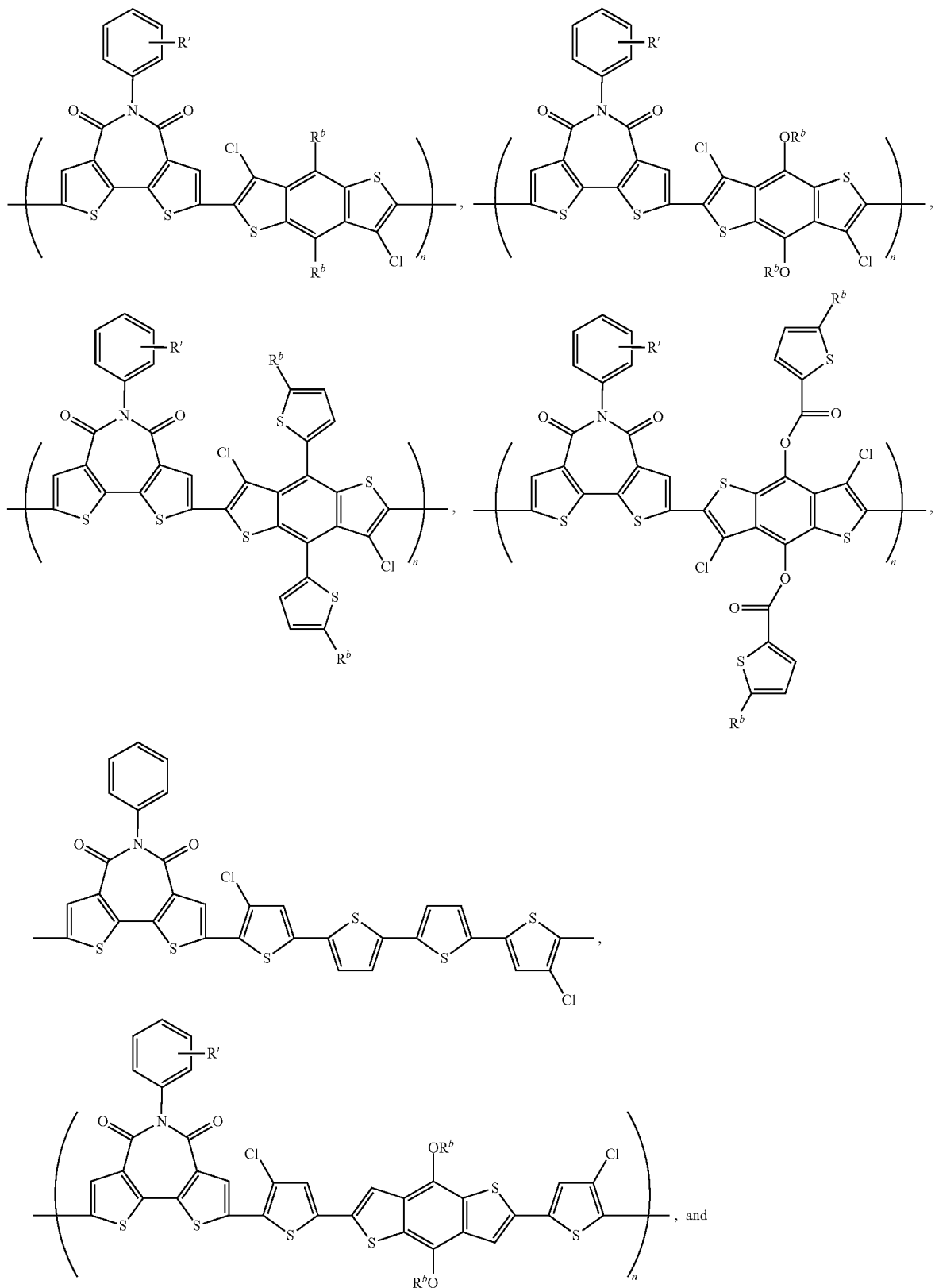

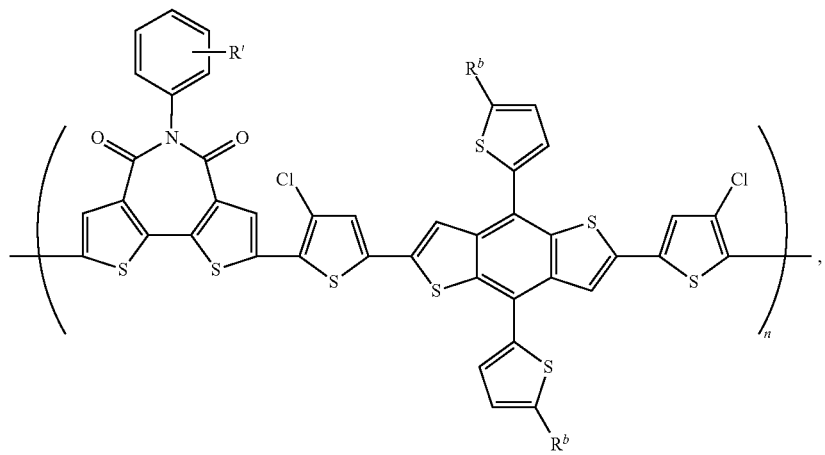

where R', $R^b$, and n are as defined herein. For example, R' can be a linear or branched $C_{6-40}$ alkyl group; $R^b$, at each occurrence, independently can be a linear or branched $C_{6-40}$ alkyl group; and n can be an integer in the range of 3 and 5,000.

In other embodiments, the present polymers can be a random polymer comprising at least two different repeat units represented by the formula:

where D and A are as defined herein. Such random polymers can be represented by the formula:

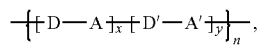

where A and A' are represented by the formula:

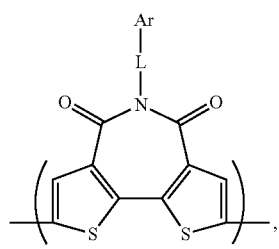

D and D' are represented by the formula:

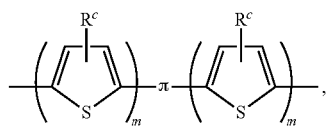

and where Ar, L, $R^c$, π and m are as defined herein, provided that A is different from A' and/or D is different from D;

x and y are real numbers representing mole fractions, where $0.05 \leq x \leq 0.95$, $0.05 \leq y \leq 0.95$, and the sum of x and y is about 1; and n is an integer in the range of 2 to 10,000.

To illustrate, random polymers according to the present teachings can include two different electron-acceptor units A and A', where the definition(s) of Ar and/or L in A are different from the definition(s) of Ar and/or L in A'. For example, a random polymer according to the present teachings can have a formula such as:

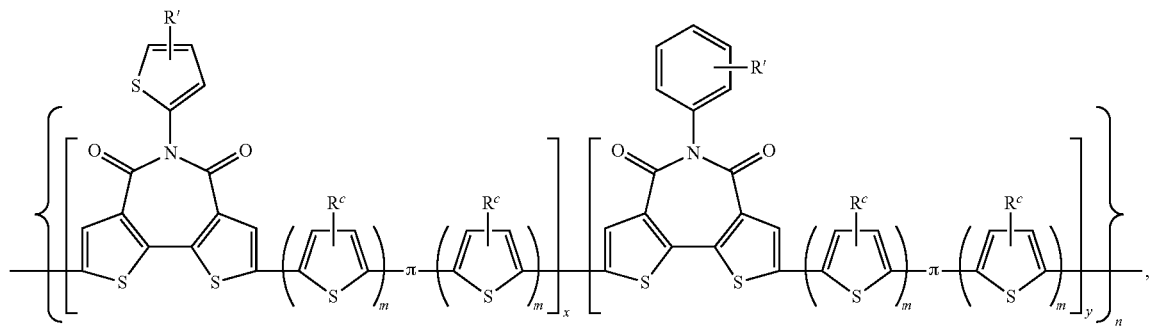

where R' can be identical or different; each $R^c$, π and m can be identical or different; and x, y, and n are as defined herein; or

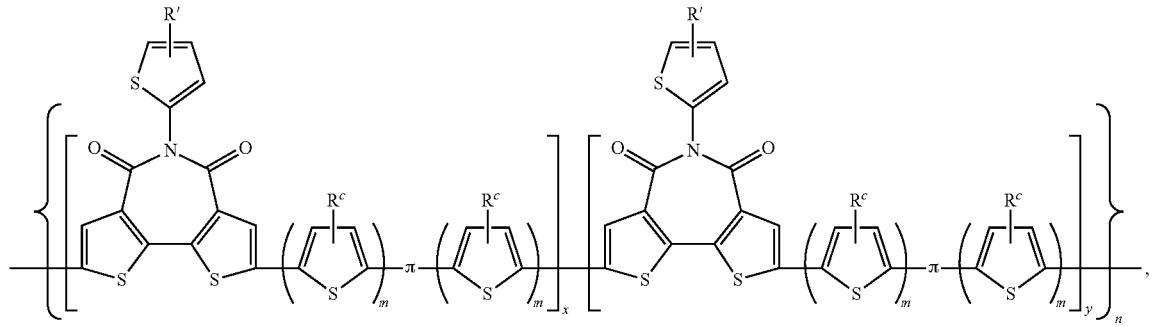

where R' and R" are different linear or branched $C_{6-40}$ alkyl groups; each $R^c$, π and m can be identical or different; and x, y, and n are as defined herein.

To illustrate further, random polymers according to the present teachings can include two different electron-donor units D and D', where the definition(s) of $R^c$, π and/or m in D are different from the definition(s) of $R^c$, π and/or m in D'. For example, a random polymer according to the present teachings can have a formula such as:

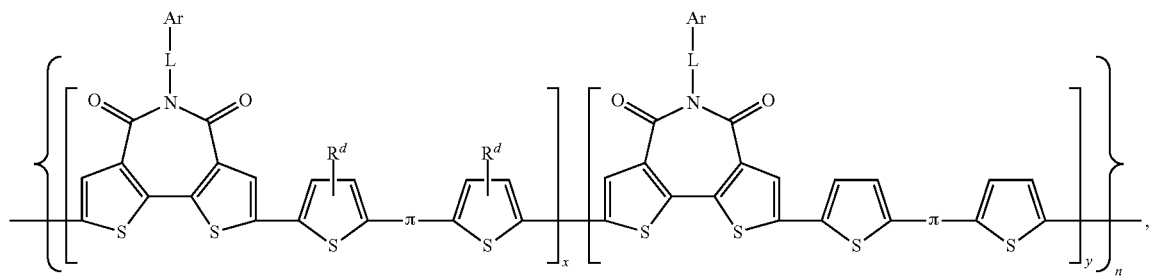

where each Ar, L, and π can be identical or different; each $R^d$ is H, F, Cl, or a $C_{1-40}$ alkyl group; and x, y, and n are as defined herein. An example can be:

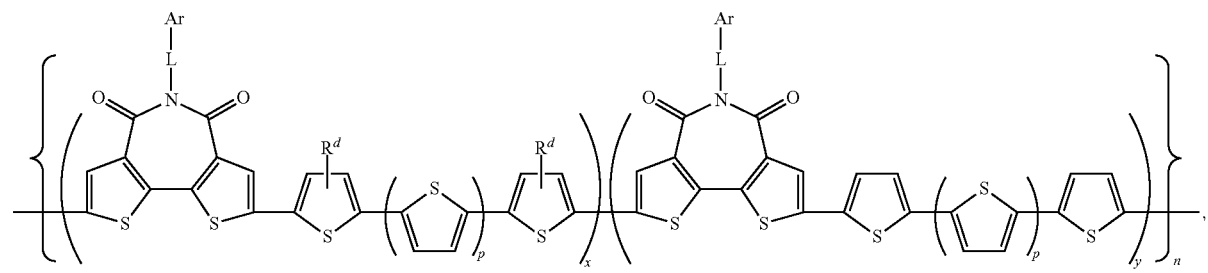

where each $R^d$ is selected from H, F, Cl, and a $C_{1-40}$ alkyl group; p is 1 or 2; each Ar and L can be identical or different; and x, y, and n are as defined herein.

Further examples of random polymers according to the present teachings can include, but are not limited to:

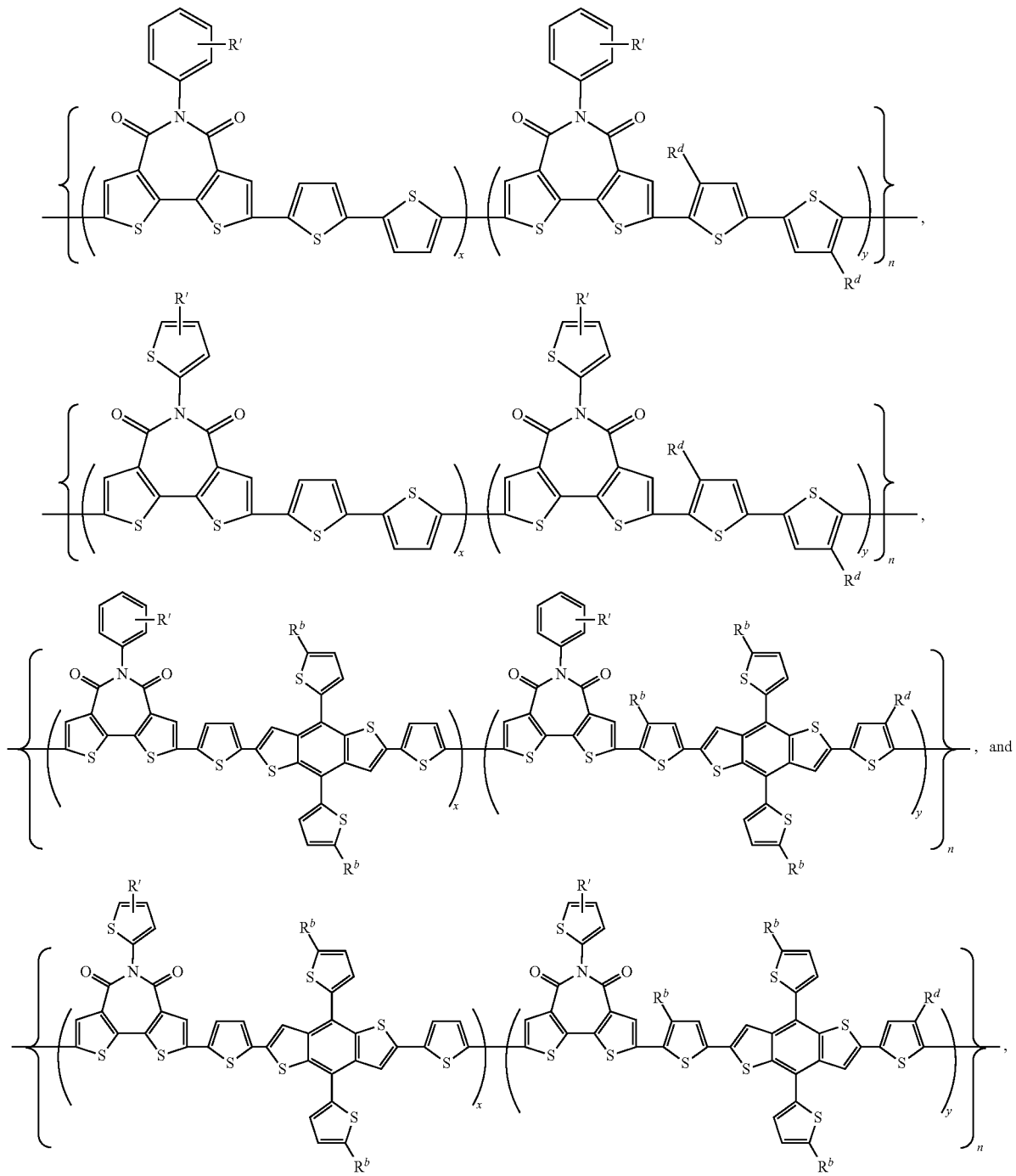

where R', $R^b$, $R^d$, x, y, and n are as defined herein. For example, R' can be a linear or branched $C_{6-40}$ alkyl group; $R^b$, at each occurrence, independently can be a branched $C_{6-40}$ alkyl group; $R^d$ can be Cl or a linear $C_{1-40}$ alkyl group; $0.2 \leq x \leq 0.8$; $0.2 \leq y \leq 0.8$; and n can be an integer in the range of 3 and 5,000.

Polymers of the present teachings and monomers leading to the present polymers can be prepared according to procedures analogous to those described in the Examples. In particular, Stille coupling or Suzuki coupling reactions can be used to prepare polymers according to the present teachings with high molecular weights and in high yields and purity, as confirmed by $^1$H NMR spectra, elemental analysis, and/or GPC measurements.

Alternatively, the present polymeric compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Polymers disclosed herein can be soluble in various common organic solvents. As used herein, a polymer can be considered soluble in a solvent when at least 0.1 mg of the polymer can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The polymers described herein can be dissolved, dispersed or suspended in a single solvent or mixture of solvents to provide a composition suitable for solution processing techniques. In preferred embodiments, the solvent can be selected from the group consisting of chlorobenzene, dichlorobenzene (o-dichlorobenzene, m-dichlorobenzene, p-orobenzene, or mixtures thereof), trichlorobenzene, benzene, toluene, chloroform, dichloromethane, dichloroethane, xylenes, $\alpha,\alpha,\alpha$-trichlorotoluene, methyl naphthalene (e.g., 1-methylnaphthalene, 2-methylnaphthalene, or mixtures thereof), chloronaphthalene (e.g., 1-chloronaphthalene, 2-chloronaphthalene, or mixtures thereof), and mixtures thereof. Various solution processing techniques have been used with organic electronics. Common solution processing techniques include, for example, spin coating, slot coating, doctor blading, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can exhibit semiconductor behavior (including photoactive behavior) such as optimized light absorption/charge separation in a photovoltaic device; charge transport/recombination/light emission in a light-emitting device; and/or high carrier mobility and/or good current modulation characteristics in a field-effect device. In addition, the present polymers can possess certain processing advantages such as solution-processability and/or good stability (e.g., air stability) in ambient conditions. The polymers of the present teachings can be used alone or in combination with other compounds to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material and composites (e.g., devices) including the semiconductor material. The methods can include preparing a composition (e.g., a solution or dispersion) that includes one or more polymeric compounds disclosed herein dissolved or dispersed in a liquid medium such as a solvent or a mixture of solvents, and depositing the composition on a substrate to provide a semiconductor material. The deposited semiconductor material can be processed further (e.g., subject to an annealing step) prior to formation of additional components thereon to complete a particular device structure.

Various articles of manufacture including optical devices, optoelectronic devices, and electronic devices such as thin film semiconductors, photovoltaic/solar cells, photodetectors (or photodiodes), organic light emitting devices such as organic light emitting transistors (OLETs), that make use of the polymers disclosed herein are within the scope of the present teachings as are methods of making the same. The present polymers can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a polymer of the present teachings.

In various embodiments, the optical or optoelectronic device can be configured as a solar cell, in particular, a bulk heterojunction solar cell. Polymers of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a polymer of the present teachings as the donor material and an acceptor material as the photoactive layer. Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, $C_{20}$-$C_{1000}$. In certain embodiments, the fullerene can be selected from the range of $C_{60}$ to $C_{96}$. In particular embodiments, the fullerene can be a $C_{60}$ fullerene derivative or a $C_{70}$ fullerene derivative, such as [6,6]-phenyl-$C_{61}$-butyric acid methyl ester ($PC_{61}BM$ or simply PCBM) or [6,6]-phenyl-$C_{71}$-butyric acid methyl ester ($PC_{71}BM$). In some embodiments, chemically modified fullerenes can be used, provided that the modified fullerene retains acceptor-type and electron mobility characteristics. Some common fullerene derivatives include bisadduct of $PC_{61}BM$ (Bis-PCBM), indene-$C_{60}$ monoadduct (ICMA), and indene-$C_{60}$ bisadduct (ICBA). Further, other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

In some embodiments, the acceptor material can be an electron-transporting (n-type) polymer. In some embodiments, the electron-transporting polymer can comprise a bis(imide)arene unit. For example, the arene group in the bis(imide)arene unit can be a fused-ring (hetero)aromatic moiety (referred to as π-1 and π-1' below) selected from:

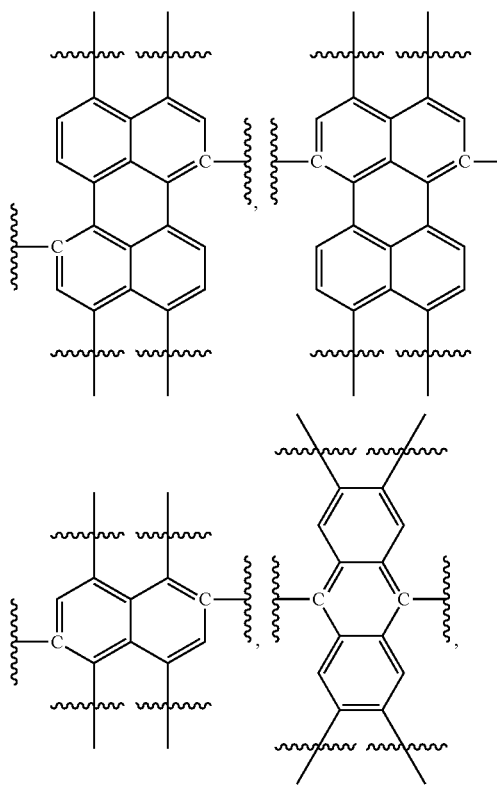

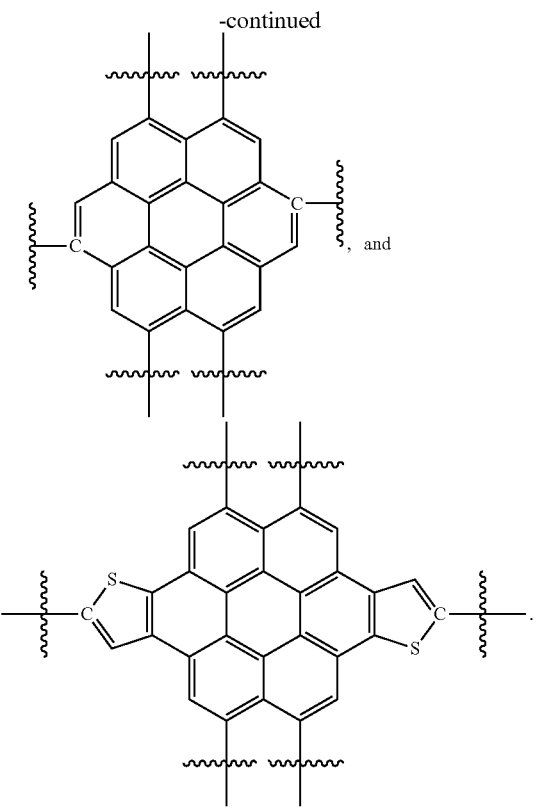

In preferred embodiments, the arene group can be naphthalene.

To illustrate, in certain embodiments, the electron-transporting polymer can be an alternating polymer including a bis(imide)arene unit and an $M^a$ co-unit. The alternating polymer can be represented by Formula 1:

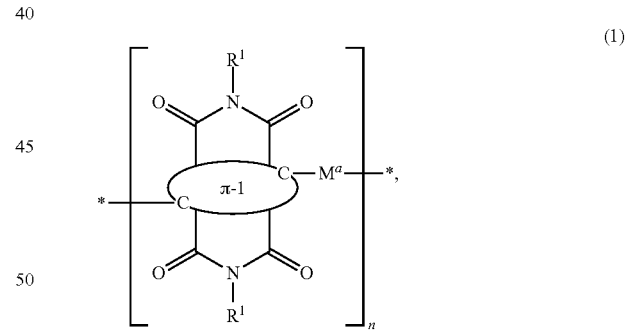

wherein:
π-1 is an optionally substituted fused ring moiety;
$R^1$ is selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;
$M^a$ is a repeat unit comprising one or more conjugated moieties that does not include a bis(imide)arene unit (a rylene diimide); and
n is an integer in the range of 2 to 5,000.

In other embodiments, the electron-transporting polymer can be a random polymer including two different building blocks, where each building block includes a bis(imide)arene unit and an $M^a$ co-unit. For example, the random polymer can be represented by Formula 2:

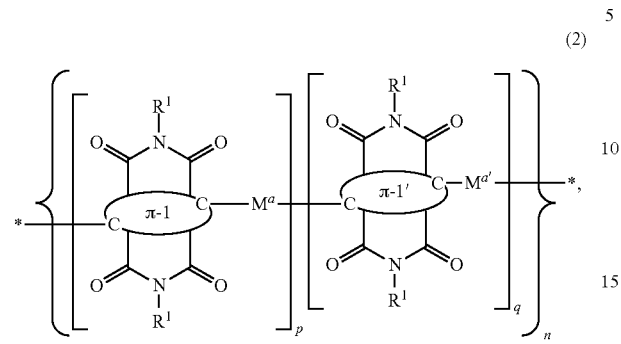

(2)

wherein:

π-1 and π-1' can be identical or different and independently are an optionally substituted fused ring moiety;

R¹ and $R^{1'}$ can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

$M^a$ and $M^{a'}$ can be identical or different and independently are a repeat unit comprising one or more conjugated moieties that does not include a rylene diimide;

p and q independently are a real number, wherein $0.1 \le p \le 0.9$, $0.1 \le q \le 0.9$, and the sum of p and q is about 1; and n is an integer in the range of 2 to 5,000;

provided that at least one of the following is true: (a) π-1' is different from π-1, (b) $R^{1'}$ is different from $R^1$, or (c) $M^{a'}$ is different from $M^a$.

The one or more conjugated moieties in the co-repeat unit $M^a$ and $M^{a'}$ can be represented by Ar, π-2, and Z, wherein Ar is an optionally substituted monocyclic aryl or heteroaryl group, π-2 is an optionally substituted 8-24 membered polycyclic conjugated moiety, and Z is a conjugated linear linker. In various embodiments, $M^a$ and $M^{a'}$ can have a formula selected from:

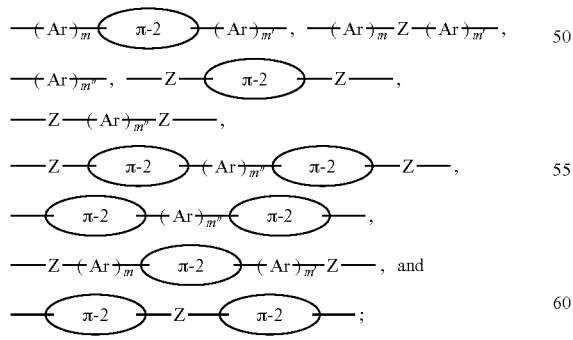

wherein m, m' and m" independently are 0, 1, 2, 3, 4, 5 or 6.

In certain embodiments, π-2 can be a polycyclic moiety including one or more optionally substituted thienyl, thiazolyl, or phenyl groups. For example, π-2 can be selected from:

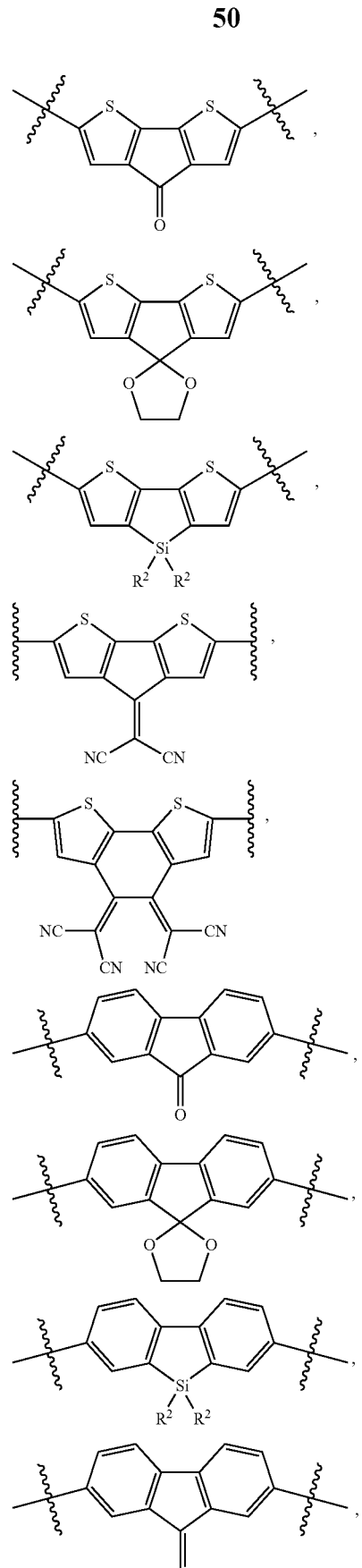

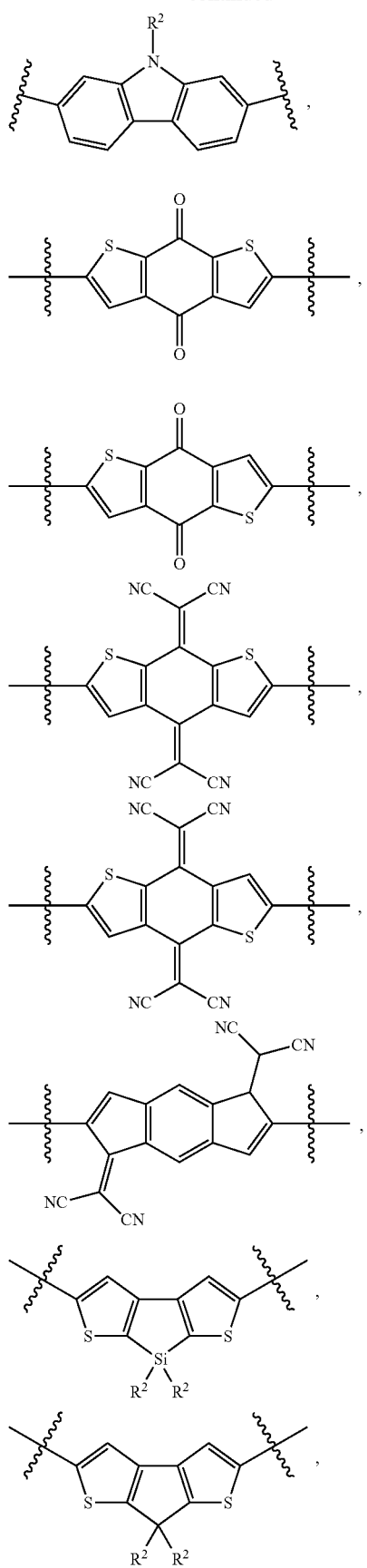
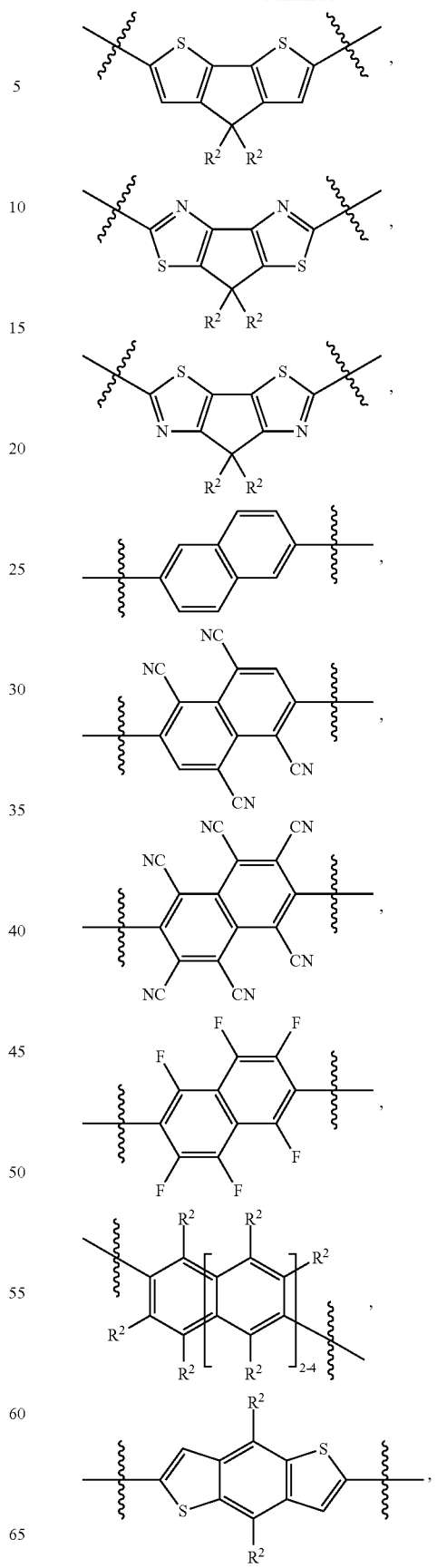

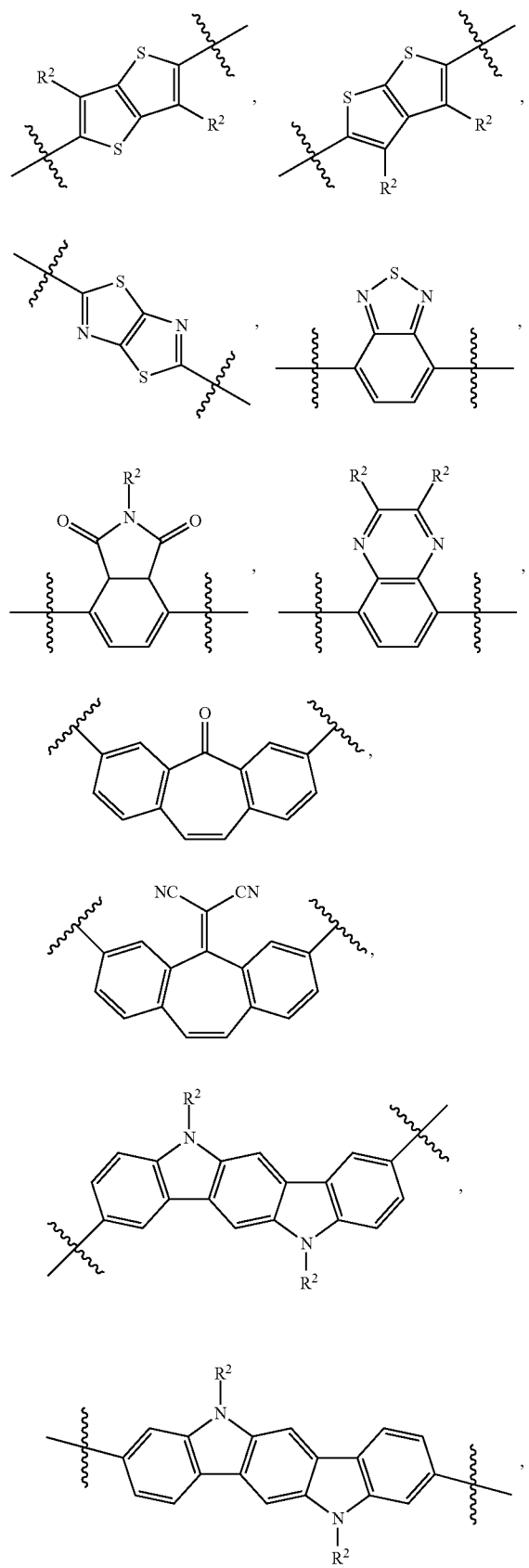

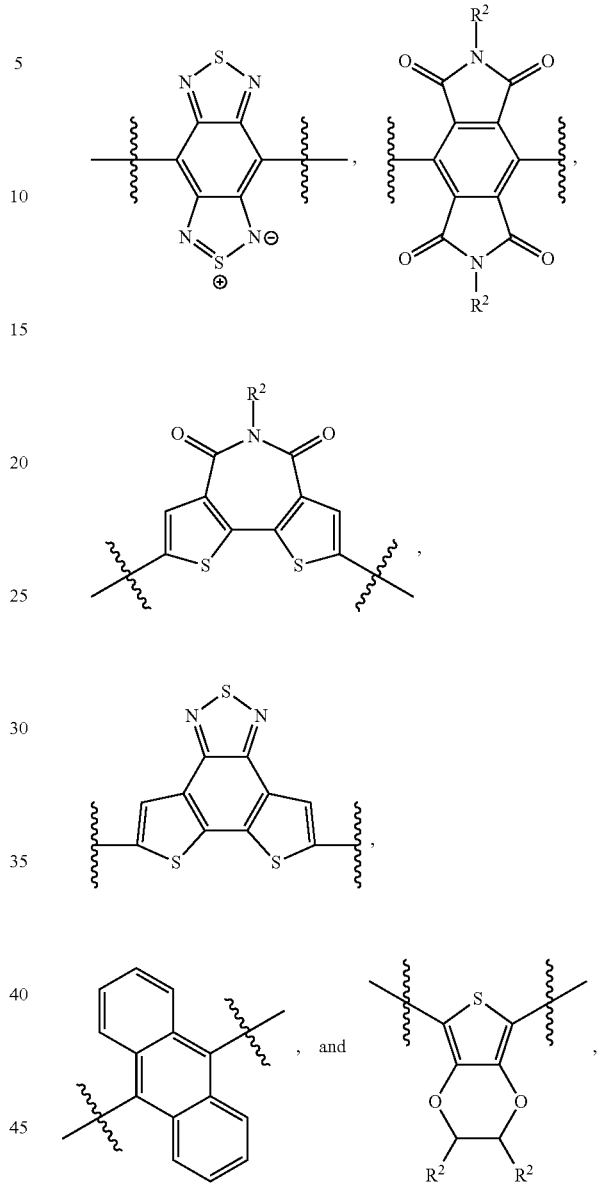

wherein $R^2$ can be selected from H, a $C_{1-20}$ alkyl group, a $C_{1-20}$ alkoxy group, and a $C_{1-20}$ haloalkyl group.

In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl$)_2$. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl)$_2$. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

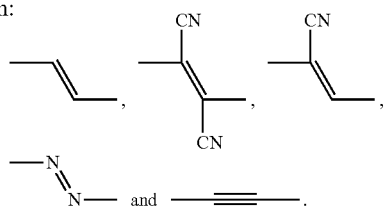

In some embodiments, $M^a$ and $M^{a'}$ can include at least one optionally substituted monocylic aryl or heteroaryl group. For example, $M^a$ and $M^{a'}$ can have the formula:

wherein m" is selected from 1, 2, 3, 4, 5, or 6; and Ar is as defined herein. For example, Ar can be an optionally substituted thienyl group.

In certain embodiments, the acceptor material can be a bis(imide)arene polymer represented by Formula 3 or 4:

wherein:

π-1 and π-1' can be identical or different and independently are an optionally substituted fused ring moiety;

R' and R" can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

R' and R" can be identical or different and independently are selected from the group consisting of H, F, Cl, —CN, and -L-R, wherein L, at each occurrence, independently is selected from the group consisting of —O—, —S—, —C(O)—, —C(O)O—, and a covalent bond; and R, at each occurrence, independently can be selected from the group consisting of a $C_{6-20}$ alkyl group, a $C_{6-20}$ alkenyl group, and a $C_{6-20}$ haloalkyl group;

m and m' independently can be 1, 2, 3, 4, 5 or 6; and p and q independently are a real number, wherein $0.1 \leq p \leq 0.9$, $0.1 \leq q \leq 0.9$, and the sum of p and q is about 1; and n is an integer in the range of 2 to 5,000;

provided that at least one of the following is true: (a) π-1' is different from π-1, (b) $R^{1'}$ is different from $R^1$, or (c) R" is different from R'.

In particular embodiments, the acceptor material can be a polymer represented by Formula 5, 6, 7, or 8:

(3)

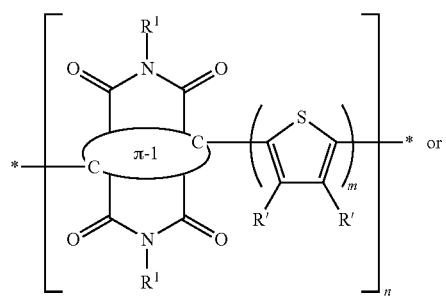

(4)

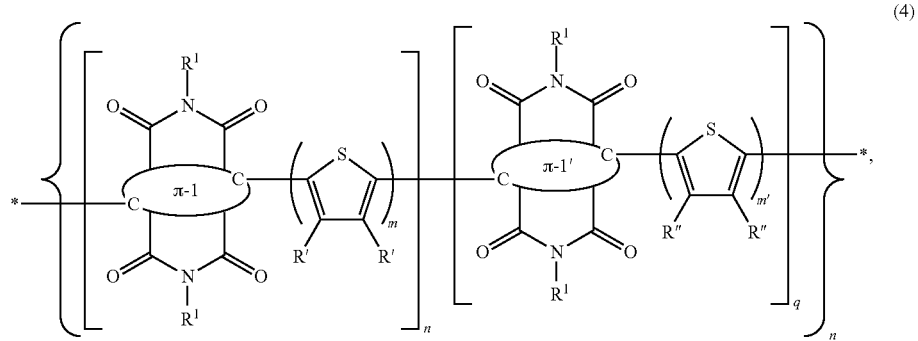

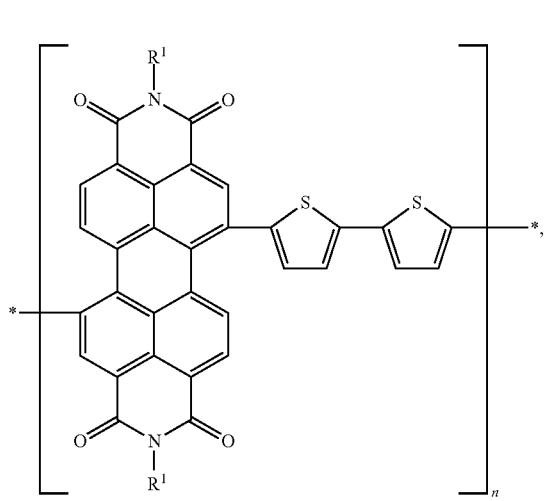

(5)

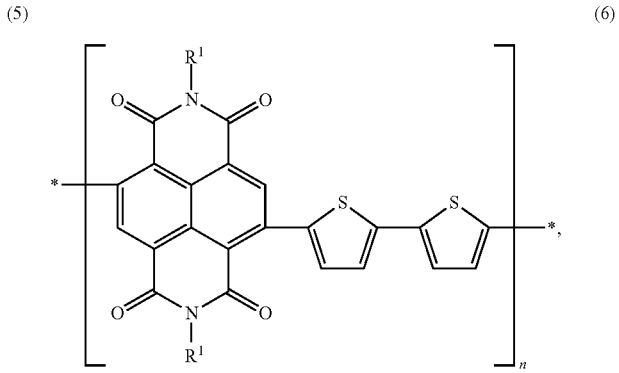

(6)

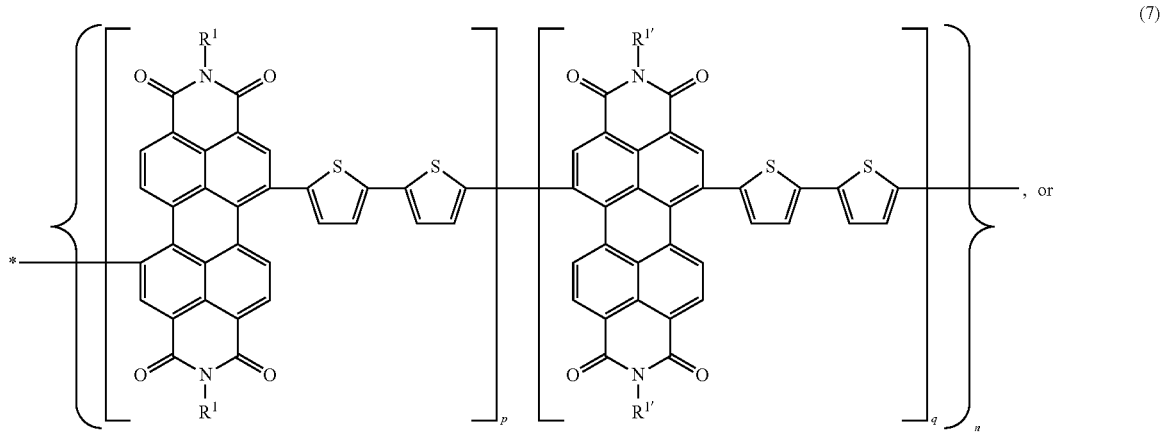

, or (7)

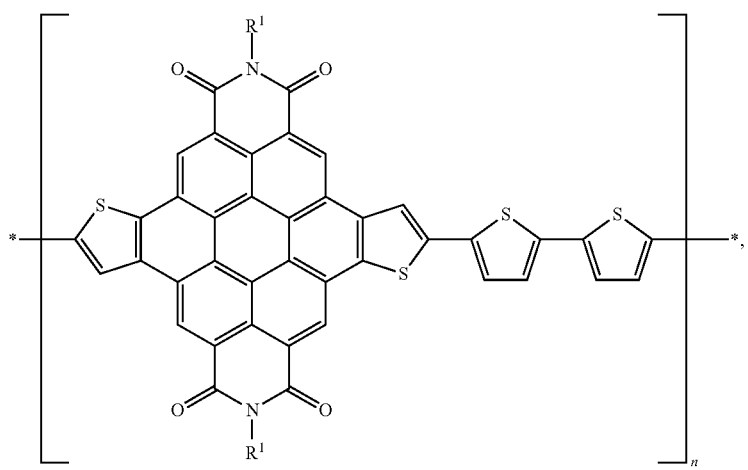

(8)

wherein:

R¹ and R¹' can be identical or different and independently are selected from the group consisting of a $C_{1-30}$ alkyl group, a $C_{2-30}$ alkenyl group, a $C_{1-30}$ haloalkyl group, a $C_{6-20}$ aryl group and a 5-14 membered heteroaryl group, wherein the $C_{6-20}$ aryl group and the 5-14 membered heteroaryl group optionally are substituted with a $C_{1-30}$ alkyl group, a $C_{2-30}$ alkenyl group, or a $C_{1-30}$ haloalkyl group;

p and q independently are a real number, wherein $0.1 \leq p \leq 0.9$, $0.1 \leq q \leq 0.9$, and the sum of p and q is about 1; and n is an integer in the range of 2 to 5,000.

For example, R¹ and R¹' can be selected from the group consisting of a branched $C_{3-20}$ alkyl group, a branched $C_{4-20}$ alkenyl group, and a branched $C_{3-20}$ haloalkyl group such as:

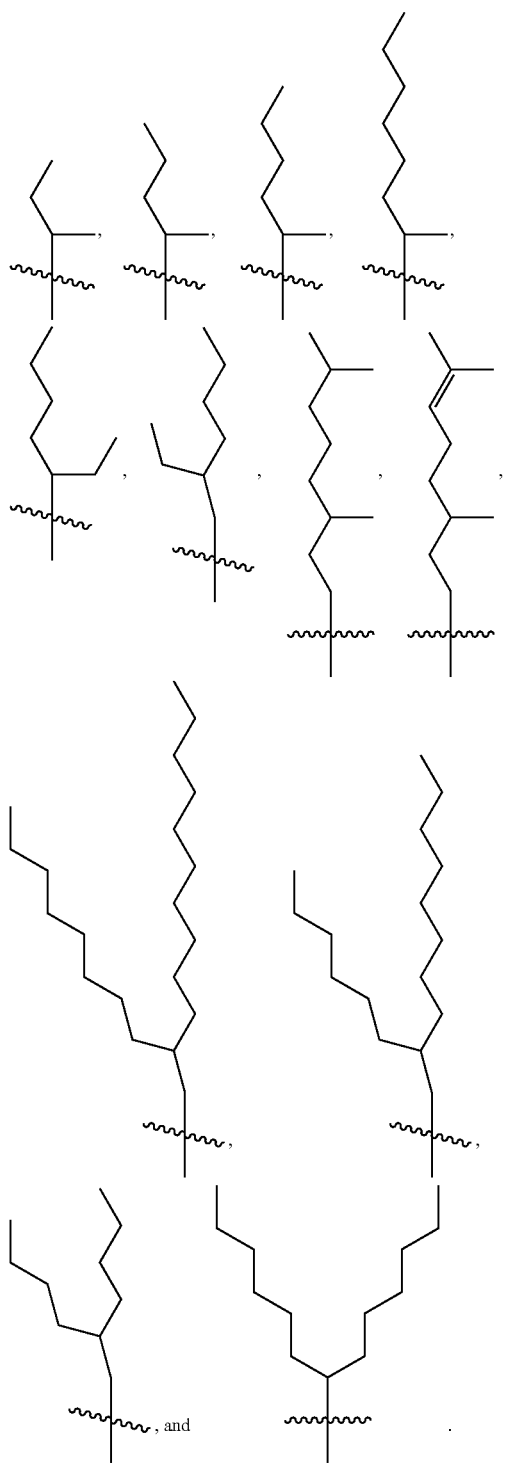

A photoactive component according to the present teachings can be prepared as a blended film deposited from a solution or dispersion containing a mixture of one or more of the present compounds and an acceptor compound such as fullerene (e.g., PCBM) or a polymeric acceptor described herein. The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA). In some embodiments, the polymeric blend can be used together with additional components that are optically active, for example, components that can assist in light harvesting by capturing and transferring excitons to one or both of the electron-donor polymers/electron-acceptor polymers in the blend, and/or optically non-active components to modify and/or improve processing and/or device performance. Such optically non-active components can include alkanethiols (e.g., alkanedithiols) and other α,ω-functionalized alkanes (e.g., diiodoalkanes) as known in the art. See e.g., U.S. Pat. No. 8,227,691.

The blend composition can be deposited on a substrate (e.g., an electrode-substrate) preferably via a solution-phase process, followed by removal of the solvent or mixture of solvents to provide the photoactive layer. By having the blend composition provided as an intimate mixture of the present polymer and an acceptor compound, bulk heterojunctions are created upon removal of the solvent (optionally under reduced pressure and/or elevated temperature), during which nanoscale phase separation of the present donor polymers and the acceptor compound takes place. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, slot-die coating, drop-casting, zone casting, dip coating, blade coating, or spraying. When the film is formed by spin coating, the spin speed can range from about 300 rpm to about 6000 rpm, or from about 500 rpm to about 2000 rpm. Subsequent processing steps can include thermal annealing or irradiation of the deposited film. For example, the blended film can be annealed from about 50° C. to about 300° C., preferably from about 70° C. to about 200° C., more preferably from about 90° C. to about 180° C. for about 1 min to about 20 minutes. The annealing step can be carried out under an inert atmosphere (e.g., under nitrogen). Irradiation of the deposited film can be carried out using infrared light or ultraviolet light. As used herein, "annealing" refers to a post-deposition heat treatment to the semicrystalline polymer film in ambient or under reduced/increased pressure for a time duration of more than 60 seconds, and "annealing temperature" refers to the maximum temperature that the polymer film is exposed to for at least 30 seconds during this process of annealing. The photoactive layer typically can have a thickness ranging from about 30 nm to about 500 nm. In preferred embodiments, the photoactive layer can be a thin film having a thickness of about 80-300 nm.

FIG. 1 illustrates a representative structure of a bulk-heterojunction organic solar cell which can incorporate one or more compounds of the present teachings as the donor material. As shown, a representative solar cell generally includes a substrate 20, an anode 22, a cathode 26, and a photoactive layer 24 between the anode and the cathode that can incorporate one or more compounds of the present teachings as the electron donor (p-channel) material. In some embodiments, an optional smoothing layer can be present between the anode and the photoactive layer.

The substrate can be a solid, rigid or flexible layer designed to provide robustness to the device. In preferred embodiments, the substrate can be transparent or semi-transparent in the spectral region of interest. As used herein, a material is considered "transparent" when it has transmittance over 50%, and a material is considered "semi-transparent" when it has transmittance between about 50% and about 5%. The substrate can comprise any suitable material known in the art such as glass or a flexible plastic (polymer) film.

The first and second electrodes should have different work functions, with the electrode having the higher work function at or above about 4.5 eV (the "high work function electrode") serving as the hole-injecting electrode or anode, and the electrode having the lower work function at or below about 4.3 eV (the "low work function electrode") serving as the electron-injecting electrode. In a traditional OPV device structure, the high work function electrode or anode typically is composed of a transparent conducting metal oxide or metal sulfide such as indium tin oxide (ITO), gallium indium tin oxide (GITO), and zinc indium tin oxide (ZITO), or a thin, transparent layer of gold or silver. The low work function electrode or cathode typically is composed of a low work function metal such as aluminum, indium, calcium, barium, and magnesium. The electrodes can be deposited by thermal vapor deposition, electron beam evaporation, RF or Magnetron sputtering, chemical vapor deposition or the like.

In various embodiments, the solar cell can include one or more optional interface layers ("interlayers") between the anode and the photoactive layer and/or between the cathode and the photoactive layer. For example, in some embodiments, an optional smoothing layer (e.g., a film of 3,4-polyethylenedioxythiophene (PEDOT), or 3,4-polyethylenedioxythiophene:polystyrene-sulfonate (PEDOT:PSS)) can be present between the anode and the photoactive layer. The optional interlayer(s) can perform other functions such as reducing the energy barrier between the photoactive layer and the electrode, forming selective contacts for a single type of carrier (e.g., a hole-blocking layer), modifying the work function of the adjacent electrode, and/or protecting the underlying photoactive layer. In some embodiments, a transition metal oxide layer such as $V_2O_5$, $MoO_3$, $WO_3$ and NiO can be deposited on top of the ITO anode, instead of using PEDOT or PEDOT:PSS as the p-type buffer. To improve device stability via modification of the cathode, an n-type buffer composed of LiF, CsF or similar fluorides can be provided between the cathode and the photoactive layer. Other n-type buffer materials include $TiO_x$, $ZnO_x$ and Cs-doped $TiO_x$. Depending on the composition, the interlayers can be solution-processed (e.g., sol-gel deposition, self-assembled monolayers) or deposited by vacuum processes such as thermal evaporation or sputtering.

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer is composed of an all-polymer blend as described above, and can have a layer thickness of, e.g., about 80 nm to a few μm. Before a counter electrode (cathode) is applied, an electrically insulating transition layer can be applied onto the photoactive layer. This transition layer can be made of an alkali halide, e.g., LiF, and can be vapor-deposited in vacuum. Again, similar to the anode, other similar interlayers can be optionally present between the photoactive layer and the cathode for improving mechanical, chemical, and/or electronic properties of the device.

In certain embodiments, a solar cell according to the present teachings can have an inverted device structure, where a modified ITO film is used as the cathode. For example, the ITO can be modified by n-type metal oxides or metal carbonates such as $TiO_x$, $ZnO_x$, Cs-doped $TiO_x$, and caesium carbonate. In particular embodiments, the inverted OPV can include a solution-processed $ZnO_x$ n-type interface layer as described in Lloyd et al., "Influence of the hole-transport layer on the initial behavior and lifetime of inverted organic photovoltaics," *Solar Energy Materials and Solar Cells*, 95(5): 1382-1388 (2011). Compared with the traditional device structure, inverted-type devices can demonstrate better long-term ambient stability by avoiding the need for the corrosive and hygroscopic hole-transporting PEDOT:PSS and low work function metal cathode. The anode of an inverted OPV cell can be composed of Ag, Au, and the like, with an optional p-type interface layer composed of transition metal oxides such as $V_2O_5$, $MoO_3$, $WO_3$ and NiO.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include

Example 1

Synthesis of N-(Phenyl) BTI Monomer

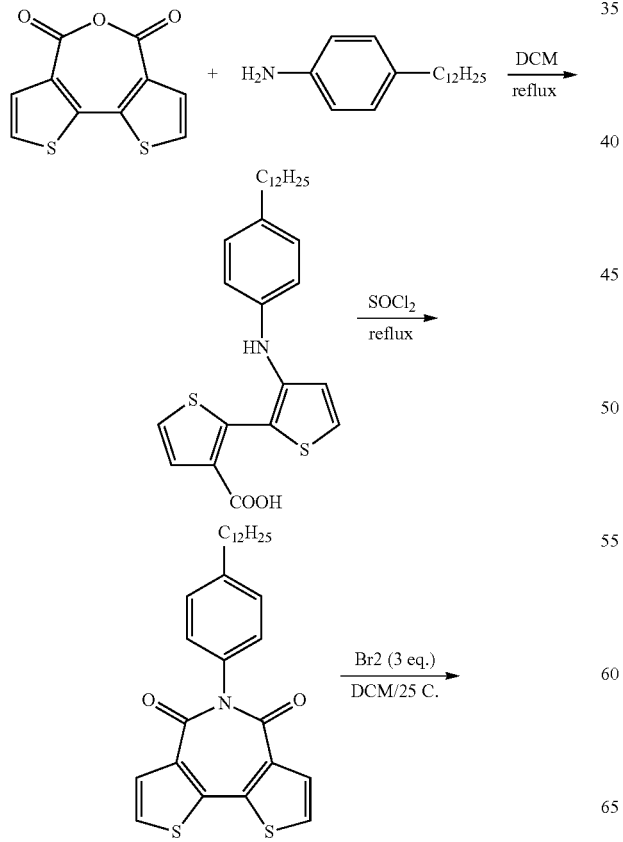

A solution of BTI anhydride (1.0 g, 4.24 mmol) and 4-dodecyl aniline (1.11 g, 4.24 mmol) dissolved in dichloromethane (100 ml) was heated to reflux for 5 hours. The crude product was purified by column chromatography (eluent: 70% ethyl acetate in hexane) to give the acid aniline intermediate (2.0 g; quantitative yield); $^1$H NMR (CDCl$_3$): 7.98 (s, NH), 7.56 (d, 1H), 7.46 (m, 3H), 7.26 (d, 2H), 7.10 (d, 2H), 2.56 (t, 2H), 1.56 (t, 2H), 1.30 (m, 18H), 0.84 (t, 3H). This intermediate was reacted with thionyl chloride (30 mL) at reflux condition for 5 hours. After evaporation of the solvent, the crude product was purified by column chromatography (eluent: 70% DCM in hexane) to give the cyclized BTI product (1.75 g; 85.8% yield). $^1$H NMR (CDCl$_3$): 7.70 (d, 2H), 7.32 (d, 2H), 7.26 (d, 2H), 7.02 (d, 2H), 2.56 (t, 2H), 1.56 (t, 2H), 1.30 (m, 18H), 0.84 (t, 3H).

Bromination of BTI was carried out with Br$_2$. The desired product was obtained at a yield of about 5.8%. $^1$H NMR (CDCl$_3$): 7.64 (s, 2H), 7.30 (d, 2H, 7.02 (d, 2H), 2.56 (t, 2H), 1.56 (t, 2H), 1.30 (m, 18H), 0.84 (t, 3H).

Alternatively, bromination on the bithiophene anhydride intermediate could be carried out first, followed by reaction with 4-dodecyl aniline. BTI anhydride (0.2 g, 0.85 mmol) was dissolved in 15 ml chloroform and 10 ml sulfuric acid and cooled down to 0° C. A solution of bromine (0.41 g, 2.54 mmol) dissolved in 5 ml chloroform was slowly added. After the complete addition the reaction mixture was heated to reflux for 5 hours and then cooled to room temperature. The reaction mixture was washed with aq. Na$_{252}$O$_3$ and saturated aqueous NaHCO$_3$, and then dried over MgSO$_4$, filtered, and concentrated under vacuum.

Example 2

Synthesis of N-(Thienyl) BTI Monomer

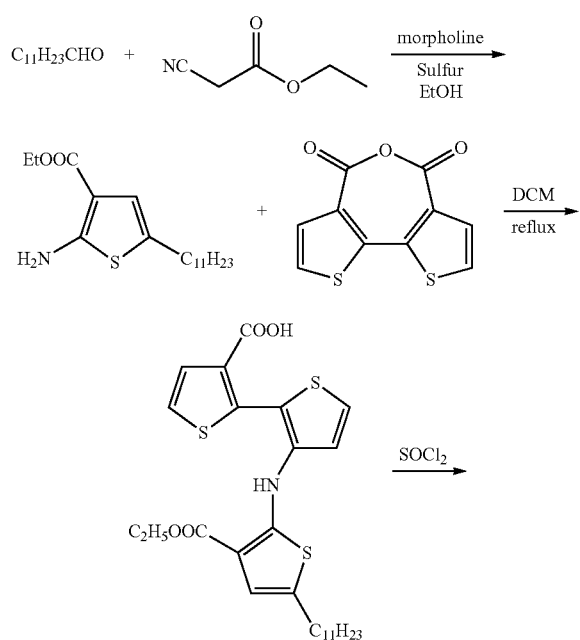

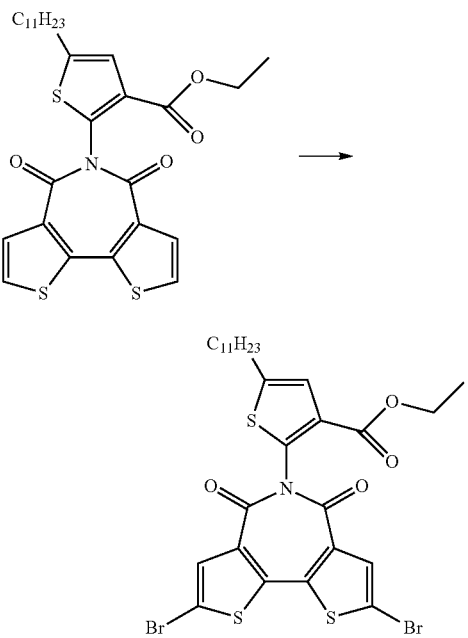

To a mixture of dodecyl aldehyde (0.92 g, 5 mmol), ethyl cyanoacetate (0.57 g; 5 mmol) and sulfur (0.16 g) dispersed in 25 ml ethanol was added morpholine (0.44 g, 5 mmol) at 45° C. over 15 minutes. The reaction mixture was stirred at 45° C. for 5 hours and then at room temperature overnight. Unreacted sulfur was removed from the filtration, washed with ethanol, and then concentrated under vacuum. The crude product was purified by column chromatography (eluent: 70% DCM in hexane) to give the amino thiophene (0.73 g; 45% yield). $^1$H NMR (CDCl$_3$): 6.58 (s, 1H), 4.22 (t, 2H), 2.58 (t, 2H), 1.56 (t, 2H), 1.30 (m, 18H), 0.84 (t, 3H).

A solution of BTI anhydride (0.53 g, 2.24 mmol) and the amino thiophene (0.73 g, 2.24 mmol) dissolved in DCM (80 ml) was heated to reflux for 5 hours. The crude product was purified by column chromatography (eluent: 70% ethyl acetate in hexane) to give the acid aniline intermediate (0.45 g; 37.6% yield). $^1$H NMR (CDCl$_3$): 11.4 (s, 1H), 7.50 (d, 2H), 7.44 (d, 1H), 7.34 (d, 1H), 6.58 (s, 1H), 4.22 (t, 2H), 2.58 (t, 2H), 1.56 (t, 2H), 1.30 (m, 18H), 0.84 (t, 3H). This intermediate was reacted with thionyl chloride (10 mL) at reflux condition for 5 hours.

Example 3

Alternative Synthetic Route for Preparing N-(hetero)aryl-substituted BTI Monomer

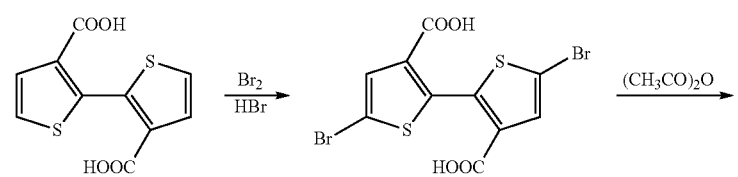

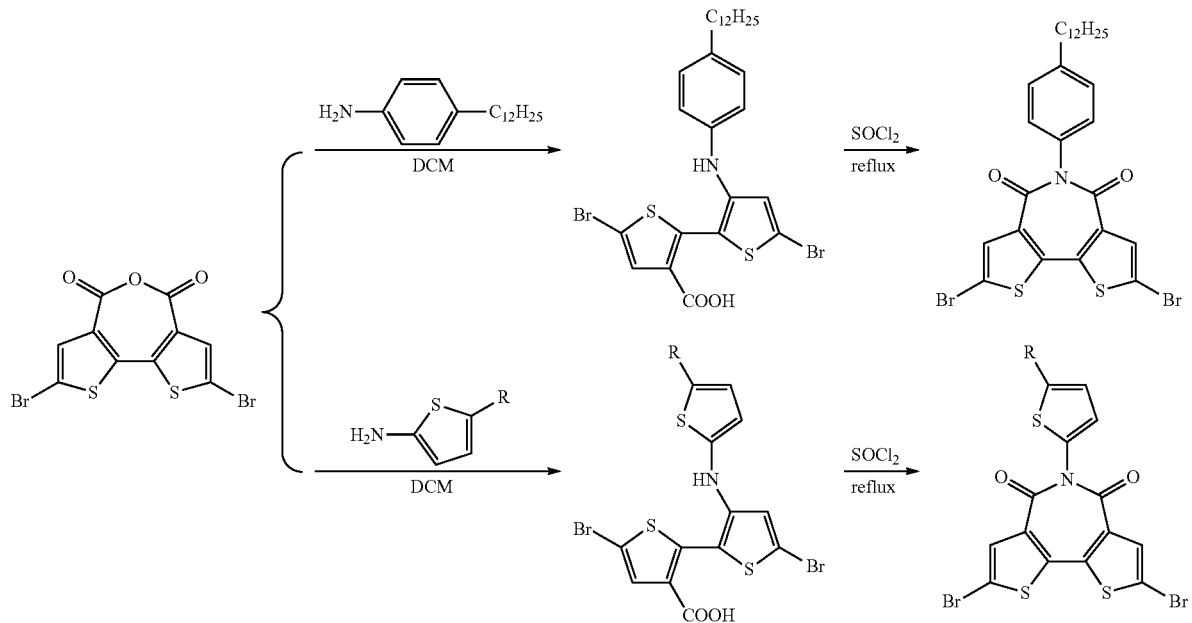

The scheme above describes an alternative synthetic route for preparing N-(hetero)aryl-substituted BTI monomers according to the present teachings.

Example 4

Synthesis of Polymer P1

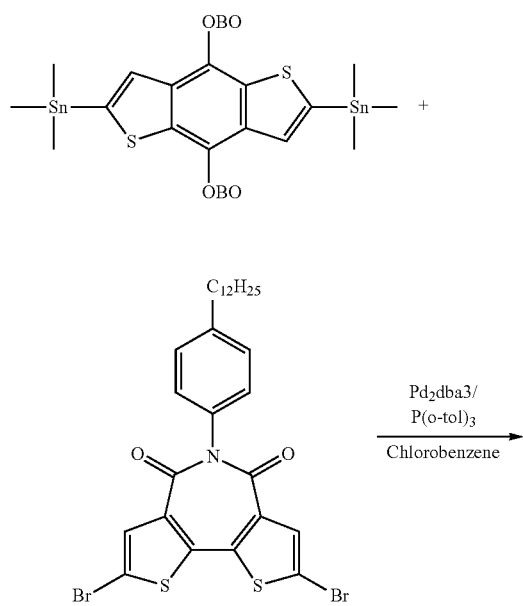

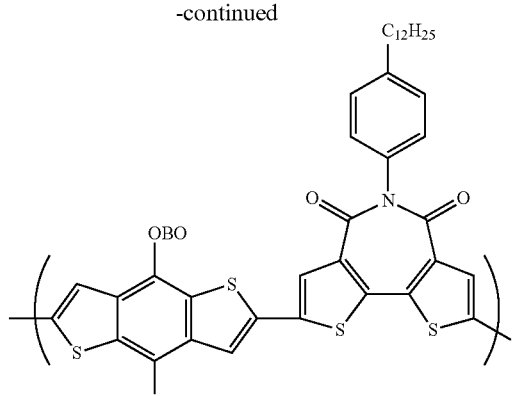

Polymers according to the present teachings can be prepared via Stille coupling reaction using an N-hetero(aryl)-substituted BTI monomer such as the ones described in Examples 1-3 and a donor unit having organotin functional groups as illustrated in this example.

The bistin compound (155 mg, 0.18 mmol), the dibromo BTI compound (112 mg, 0.18 mmol), $Pd_2\ dba_3$ (4%, 7.03× $10^{-6}$ mol, 6.44 mg), and tri-o-tolyphosphine (16%, 2.81×$10^{-5}$ mol, 8.56 mg) were placed in a two-necked flask covered by an aluminum foil to protect it from light and purged with argon three times. After anhydrous chlorobenzene (20 mL) was added to the flask via a syringe, the reaction mixture was then stirred at 130° C. for 18 h. After cooling to 60° C., an aqueous solution of sodium diethylthiocarbamate trihydrate (0.8 g in 20 mL water) was added to the reaction mixture and the mixture was stirred at 90° C. overnight. After the resultant solution was washed with water three times, the organic layer was poured into 200 mL methanol to form a precipitate. The precipitate was subjected to sequential Soxhlet extractions with methanol, ethyl acetate, hexane, dichloromethane, and chloroform. The dichloromethane and chloroform fractions were precipitated again by pouring into methanol and the resultant solids were dried in vacuum.

Example 5

Device Fabrication and Characterization

Conventional OPVs were fabricated on ITO-covered glass that was cleaned by sonication in soap water, water, acetone and isopropanol followed by storage in a glass oven. Immediately before deposition of the hole-injection layer, the substrates were UV ozone treated for 20 minutes in a JELIGHT UVO Cleaner® 42. An 8-nm film of $MoO_3$ was deposited onto the ITO thermally under a vacuum of ~$10^{-6}$ Ton as the hole-injection layer. P1:$C_{70}$PCBM blend active layers at 1:2 ratio by weight were spin cast from chloroform:1,2-dichlorobenzene (9:1 by volume) solutions. To complete the device fabrication, 0.6 nm of LiF and 100 nm of aluminum were successively deposited thermally under vacuum of ~$10^{-6}$ Ton. The active area of the device was ~0.09 $cm^2$. The devices were then encapsulated with a cover glass using EPO-TEK OG112-6 UV curable epoxy (Epoxy Technology) in the glove box.

The photovoltaic characteristics of the encapsulated devices were tested in air. The current density-voltage (J-V) curves were obtained using a Keithley 2400 source-measure unit. The photocurrent was measured under simulated AM1.5G irradiation (100 mW $cm^{-2}$) using a xenon-lamp-based solar simulator (Newport 91160A 300 W Class-A Solar Simulator, 2 inch by 2 inch uniform beam) with air mass 1.5 global filter. The light intensity was set using an NREL calibrated silicon photodiode with a color filter.

Table 1 summarizes the performance of a representative solar cell device.

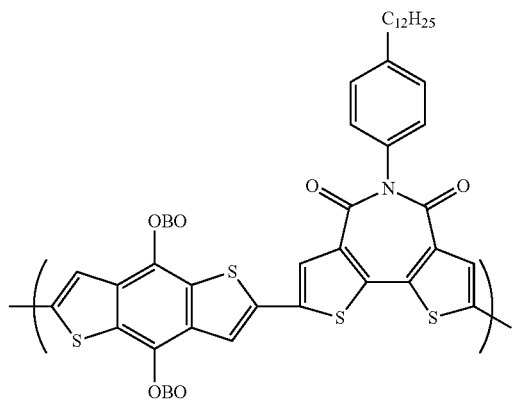

P1

TABLE 1

| Polymer/PCBM | Solvent | $V_{oc}$ (V) | $J_{SC}$ (mA/$cm^2$) | FF (%) | PCE (%) |
|---|---|---|---|---|---|
| P1:$C_{70}$PCBM = [1:2] | CF:DCB:DIO = 90:10:2 | 1.0 | 4.2 | 51.8 | 2.2 |

CF: chloroform; DCB: 1,2-dichlorobenzene; DIO: diiodooctane

Example 6

Preparation of 2,6-bis(trimethylstannyl)-benzo[1,2-b: 4,5-b']dithiophene-4,8-(5-(2-hexyldecyl)-2-thiophenecarboxylic acid) ester

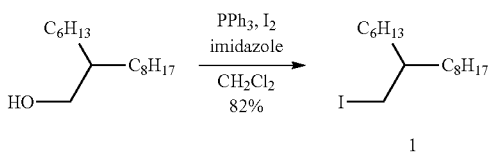

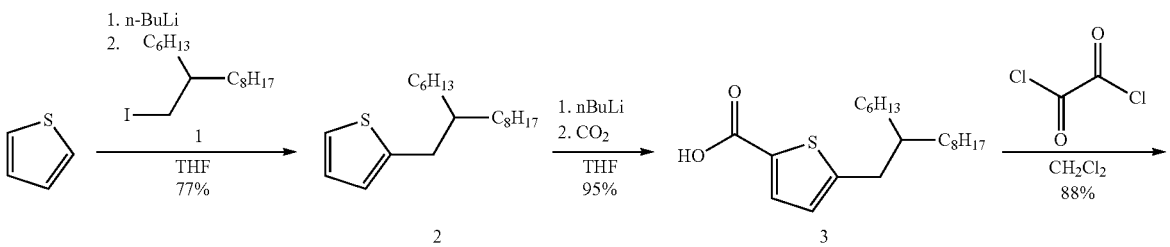

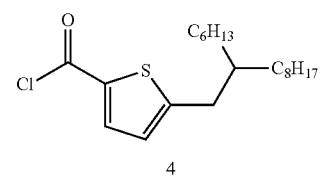

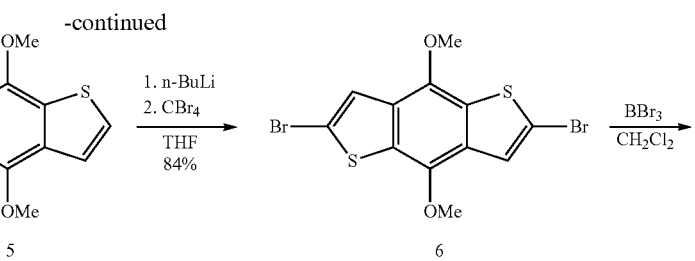

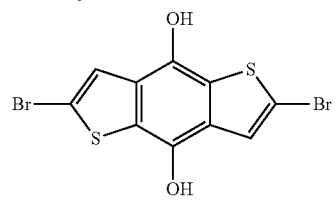

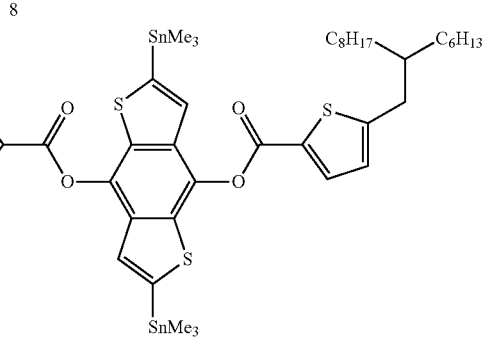

1-Iodo-2-hexyldecane (1): Under air, triphenylphosphine (107.44 g, 410 mmol, 1.19 equiv.) and imidazole (28.9 g, 424 mmol, 1.23 equiv.) were dissolved in dichloromethane (800 mL). 2-Hexyl-1-decanol (100 mL, 345 mmol., 1.00 equiv.) was added to the solution, and the reaction mixture was cooled to 0° C. Iodine (103.6 g, 408 mmol., 1.18 equiv.) was added portion-wise over 1 hour, after which the suspension was stirred at 0° C. for an additional hour, and then at ambient temperature for 18 hours. The mixture was quenched with saturated aqueous $Na_2SO_3$ (150 mL), and DCM was removed in vacuo. Hexane (200 mL) was added to the residue, and the mixture was filtered to remove salts that had precipitated. The organic material was extracted with hexanes (3×300 mL), dried over $Na_2SO_4$, filtered through a pad of silica gel, and then concentrated in vacuo to give a clear, colorless oil (97.8 g, 82% yield). $^1$H NMR (500 MHz, $CDCl_3$) δ 3.28 (d, J=4.6 Hz, 2H), 1.34-1.19 (m, 24H), 1.12 (b, 1H), 0.91-0.87 (m, 6H).

2-(2-Hexyldecyl)thiophene (2)

A solution of thiophene (46.4 g, 551 mmol., 2.50 equiv.) and THF (300 mL) was cooled to −78° C. n-Butyllithium (2.5

M in hexanes, 212 mL, 528 mmol., 2.40 equiv.) was added over 1 hour. The mixture was stirred for an additional 30 minutes at −78° C. before a solution of 1-iodo-2-hexyldecane (90.0 g, 220 mmol., 1.00 equiv) in THF (200 mL) was added slowly over 1 hour. After stirring for 1 hour at −78° C., the reaction mixture was warmed to ambient temperature and stirred for 18 hours. Water (200 mL) was added and the organic material was extracted with $Et_2O$ (3×250 mL), washed with additional water, dried over $Na_2SO_4$, filtered, and concentrated in vacuo. The resulting brown residue was purified by silica gel column chromatography (hexanes) to give a pale yellow oil (52.03 g, 77% yield). $^1$H NMR (500 MHz, $CDCl_3$) δ 7.12 (dd, J=5.2, 1.2 Hz, 1H), 6.92 (m, 1H), 6.76 (dd, J=3.4, 0.9 Hz, 1H), 2.76 (d, J=6.7, 2H), 1.62 (b, 1H), 1.33-1.21 (m, 24H), 0.91-0.87 (m, 6H).

5-(2-Hexyldecyl)-2-thiophenecarboxylic acid (3)

2-(2-Hexyldecyl)thiophene (1.00 g, 3.24 mmol., 1.00 equiv.) and THF (24 mL) were added to a 50 mL schlenk flask. The solution was cooled to 0° C. n-Butyllithium (2.5 M in hexanes, 1.36 mL, 1.05 equiv.) was then added over 2 minutes. The solution was stirred for 1 hour at 0° C., then the ice/water bath was removed and the solution was stirred for 20 minutes at ambient. The solution was cooled back to 0° C. and carbon dioxide (obtained by subliming dry ice submerged in THF in a separate flask placed in a 25° C. heat bath) was bubbled through the solution for 30 minutes. The solution was diluted with 1 N hydrochloric acid (50 mL) and EtOAc (50 mL). The organic layer was washed with brine, dried with $MgSO_4$, and concentrated. Purification by silica gel column chromatography (4:1 hexanes-EtOAc, 2% AcOH) gave a colorless liquid (1.086 g, 95% yield). $^1$H NMR (500 MHz, $CDCl_3$) δ 7.74 (d, J=3.8 Hz, 1H), 6.80 (d, J=3.8 Hz, 1H), 2.79 (d, J=6.8, 2H), 1.67 (b, 1H), 1.34-1.21 (m, 24H), 0.91-0.87 (m, 6H).

5-(2-Hexyldecyl)-2-thiophenecarbonyl chloride (4)

5-(2-Hexyldecyl)-2-thiophenecarboxylic acid (1.00 g, 2.84 mmol., 1.00 equiv.) and $CH_2Cl_2$ (5 mL) were added to a 10 mL schlenk flask. The solution was cooled to 0° C. Oxalyl chloride (0.60 mL, 6.5 mmol, 2.3 equiv.) was then added. The ice/water bath was left in place and the solution was stirred for 64 hours while warming to room temperature. The reaction mixture was concentrated to a clear brown liquid (931 mg, 88% yield). $^1$H NMR (400 MHz, $CDCl_3$) δ 7.84 (d, J=3.9 Hz, 1H), 6.87 (d, J=3.8 Hz, 1H), 2.81 (d, J=6.7, 2H), 1.68 (b, 1H), 1.34-1.19 (m, 24H), 0.93-0.85 (m, 6H).

4,8-Dimethoxy-benzo[1,2-b:4,5-b']dithiophene (5)

Benzo[1,2-b:4,5-b']dithiophene-4,8-dione (7.50 g, 34.0 mmol., 1.00 equiv.), ethanol (45 mL) and water (45 mL) were added to a 250 mL 2-neck round-bottom flask fitted with a reflux condenser. $NaBH_4$ (3.89 g, 102 mmol., 3.00 equiv.) was then added portion-wise cautiously. The reaction mixture was heated to reflux for 1 hour. The flask was removed from the heat bath and potassium hydroxide (4.39 g, 78.2 mmol., 2.30 equiv.) was added slowly to the reaction mixture with vigorous stirring. The suspension was stirred at reflux for 30 minutes before adding dimethyl sulfate (16 mL, 170 mmol., 5.0 equiv.), and the suspension was refluxed for 64 hours. The reaction mixture was cooled to room temperature and diluted with water (75 mL) and diethyl ether (500 mL) and more water (300 mL). The organic layer was washed with brine (200 mL), dried with $MgSO_4$ and concentrated. The crude material was purified by silica gel column chromatography (solid loading, gradient of 1:1 to 1:2 hexanes-dichloromethane) to give a white solid (5.314 g, 62% yield). $^1$H NMR (400 MHz, $CDCl_3$) δ 7.52 (d, J=5.5 Hz, 2H), 7.41 (d, J=5.5 Hz, 2H), 2.81 (d, J=6.7, 2H), 4.15 (s, 6H).

2,6-Dibromo-4,8-dimethoxy-benzo[1,2-b:4,5-b'] dithiophene (6)

4,8-Dimethoxy-benzo[1,2-b:4,5-b']dithiophene (1.00 g, 3.99 mmol., 1.00 equiv.) and THF (44 mL) were added to a 100 mL schlenk flask and the mixture was cooled to −78° C. n-Butyllithium (2.5 M in hexanes, 3.5 mL, 8.8 mmol., 2.2 equiv.) was then added and the mixture was stirred at −78° C. for 15 minutes before removing the dry ice/acetone bath and stirring at ambient for 30 minutes. The suspension was cooled to −78° C. and carbon tetrabromide (3.18 g, 9.59 mmol., 2.40 equiv.) was added. The dry ice/acetone bath was removed and the mixture was stirred at ambient for 1 hour. Water and dichloromethane were added (brine was also added to break emulsion) and the aqueous layer was extracted with dichloromethane. The organic layer was washed with brine, dried with $MgSO_4$ and concentrated. The crude material was purified by silica gel column chromatography (solid loading, 1:1 dichloromethane-hexane) and trituration in hexanes to give a beige crystalline solid (1.368 g, 84% yield). $^1$H NMR (400 MHz, $CDCl_3$) δ 7.48 (s, 2H), 4.07 (s, 6H).

2,6-Dibromo-benzo[1,2-b:4,5-b']dithiophene-4,8-diol (7)

2,6-Dibromo-4,8-dimethoxy-benzo[1,2-b:4,5-b'] dithiophene (500 mg, 1.22 mmol., 1.00 equiv.) and dichloromethane (12 mL) were added to a 50 mL schlenk flask. The mixture was cooled to −78° C. and boron tribromide was added (1.0 M solution in dichloromethane, 2.5 mL, 2.5 mmol., 2.1 equiv.) slowly. The mixture was stirred for 15 minutes at −78° C. before replacing the dry/ice acetone bath with an ice/water bath. The reaction mixture was left to warm to room temperature while stirring for 16 hours before cooling to 0° C. Water (dropwise at first, 150 mL total) and additional dichloromethane (50 mL) were added. The dichloromethane was removed on the rotary evaporator and the solid was collected by filtration. The solid was washed with water (25 mL) and dichloromethane (25 ml) to give a pale blue/green crude solid to be dried under vacuum and used in the next step without additional purification (287 mg). $^1$H NMR (400 MHz, $CDCl_3$) δ 10.13 (s, 2H), 7.71 (s, 2H).

2,6-Dibromo-benzo[1,2-b:4,5-b]dithiophene-4,8-(5-(2-hexyldecyl)-2-thiophenecarboxylic acid) ester (8)

2,6-Dibromo-benzo[1,2-b:4,5-b']dithiophene-4,8-diol (150 mg, 0.395 mmol., 1.00 equiv.), dichloromethane (6 mL) and triethylamine (0.22 mL, 1.6 mmol, 4.0 equiv.) were added to a 25 mL 2-neck round-bottom flask fitted with a reflux condenser. A solution of 5-(2-hexyldecyl)-2-thiophenecarbonyl chloride in dichloromethane (2 mL) was then added. The flask was placed in a 45° C. heat bath and the reaction mixture was stirred at reflux for 16 hours before cooling to room temperature, diluting with dichloromethane (60 mL) and washing with water (60 mL). The organic layer was dried with $MgSO_4$ and concentrated. The crude material was purified by silica gel column chromatography (solid loading, 1:1 dichloromethane-hexanes) to give a white solid (266 mg, 40% yield over two steps). m.p. 76° C. $^1$H NMR (400 MHz, $CDCl_3$) δ 7.95 (d, J=3.7 Hz, 2H), 7.32 (s, 2H), 6.93 (d, J=3.6 Hz, 2H), 2.87 (d, J=6.6, 4H), 1.74 (b, 2H), 1.40-1.21 (m, 48H), 0.94-0.85 (m, 12H). Anal. calcd. for ($C_{52}H_{72}O_4S_4$): C, 59.53; H, 6.92. Found: C, 59.46; H, 6.80.

2,6-Bis(trimethylstannyl)-benzo[1,2-b:4,5-b']dithiophene-4,8-(5-(2-hexyldecyl)-2 thiophenecarboxylic acid) ester (9)

2,6-Dibromo-benzo[1,2-b:4,5-b']dithiophene-4,8-(5-(2-hexyldecyl)-2-thiophenecarboxylic acid) ester (150 mg, 0.143 mmol., 1.00 equiv.) and THF (7 mL) were added to a 50 mL schlenk tube. The solution was cooled to −78° C. and n-butyllithium (2.5 M in hexanes, 126 µL, 0.315 mmol., 2.2 equiv.) was added over 2 minutes. The mixture was stirred at −78° C. for 1 hour before adding trimethyltin chloride (68 mg, 0.343 mmol., 2.40 equiv.). The dry ice/acetone bath was removed and the reaction was stirred at ambient for 2 hours before diluting with water (30 mL) and diethyl ether (50 mL). The organic layer was washed with water (30 mL) and brine (30 mL), dried with MgSO$_4$ and concentrated to a yellow crude oil (101 mg), which was used in the polymerization step without further purification. $^1$H NMR (400 MHz, CDCl$_3$) δ 7.99 (d, J=3.7 Hz, 2H), 7.34 (s, 2H), 6.93 (d, J=3.6 Hz, 2H), 2.88 (d, J=6.4, 4H), 1.75 (b, 2H), 1.40-1.20 (m, 48H), 0.93-0.85 (m, 12H), 0.48-0.32 (m, 18H).

Example 7

Preparation of Chlorinated Repeating Units

Chlorinated repeating units can be prepared according to the schemes below.

a) Repeating units comprising 3- or 4-chlorinated thienyl groups:

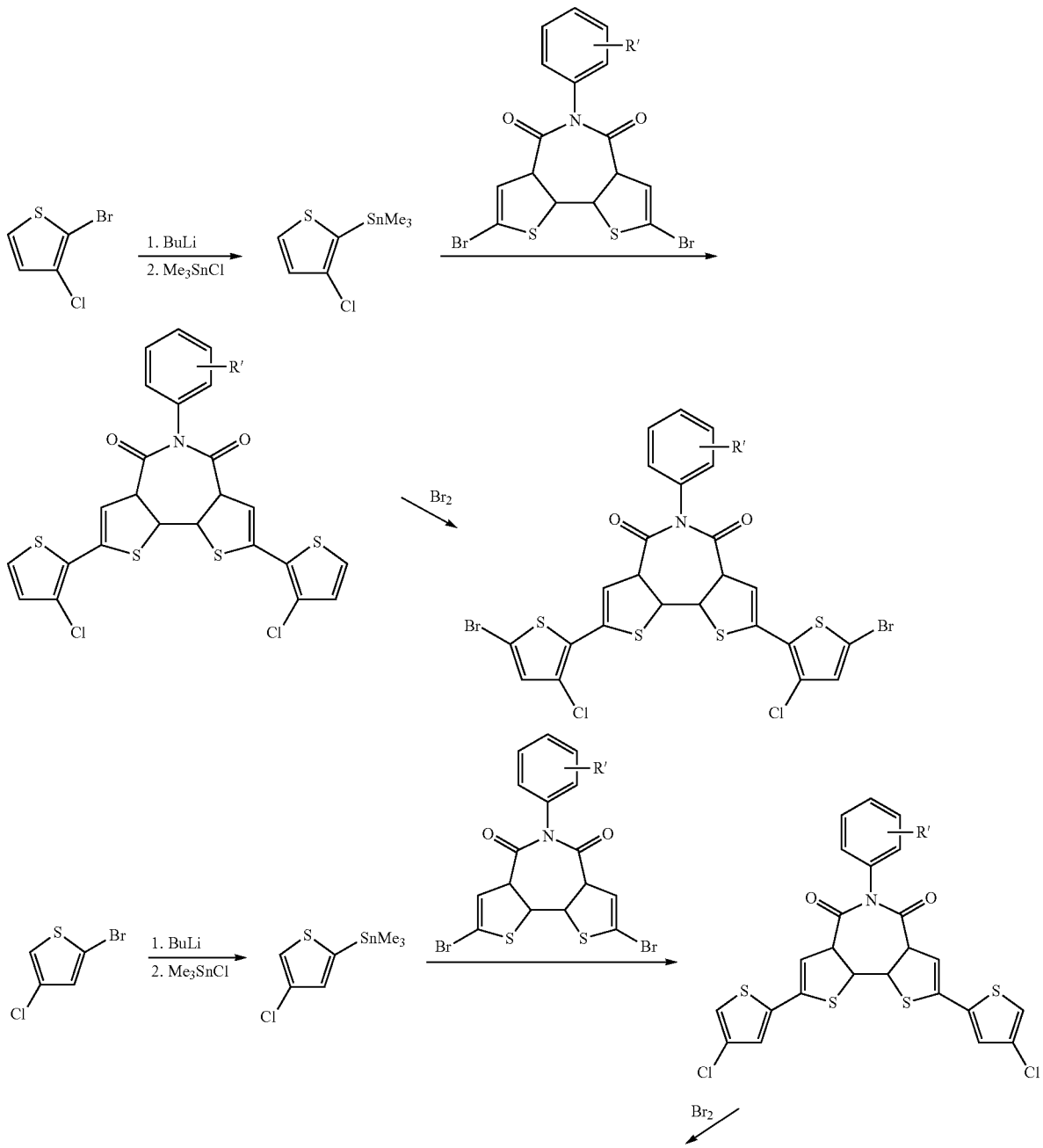

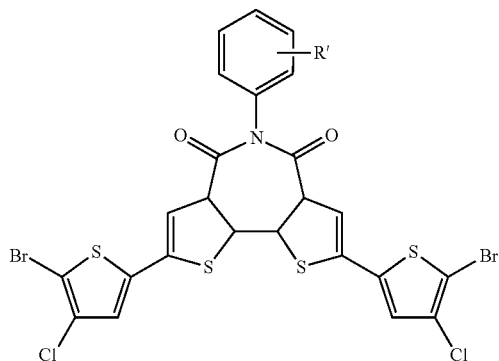
b) Repeating units comprising 3,7-dichlorinated benzo[1,2-b:4,5-b']dithienyl groups:
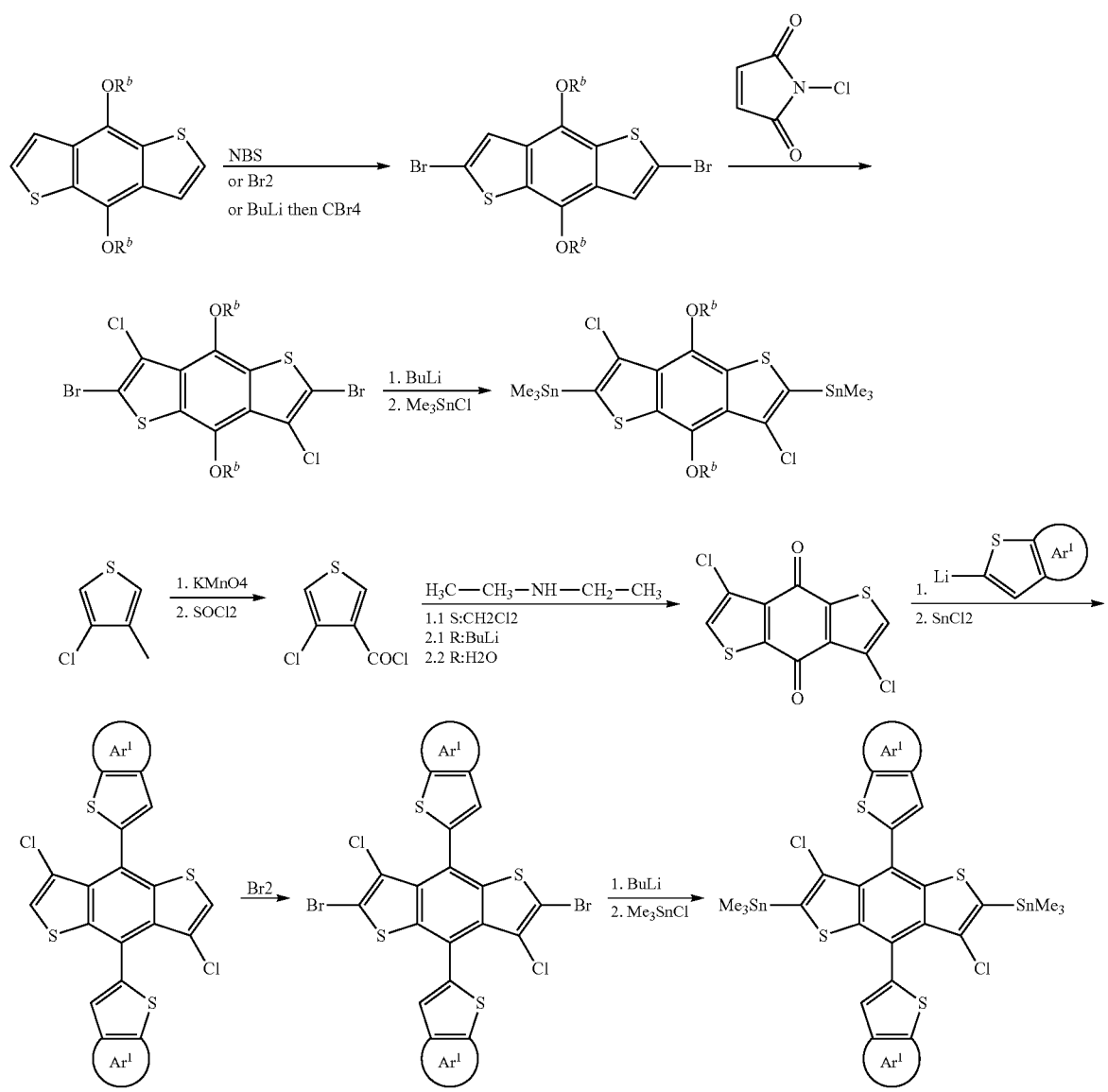

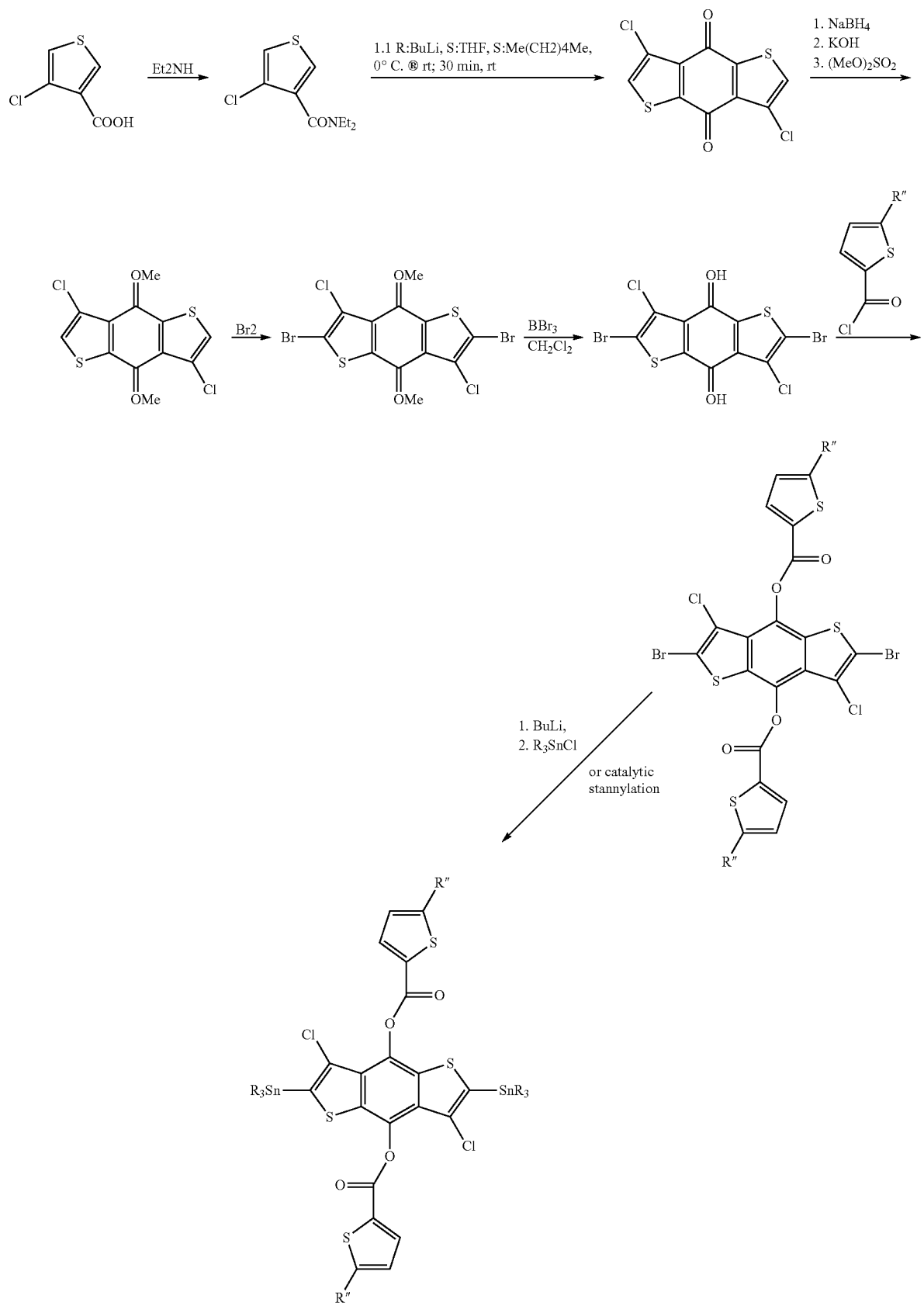

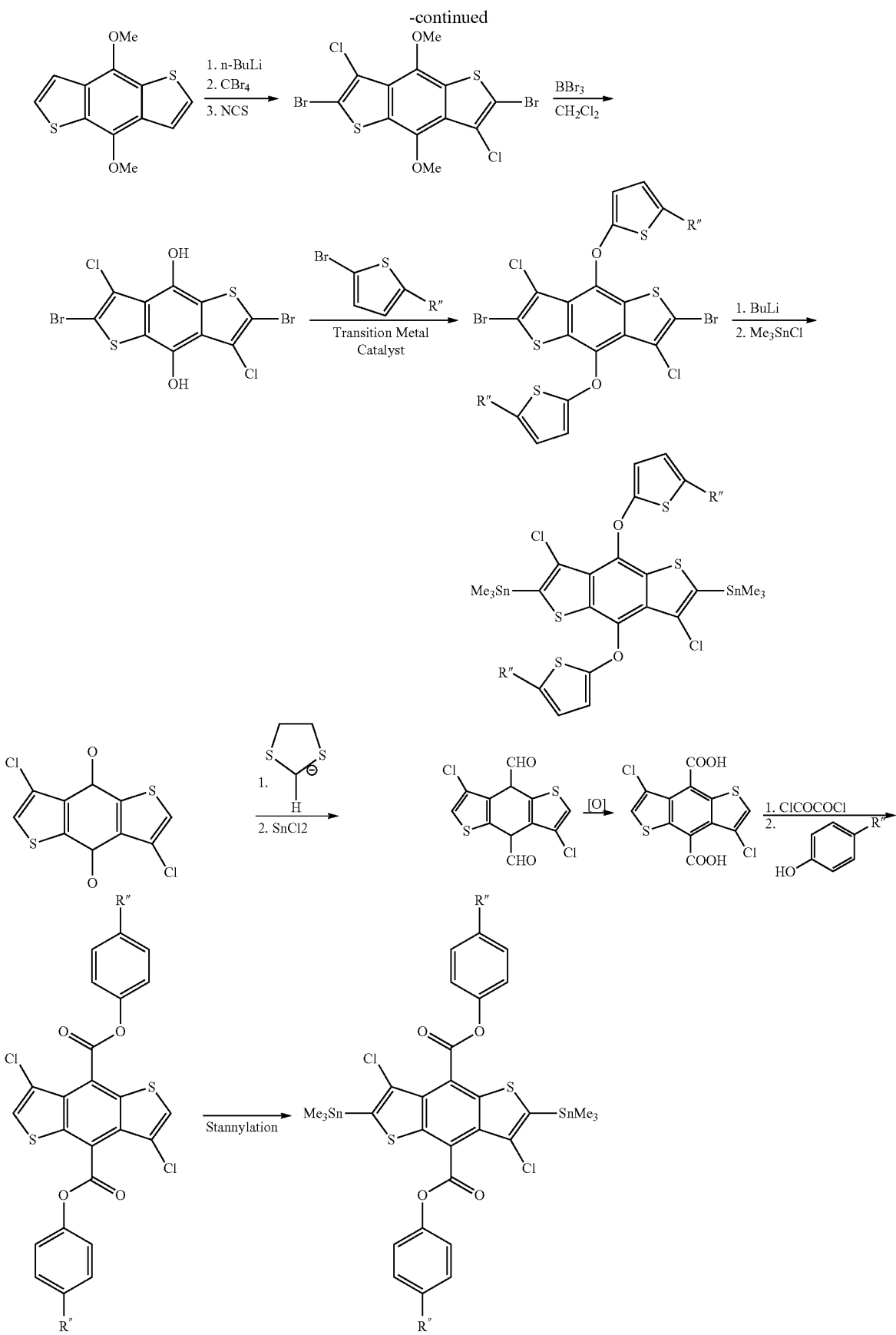

See, e.g., Maguire et al., *J. Med. Chem.*, 37: 2129-2137 (1994) for stannylation of chloro-containing thiophenes, and Lei et al., *Chem. Sci.* DOI: 10.1039/c3sc50245g (2013) for chlorination of bromo-containing aromatics.

Example 8

Preparation of Additional 4,8-bis-substituted-2,6-bis-trimethylstannanyl-1,5-dithia-s-indacenes

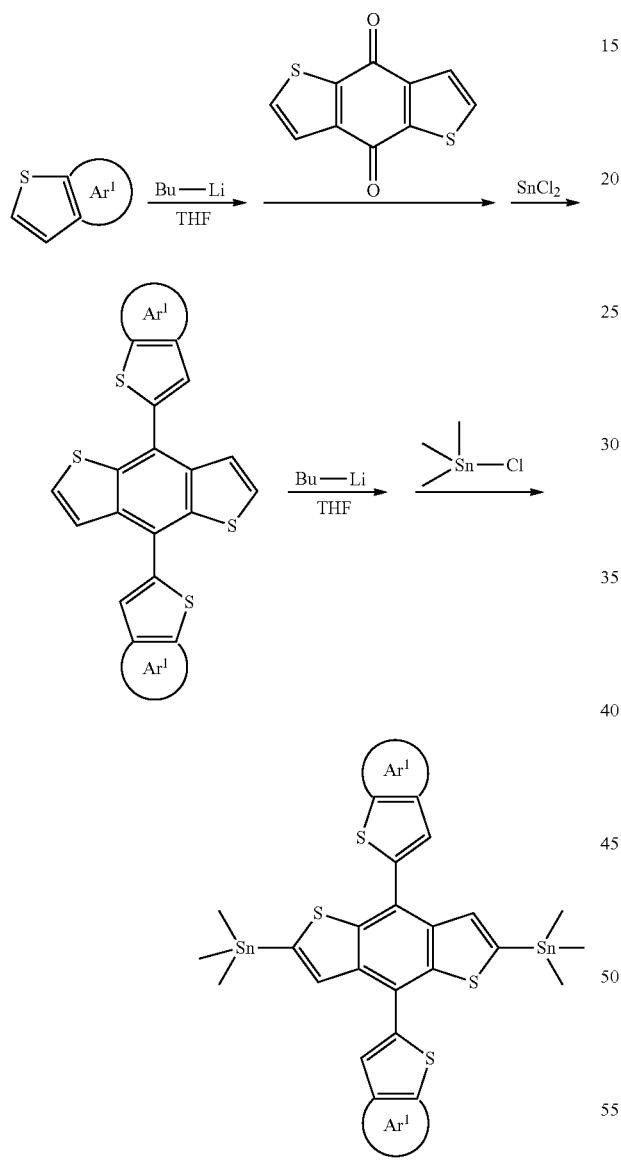

Various embodiments of repeating units ($M^{1a}$) can be prepared as follows. Briefly, an appropriate thieno-fused starting compound can be reacted with n-butyl lithium in THF at room temperature for about 1-1.5 hours before 1,5-dithia-s-indacene-4,8-dione is added. The mixture then can be heated at about 50-60° C. for 1-2 hours before cooling to room temperature. This is followed by the addition of a solution of $SnCl_2$ in $HCl/H_2O$, which is heated at about 50-60° C. for about 1-3 hours before cooling to room temperature. To functionalize the repeating unit ($M^{1a}$) with trimethylstannanyl groups, n-butyl lithium again is added (room temperature, about 2 hours), before trimethyltin chloride is added in portions (room temperature).

Example 9

Synthesis of Various Thieno-Fused Starting Compounds

Example 9A

Preparation of naphthothiophene

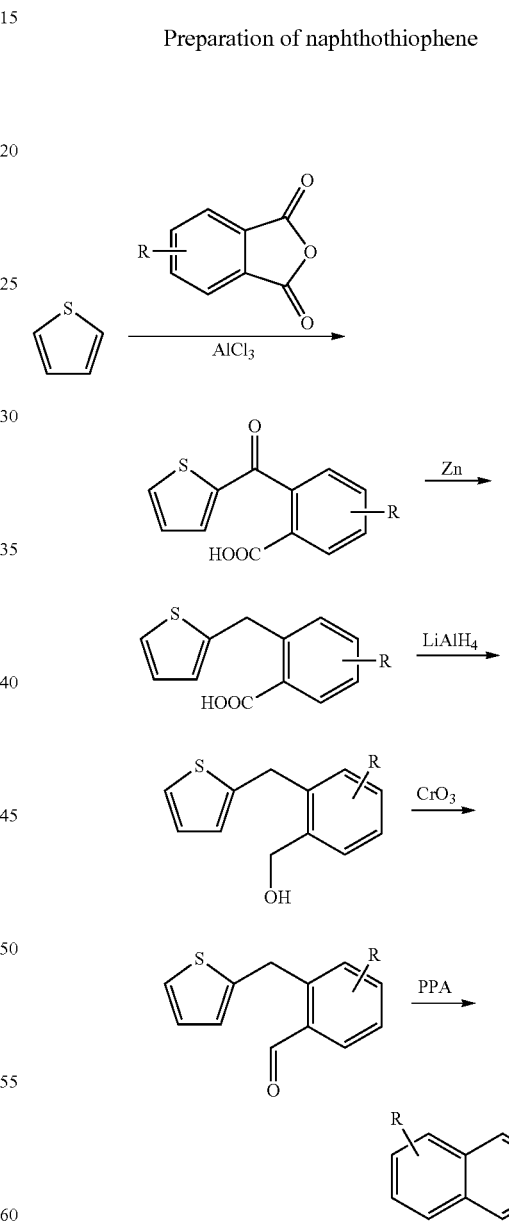

Both substituted and unsubstituted naphthothiophenes can be prepared from an appropriate phthalic anhydride using the synthetic route described in JP2010053094 (reproduced above), the entire disclosure of which is incorporated by reference herein.

Example 9B
Preparation of benzodithiophene
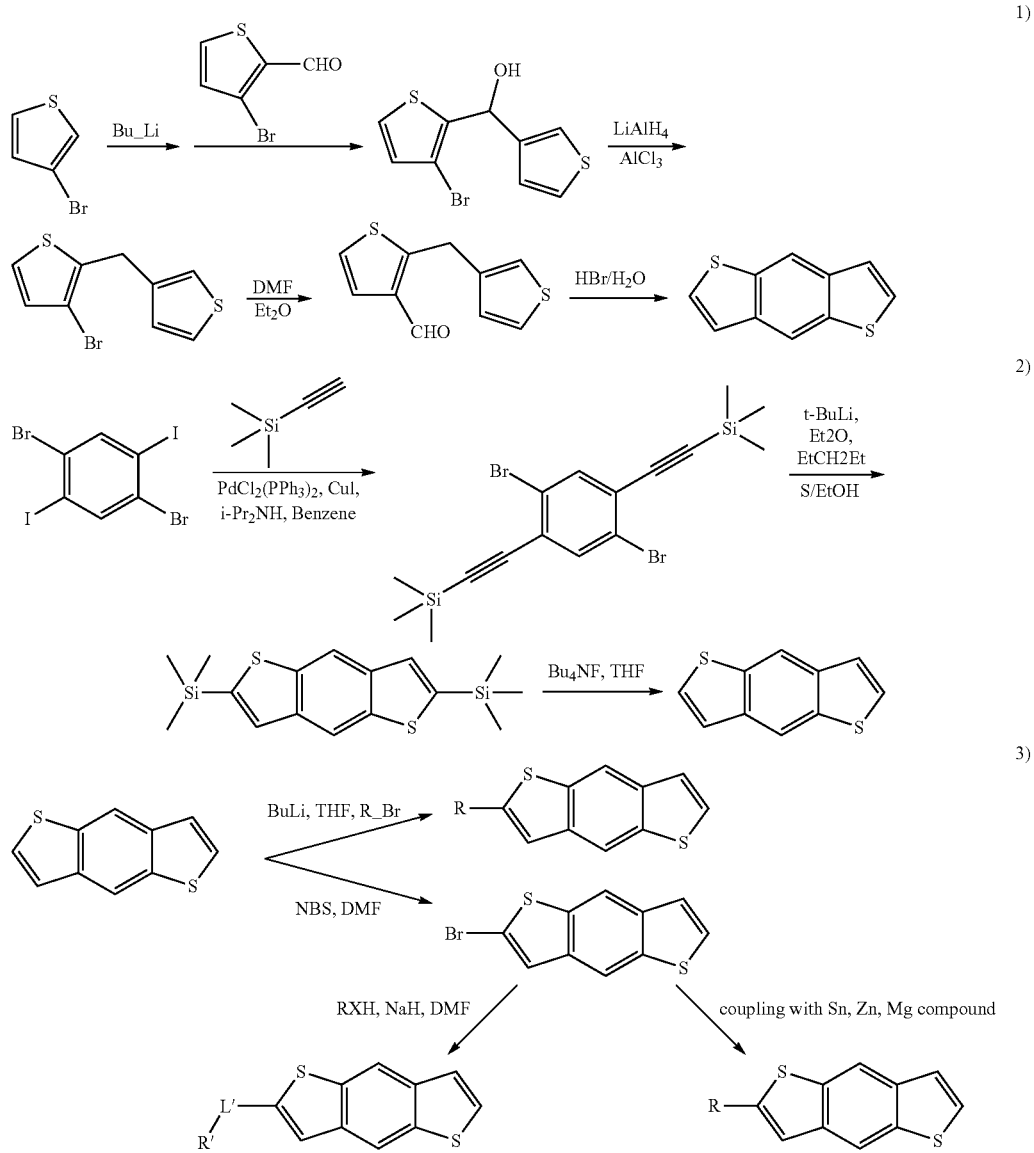
Substituted and unsubstituted benzodithiophenes can be prepared via the synthetic routes provided above.
Example 9C
Preparation of benzothienothiophene
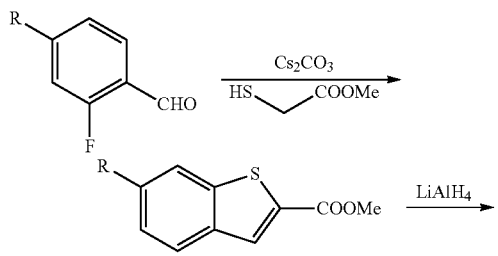
-continued
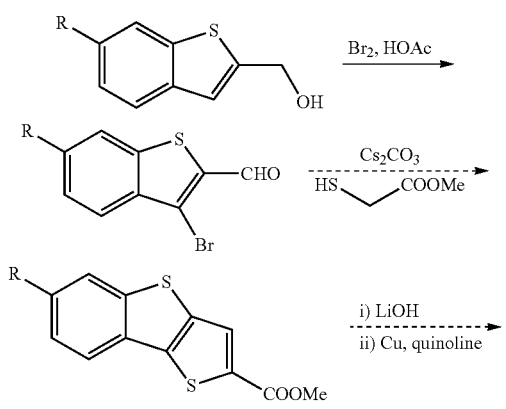

87

-continued

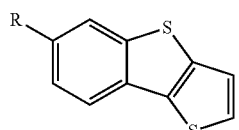

Various benzothienothiophenes can be prepared using the synthetic route described above.

Example 9D

Preparation of Dithienothiophene

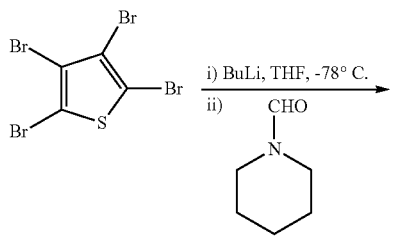

(a)

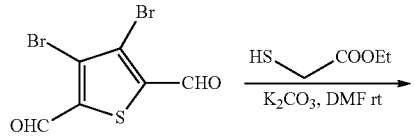

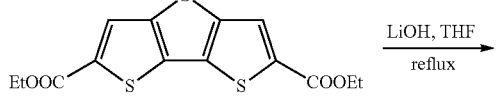

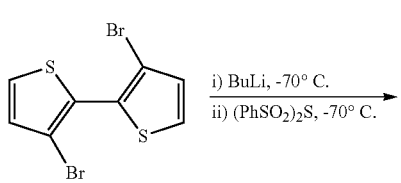

(b)

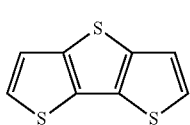

88

-continued

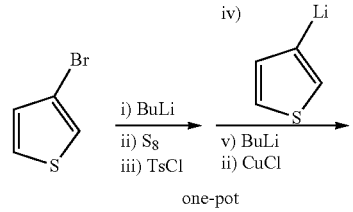

(c)

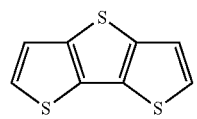

Unsubstituted dithienothiophenes can be prepared via synthetic route (a), (b) or (c) as described, respectively, in *Chem. Commun.* 2002, 2424; *J. Mater. Chem.* 2003, 13, 1324; and *Chem. Commun.* 2009, 1846, the entire disclosure of each of which is incorporated by reference herein.

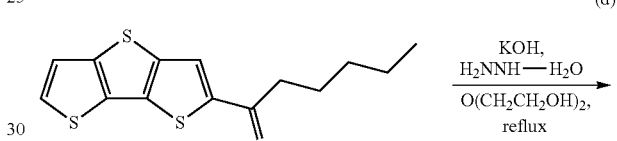

(d)

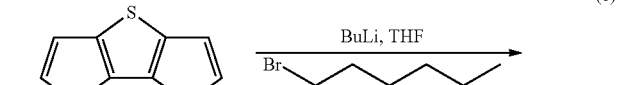

(e)

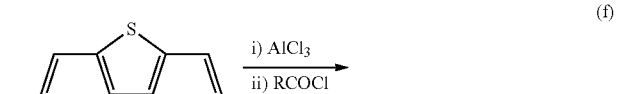

(f)

Substituted dithienothiophenes can be prepared via synthetic route (d), (e) or (f) as described, respectively, in *J. Mater. Chem.* 2007, 17, 4972; *Chem. Mater.* 2007, 19, 4925; and *Syn. Met.* 1999, 987, the entire disclosure of each of which is incorporated by reference herein.

Example 9E

Preparation of Thienothiophene

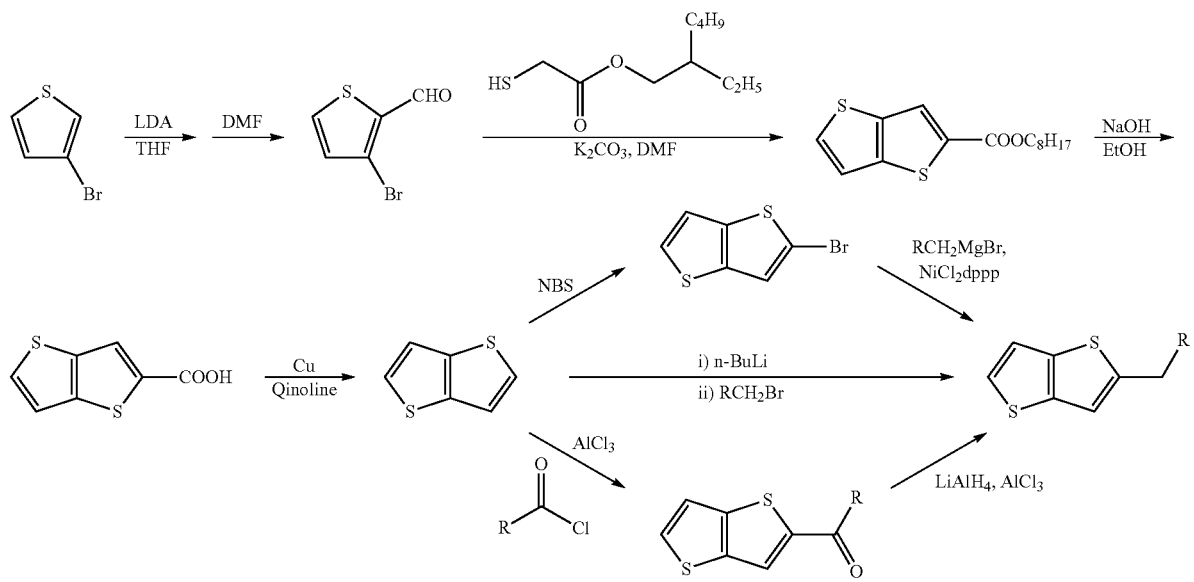

Substituted thienothiophenes can be prepared using the synthetic route described above.

Example 9F

Preparation of Benzothiophene

Substituted benzothiophenes can be prepared using the synthetic routes described below.

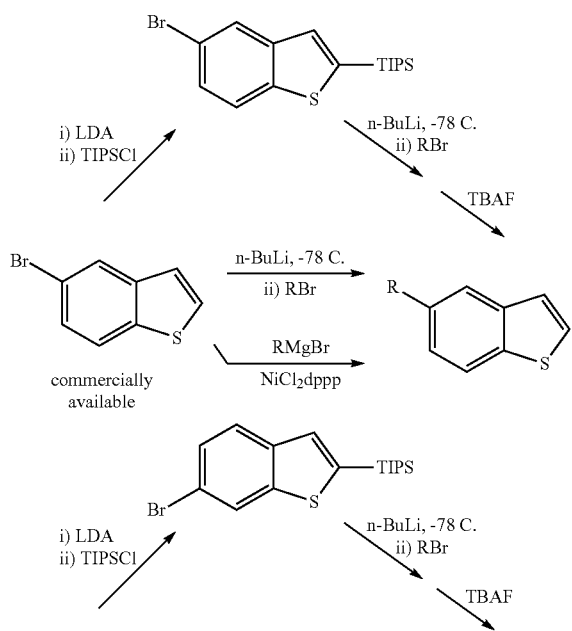

-continued

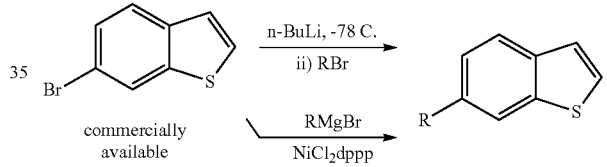

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A polymer comprising an electron-acceptor unit (A) and an electron-donor unit (D), wherein the electron-acceptor unit (A) comprises a bithiopheneimide moiety represented by the formula:

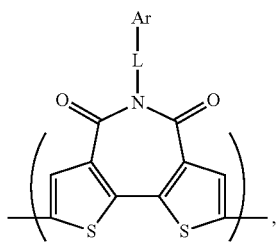

wherein:

L is selected from the group consisting of —O—, —S—, —Se—, —OC(O)—, —C(O)O—, a divalent $C_{1-20}$ alkyl group, a divalent $C_{1-20}$ haloalkyl group, and a covalent bond; and Ar is a $C_{6-20}$ aryl or 5-20 membered heteroaryl group substituted with 1-5 $R^a$ groups, wherein $R^a$, at each occurrence, independently is selected from the group consisting of a halogen —CN, and L'R', wherein L', at each occurrence, is selected from —O—, —S—, —Se—, —C(O)—, —OC(O)—, —C(O)O—, and a covalent bond, and R', at each occurrence, independently is selected from the group consisting of a $C_{1-40}$ alkyl group, a $C_{2-40}$ alkenyl group, a $C_{2-40}$ alkenyl group, and a $C_{1-40}$ haloalkyl group; provided that at least one of the $R^a$ groups substituted on the $C_{6-20}$ aryl or 5-20 membered heteroaryl group is a linear or branched $C_{6-40}$ alkyl group; and wherein the polymer has a degree of polymerization in the range of 2 to 10,000.

2. The polymer of claim 1, wherein Ar is selected from the group consisting of a phenyl group, a thienyl group, a thiazolyl group, an isothiazolyl group, a thiadiazolyl group, a furyl group, an oxazolyl group, an isoxazolyl group, an oxadiazolyl group, a pyrrolyl group, a triazolyl group, a tetrazolyl group, a pyrazolyl group, an imidazolyl group, a pyridyl group, a pyrimidyl group, a pyridazinyl group, and a pyrazinyl group, each of which is substituted with 1-5 $R^a$ groups, wherein $R^a$, at each occurrence, independently is selected from a halogen, —CN, and L'R', wherein L', at each occurrence, is selected from —O—, —S—, —Se—, —C(O)—, —OC(O)—, —C(O)O—, and a covalent bond, and R', at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group provided that at least one of the $R^a$ groups substituted on the $C_{6-20}$ aryl or 5-20 membered heteroaryl group is a linear or branched $C_{6-40}$ alkyl group.

3. The polymer of claim 1, wherein the bithiopheneimide moiety has the formula:

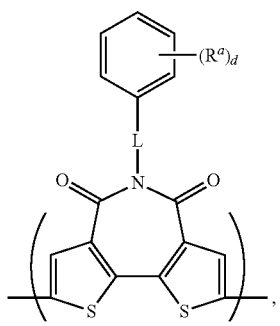

wherein $R^a$, at each occurrence, independently is selected from the group consisting of a halogen, —CN, and L'R', wherein L', at each occurrence, is selected from —O—, —S—, —Se—, —C(O)—, —OC(O)—, —C(O)O—, and a covalent bond; and R', at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group; d is 1, 2, 3, 4 or 5; provided that at least one of the $R^a$ groups substituted on the phenyl group is a linear or branched $C_{6-40}$ alkyl group; and L is as defined in claim 1.

4. The polymer of claim 1, wherein the bithiopheneimide moiety has the formula:

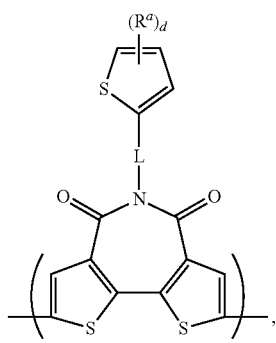

wherein $R^a$, at each occurrence, independently is selected from the group consisting of a halogen, —CN, and L'R', wherein L', at each occurrence, is selected from —O—, —S—, —Se—, —C(O)—, —OC(O)—, —C(O)O—, and a covalent bond; and R', at each occurrence, independently is selected from the group consisting of a $C_{1-40}$ alkyl group, a $C_{2-40}$ alkenyl group, a $C_{2-40}$ alkynyl group, and a $C_{1-40}$ haloalkyl group; d is 1, 2 or 3; provided that at least one of the $R^a$ groups substituted on the thienyl group is a linear or branched $C_{6-40}$ alkyl group; and L is as defined in claim 1.

5. The polymer of claim 1, wherein the bithiopheneimide moiety has the formula:

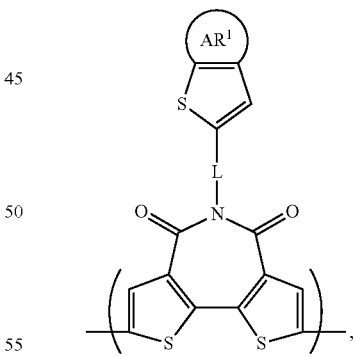

wherein the moiety

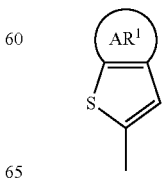

is selected from:

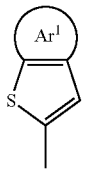

wherein 1-5 of the carbon ring atoms of the moiety

is substituted with a halogen, —CN, or L'R', wherein L', at each occurrence, is selected from —O—, —S—, —Se—, —C(O)—, —OC(O)—, —C(O)O—, and a covalent bond, and R', at each occurrence, independently is selected from the group consisting of a $C_{1-40}$ alkyl group, a $C_{2-40}$ alkenyl group, a $C_{2-40}$ alkenyl group, and a $C_{1-40}$ haloalkyl group; provided that at least one of the carbon ring atoms is substituted with a linear or branched $C_{6-40}$ alkyl group; and L is selected from the group consisting of —O—, —S—, —OC(O)—, a divalent $C_{1-20}$ alkyl group, and a covalent bond.

6. The polymer of claim 1, wherein L is a covalent bond.

7. The polymer of claim 1, wherein the electron-donor unit (D) comprises one or more optionally substituted electron-rich 5-20 membered heteroaryl groups.

8. The polymer of claim 7, wherein the electron-donor unit (D) comprises an optionally substituted electron-rich 8-20 membered polycyclic heteroaryl group.

9. The polymer of claim 7, wherein the electron-donor unit (D) is represented by the formula:

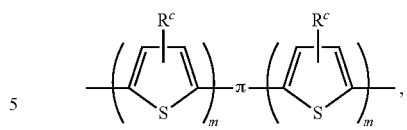

wherein π is selected from the group consisting of (a) an optionally substituted electron-rich 8-20 membered polycyclic heteroaryl group, (b) a linear conjugated linker, and (c)

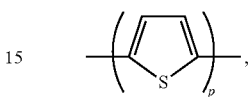

wherein $R^c$ is selected from the group consisting of H, Cl, and a $C_{1-20}$ alkyl group; m is 0 or 1; and p is 0, 1, 2, 3 or 4, provided that p is not 0 when m is 0.

10. The polymer of claim 1, wherein the electron-acceptor unit (A) and the electron-donor unit (D) form alternating repeat units.

11. The polymer of claim 1, wherein the polymer is a random copolymer having the formula:

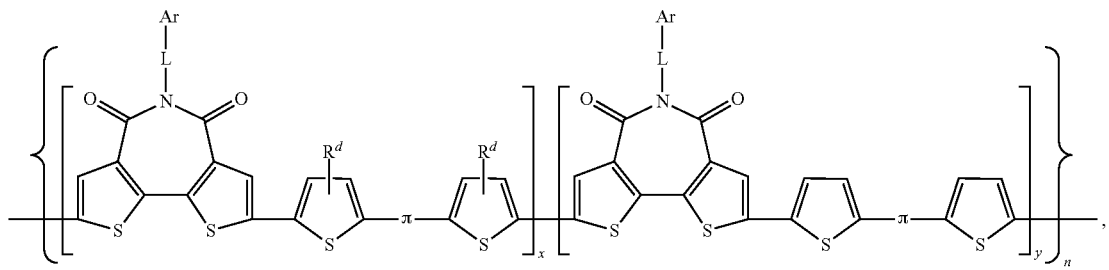

wherein π is selected from the group consisting of (a) an optionally substituted electron-rich 8-20 membered polycyclic heteroaryl group, (b) a linear conjugated linker, and (c)

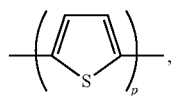

wherein $R^d$ is Cl or a $C_{1-20}$ alkyl group; p is 0, 1, 2, 3 or 4; x and y are real numbers representing mole fractions, wherein $0.05 \leq x \leq 0.95$, $0.05 \leq y \leq 0.95$, and the sum of x and y is about 1; and L and Ar are as defined in claim 1.

12. The polymer of claim 11, wherein the polymer is a random copolymer having the formula:

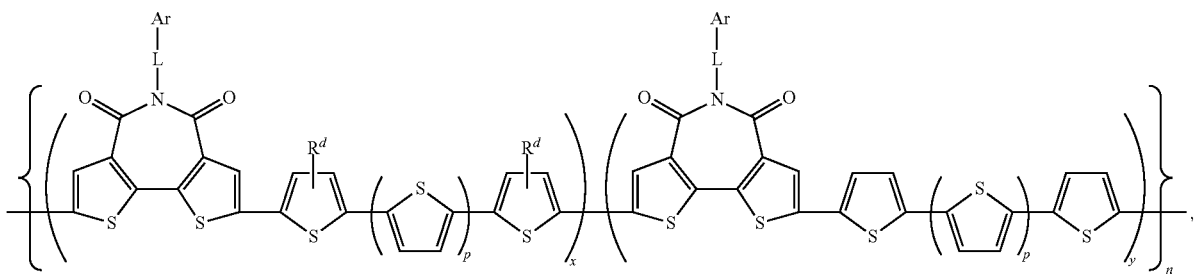

wherein each $R^d$ is Cl or a $C_{1-20}$ alkyl group; p is 1 or 2; x and y are real numbers representing mole fractions, wherein $0.05 \leq x \leq 0.95$, $0.05 \leq y \leq 0.95$, and the sum of x and y is about 1; and L and Ar are as defined in claim 1.

13. An electronic, optical or optoelectronic device comprising a polymeric semiconductor component, the polymeric semiconductor component comprising the polymer of claim 1.

14. An organic photovoltaic device comprising an anode, a cathode, optionally one or more anode interlayers, optionally one or more cathode interlayers, and in between the anode and the cathode a polymeric semiconductor component comprising the polymer of claim 1.

15. The device of claim 14, wherein the polymeric semiconductor component is photoactive and the polymer of claim 1 is present in a blend material, wherein the polymer of claim 1 functions as an electron-donor compound and the blend material further comprises an electron-acceptor compound.

16. The device of claim 15, wherein the electron-acceptor compound is a fullerene compound.

17. The device of claim 15, wherein the electron-acceptor compound is an electron-transporting polymer.

18. The device of claim 17, wherein the electron-transporting polymer comprises a bis(imide)arene unit.

19. The device of claim 18, wherein the arene group in the bis(imide)arene unit is naphthalene.

20. The polymer of claim 1, wherein the polymer either is an alternating polymer selected from the group consisting of:

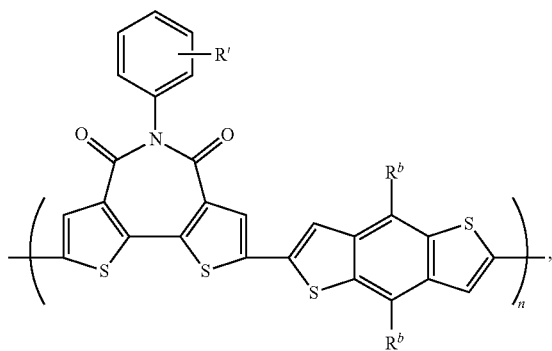

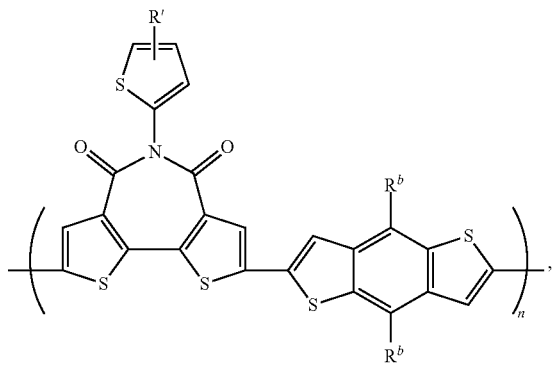

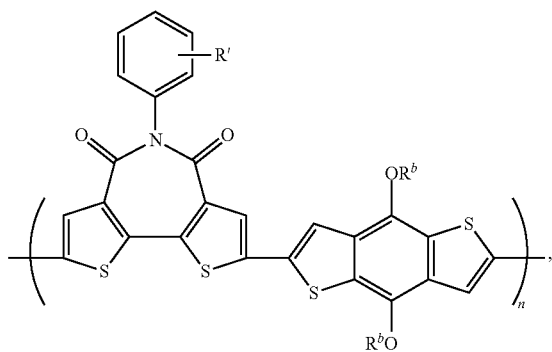

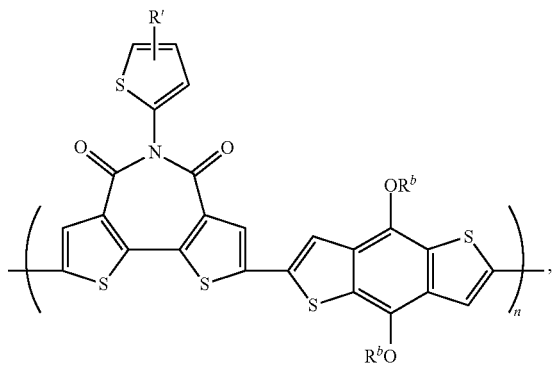

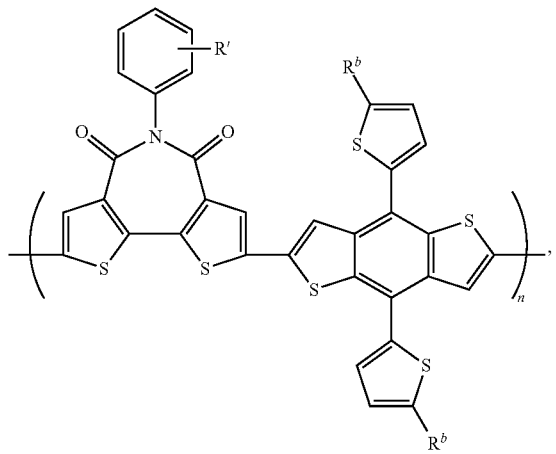,
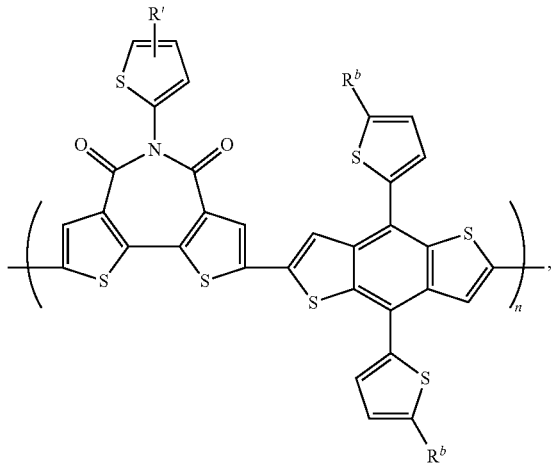,
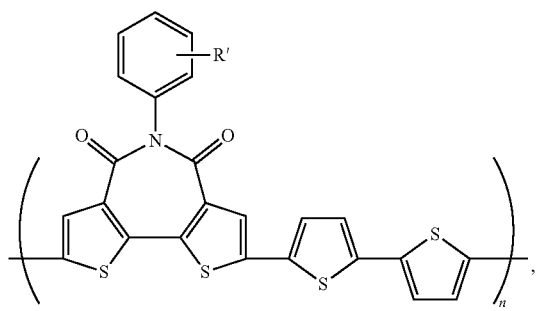,
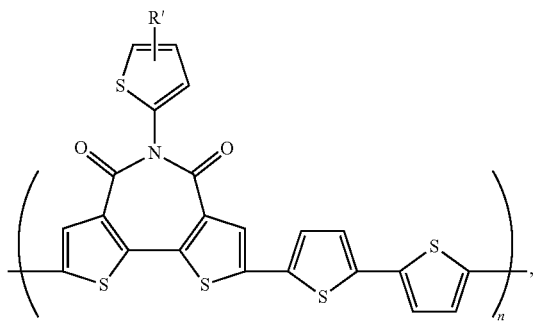,
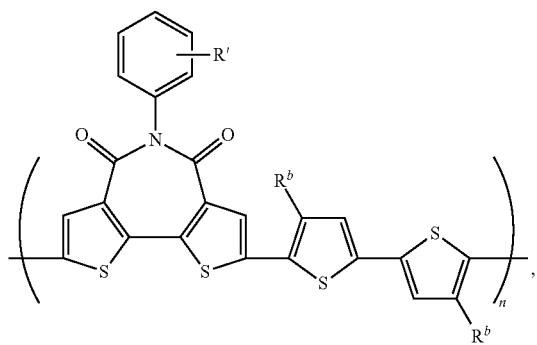,
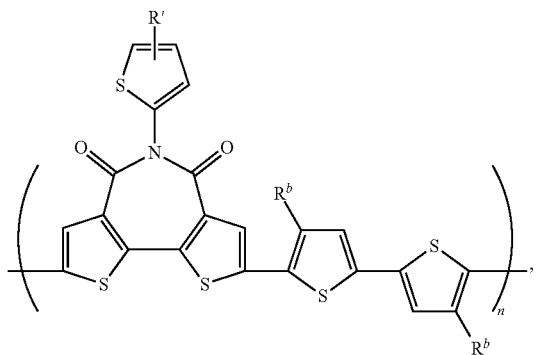,
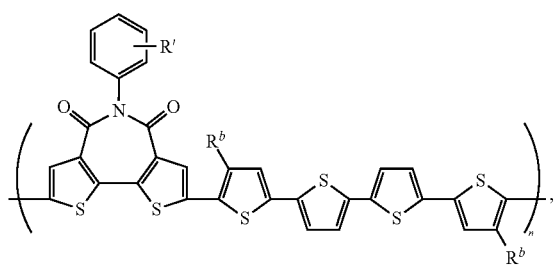,
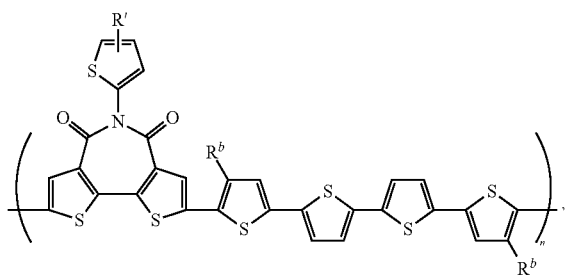, -continued
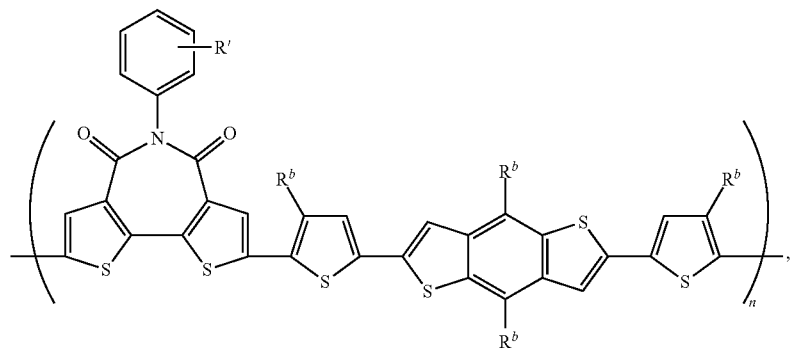
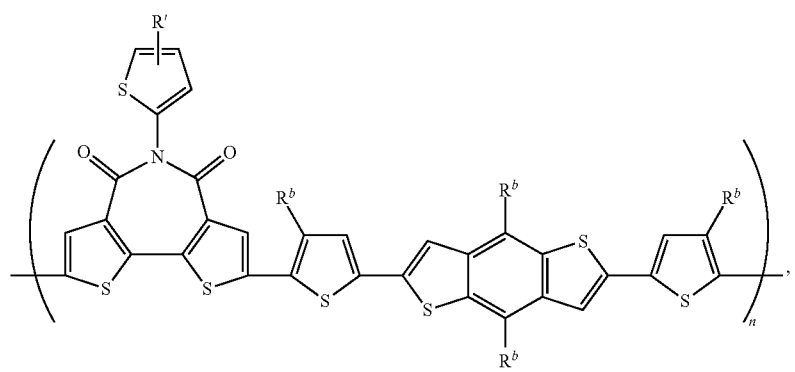
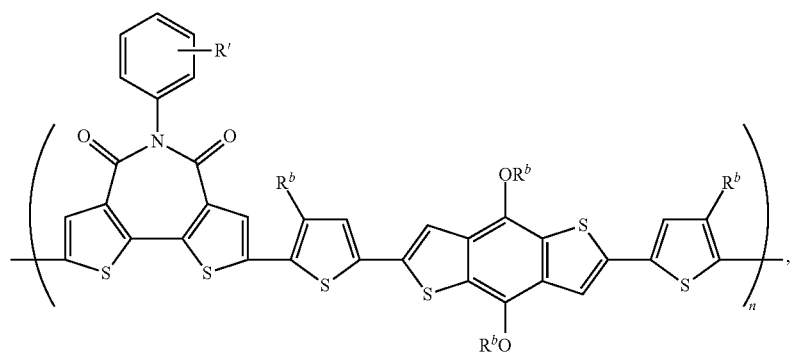
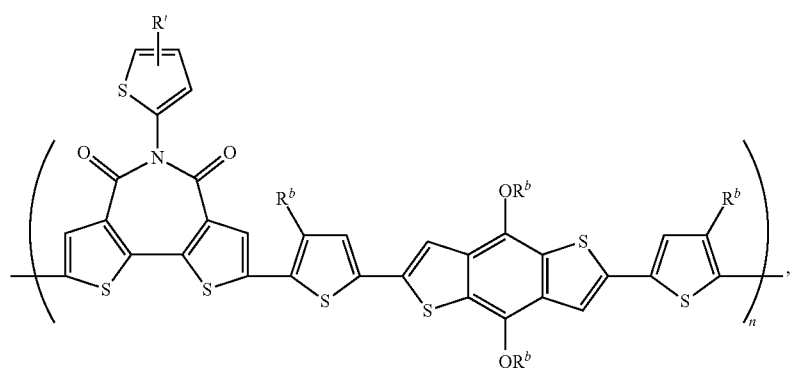

-continued
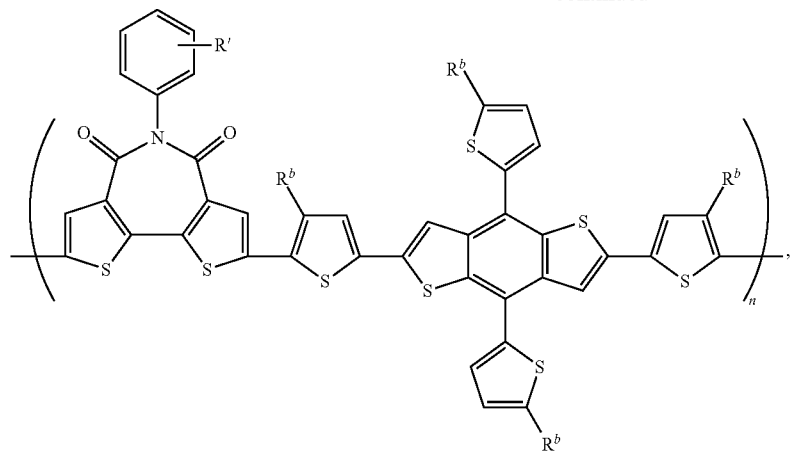
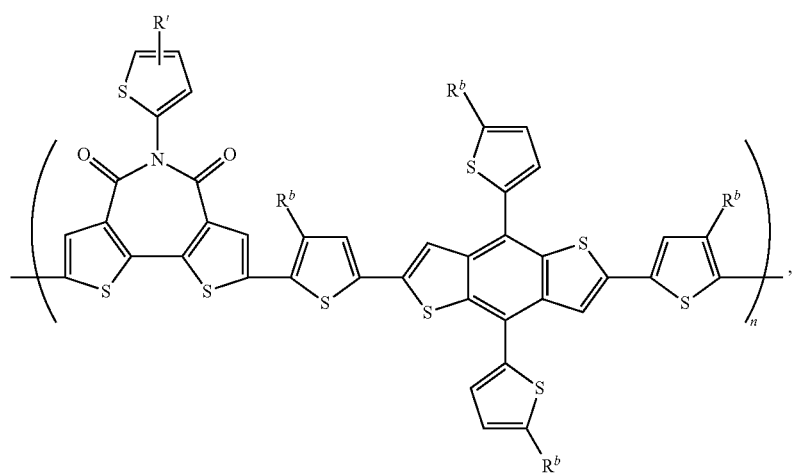
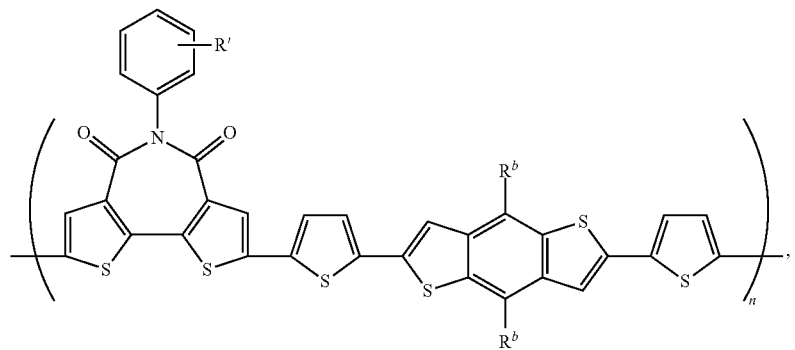
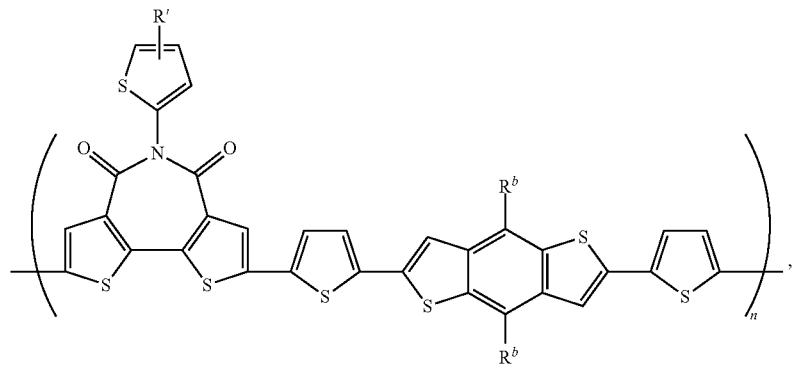

-continued
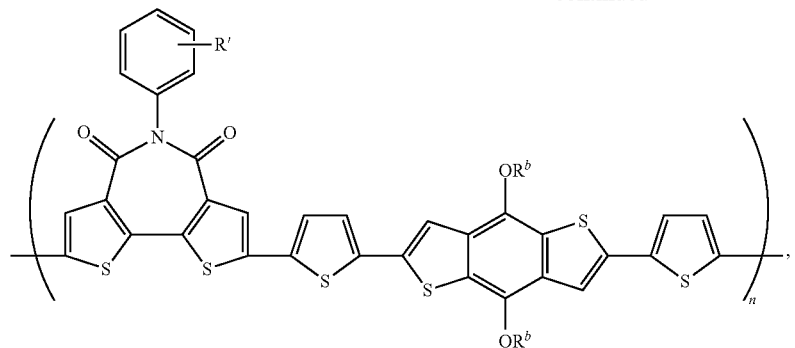
,
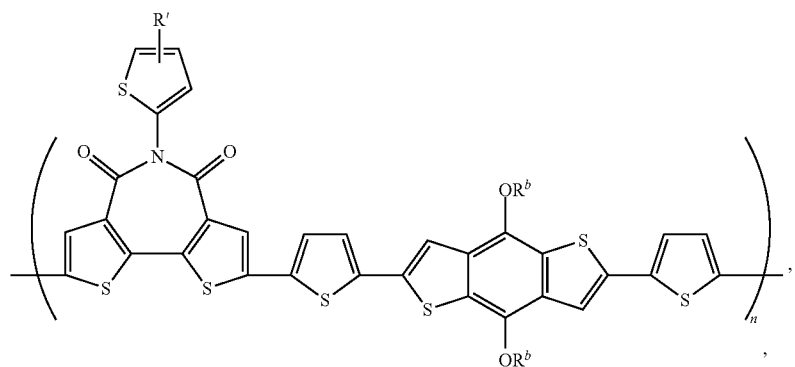
,
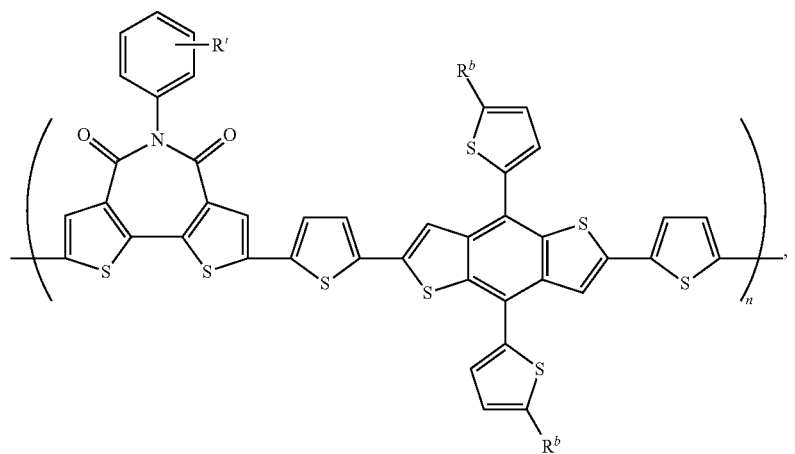
,
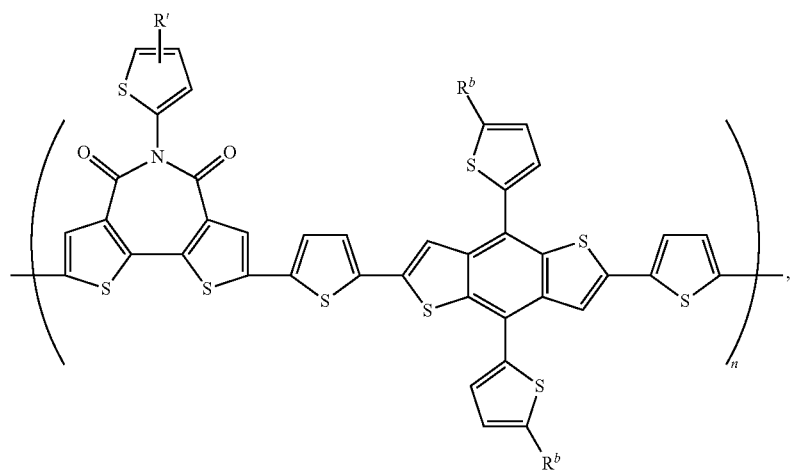
,

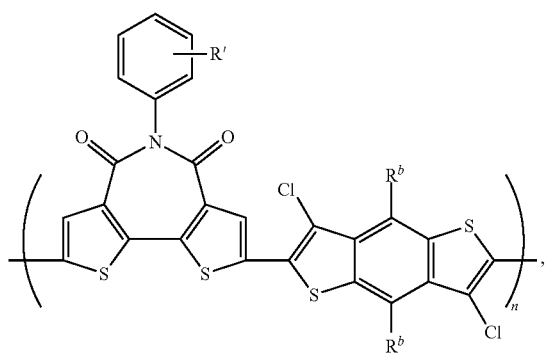
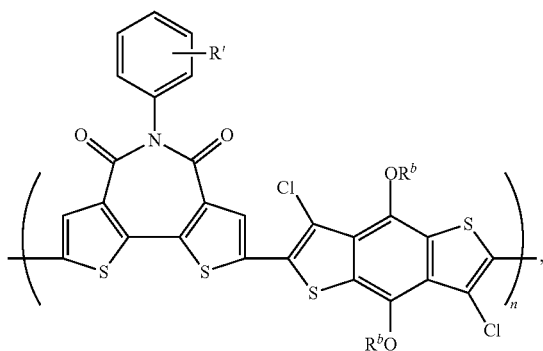
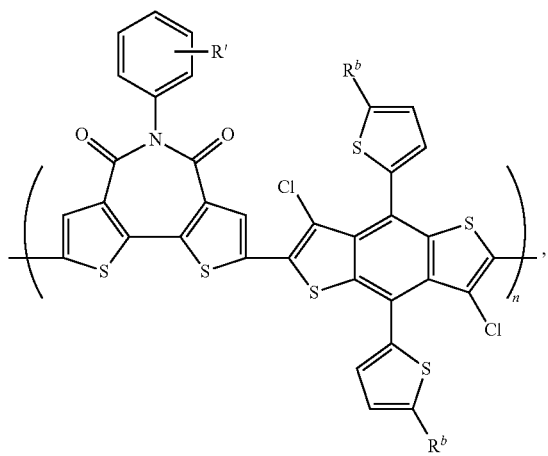
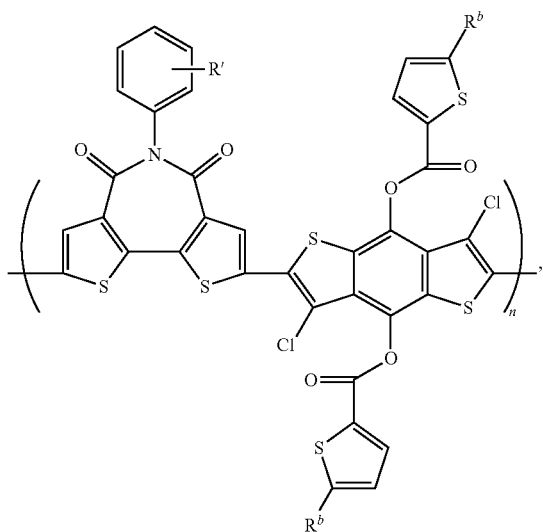
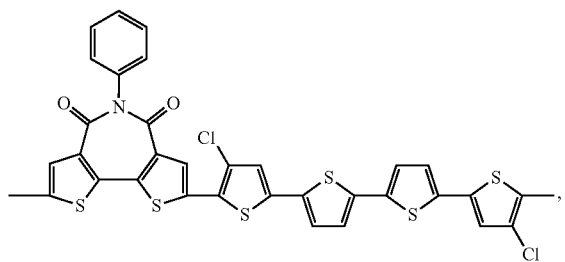
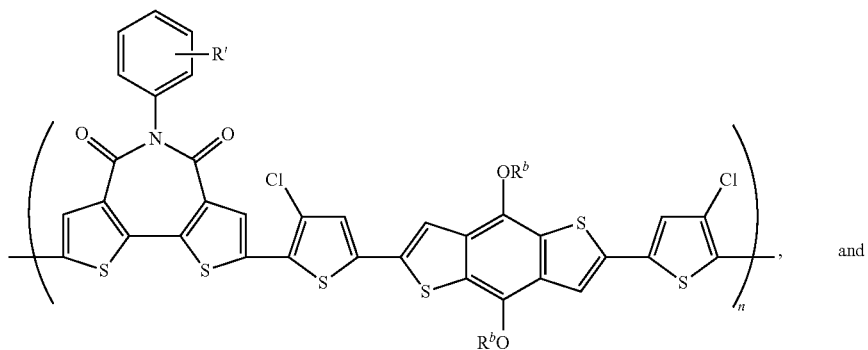
and

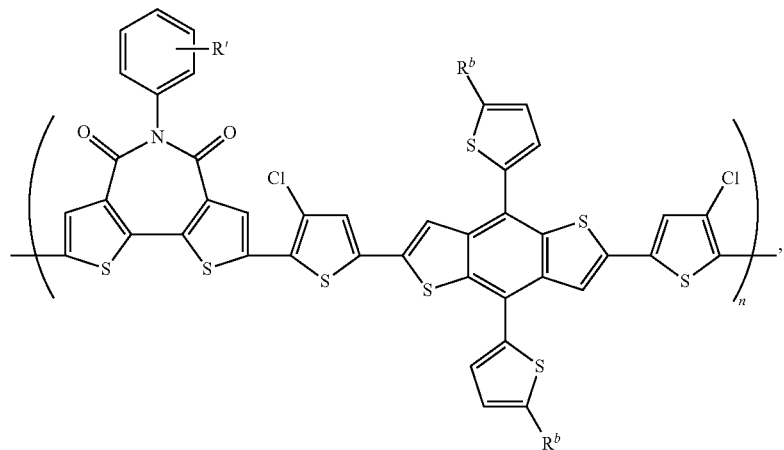
wherein R' is a linear or branched $C_{6-40}$ alkyl group; $R^b$, at each occurrence, independently is a linear or branched $C_{6-40}$ alkyl group; and n is an integer in the range of 3 and 5,000; or
a random polymer selected from the group consisting of:
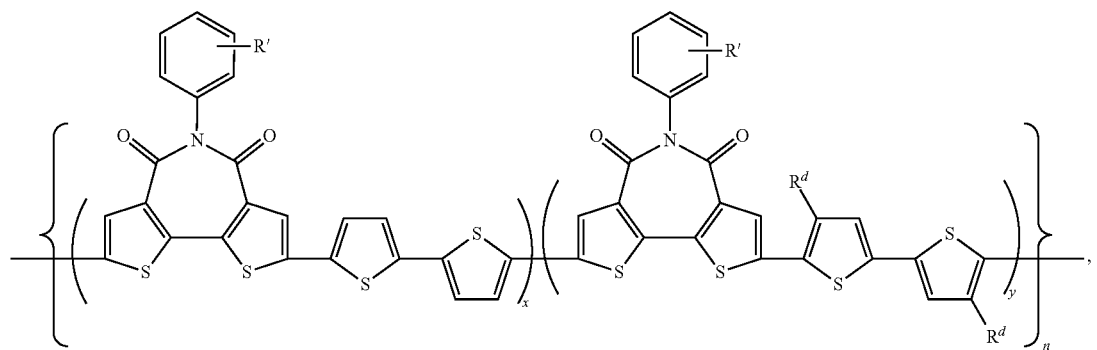
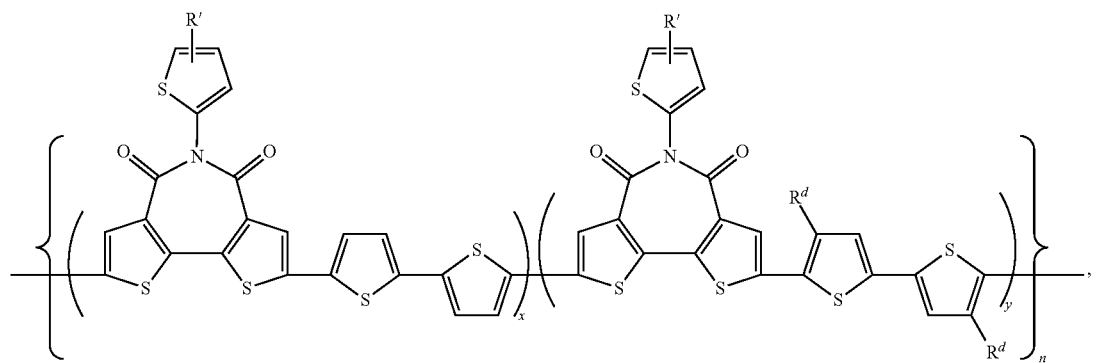

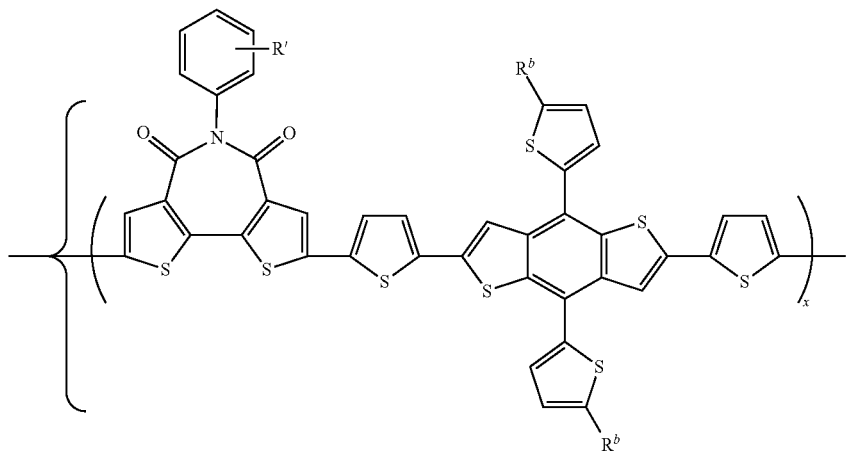
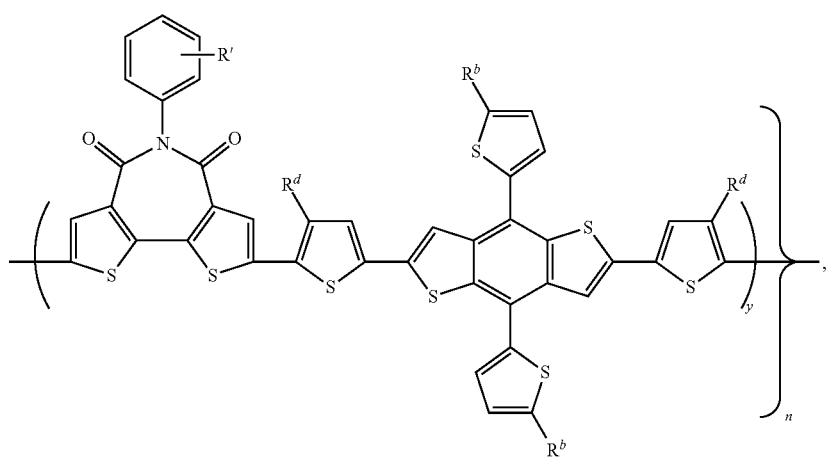
and
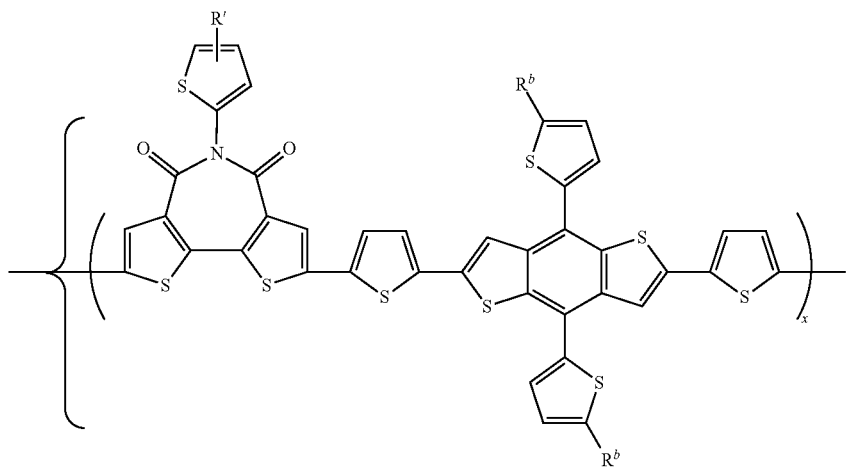

-continued
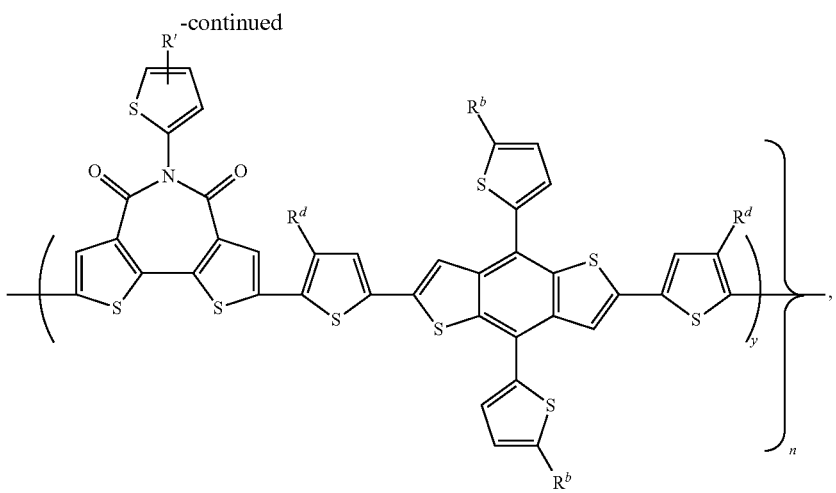
where R' is a linear or branched $C_{6-40}$ alkyl group; $R^b$, at each occurrence, independently is a branched $C_{6-40}$ alkyl group; $R^d$ is Cl or a linear $C_{1-40}$ alkyl group; $0.2 \leq x \leq 0.8$; $0.2 \leq y \leq 0.8$; and n is an integer in the range of 3 and 5,000.
* * * * *